US011791188B2

(12) United States Patent
Nakamura

(10) Patent No.: US 11,791,188 B2
(45) Date of Patent: Oct. 17, 2023

(54) TRANSPORT APPARATUS AND CONTROL METHOD

(71) Applicant: HIRATA CORPORATION, Kumamoto (JP)

(72) Inventor: Hirofumi Nakamura, Kumamoto (JP)

(73) Assignee: HIRATA CORPORATION, Kumamoto (JP)

( * ) Notice: Subject to any disclaimer, the term of this patent is extended or adjusted under 35 U.S.C. 154(b) by 620 days.

(21) Appl. No.: 17/069,998

(22) Filed: Oct. 14, 2020

(65) Prior Publication Data

US 2021/0028043 A1 Jan. 28, 2021

Related U.S. Application Data

(63) Continuation of application No. PCT/JP2019/024918, filed on Jun. 24, 2019.

(30) Foreign Application Priority Data

Aug. 1, 2018 (JP) ................................ 2018-145396

(51) Int. Cl.
*H01L 21/677* (2006.01)
*H01L 21/673* (2006.01)
*H01L 21/683* (2006.01)

(52) U.S. Cl.
CPC .. *H01L 21/67769* (2013.01); *H01L 21/67346* (2013.01); *H01L 21/67766* (2013.01); *H01L 21/67778* (2013.01); *H01L 21/6838* (2013.01)

(58) Field of Classification Search
CPC ......... H01L 21/67769; H01L 21/67346; H01L 21/67766; H01L 21/67778; H01L 21/6838;

(Continued)

(56) References Cited

U.S. PATENT DOCUMENTS 9,159,598 B2 10/2015 Yamamoto et al.
2004/0109751 A1* 6/2004 Whitcomb ........ H01L 21/67778
414/744.1

(Continued)

FOREIGN PATENT DOCUMENTS

JP H11163091 A 6/1999
JP 2003151968 A 5/2003

(Continued)

OTHER PUBLICATIONS

Office Action dated Jun. 30, 2022, in corresponding Korean Patent Application No. 10-2020-7033368. (5 pages).

(Continued)

*Primary Examiner* — Kaitlin S Joerger
(74) *Attorney, Agent, or Firm* — BUCHANAN INGERSOLL & ROONEY PC

(57) ABSTRACT

A transport apparatus includes a transport unit configured to transport a protection material in each operation of a packing operation and an unpacking operation; a protection material placement portion on which the protection material is stacked; a container placement portion on which a container main body portion is placed; a control unit configured to control the transport unit in an operation mode selected from a plurality of operation modes corresponding to types of the protection material; an attachment determination unit configured to determine attachment/detachment of components that are selected in correspondence with the type of the protection material and form the transport unit, the protection material placement portion, and the container placement portion; and a consistency determination unit configured to determine consistency between the selected operation mode and a determination result of the attachment determination unit.

18 Claims, 40 Drawing Sheets

(58) Field of Classification Search
CPC .......... H01L 21/6732; H01L 21/67259; H01L 21/67775
See application file for complete search history.

(56) References Cited

U.S. PATENT DOCUMENTS

| | | | | |
|---|---|---|---|---|
| 2004/0177917 | A1* | 9/2004 | Adachi | H01L 21/67742 156/538 |
| 2011/0135428 | A1 | 6/2011 | Kim et al. | |
| 2012/0298283 | A1* | 11/2012 | Yamamoto | H01L 21/67132 156/64 |
| 2016/0365265 | A1 | 12/2016 | Kirkland et al. | |
| 2018/0358250 | A1 | 12/2018 | Sekiya | |

FOREIGN PATENT DOCUMENTS

| | | | | |
|---|---|---|---|---|
| JP | 2005536878 | A | | 12/2005 |
| JP | 2017011178 | A | | 1/2017 |
| JP | 2017508291 | A | | 3/2017 |
| JP | 2018207022 | A | | 12/2018 |
| JP | 2020021853 | A | * | 2/2020 |
| KR | 20120132334 | A | | 12/2012 |
| WO | 2004019387 | A1 | | 3/2004 |
| WO | 2015130690 | A1 | | 9/2015 |
| WO | WO-2020026645 | A1 | * | 2/2020 ....... H01L 21/67132 |

OTHER PUBLICATIONS

Notice of Allowance dated Dec. 16, 2020, by the Taiwanese Patent Office in corresponding Taiwanese Patent Application No. 108123722. (4 pages).
International Search Report (PCT/ISA/210) dated Aug. 13, 2019, by the Japan Patent Office as the International Searching Authority for International Application No. PCT/JP2019/024918.
Written Opinion (PCT/ISA/237) dated Aug. 13, 2019, by the Japan Patent Office as the International Searching Authority for International Application No. PCT/JP2019/024918.

* cited by examiner

TRANSPORT APPARATUS AND CONTROL METHOD

CROSS-REFERENCE TO RELATED APPLICATION(S)

This application is a continuation of International Patent Application No. PCT/JP2019/024918 filed on Jun. 24, 2019, which claims priority to and the benefit of Japanese Patent Application No. 2018-145396 filed on Aug. 1, 2018, the entire disclosures of which are incorporated herein by reference.

BACKGROUND OF THE INVENTION

Field of the Invention

The present invention relates to a technique of unpacking/packing a substrate such as a semiconductor wafer.

Description of the Related Art

As a transport container for semiconductor wafers, a coin stack container has been proposed. In the coin stack container, semiconductor wafers and protection materials are alternately overlaid and stored. When unloading the semiconductor wafers from the coin stack container (unpacking), the protection materials and the semiconductor wafers need to be alternately unloaded. When storing the protection materials and the semiconductor wafers in the coin stack container (packing), the protection materials and the semiconductor wafers need to be alternately loaded into the container. Japanese Patent Laid-Open No. 2005-536878 discloses an apparatus for automating unpacking and packing concerning a coin stack container that uses sheet-shaped protection materials.

On the other hand, to improve the protection performance for a circuit formed on a semiconductor wafer, a noncontact coin stack container has been proposed. Japanese Patent Laid-Open No. 2017-508291 discloses a container using a ring-shaped spacer as a protection material. It is possible to avoid contact between a circuit formed on a semiconductor wafer and a protection material and improve the protection performance for the circuit.

It is convenient if unpacking/packing can be performed using a common apparatus for a contact coin stack container using a sheet-shaped protection material and a noncontact coin stack container using a ring-shaped spacer. However, in these coin stack containers, the specifications of the containers are different, and the protection materials are also different. It is therefore difficult to perform unpacking/packing by the same apparatus.

SUMMARY OF THE INVENTION

It is an object of the present invention to perform unpacking/packing in correspondence with contact and noncontact coin stack containers.

According to an aspect of the present invention, there is provided a transport apparatus comprising: a transport unit configured to transport a protection material in each operation of a packing operation of forming a stacked body of the protection material and a substrate in a container and an unpacking operation of alternately extracting the protection material and the substrate from the stacked body in the container; a protection material placement portion on which the protection material is stacked; a container placement portion on which a container main body portion of the container is placed; a control unit configured to control the transport unit in an operation mode selected from a plurality of operation modes corresponding to types of the protection material; an attachment determination unit configured to determine attachment/detachment of components that are selected in correspondence with the type of the protection material and form the transport unit, the protection material placement portion, and the container placement portion; and a consistency determination unit configured to determine consistency between the selected operation mode and a determination result of the attachment determination unit.

Further features of the present invention will become apparent from the following description of exemplary embodiments with reference to the attached drawings.

DESCRIPTION OF THE EMBODIMENTS

Figure 1:
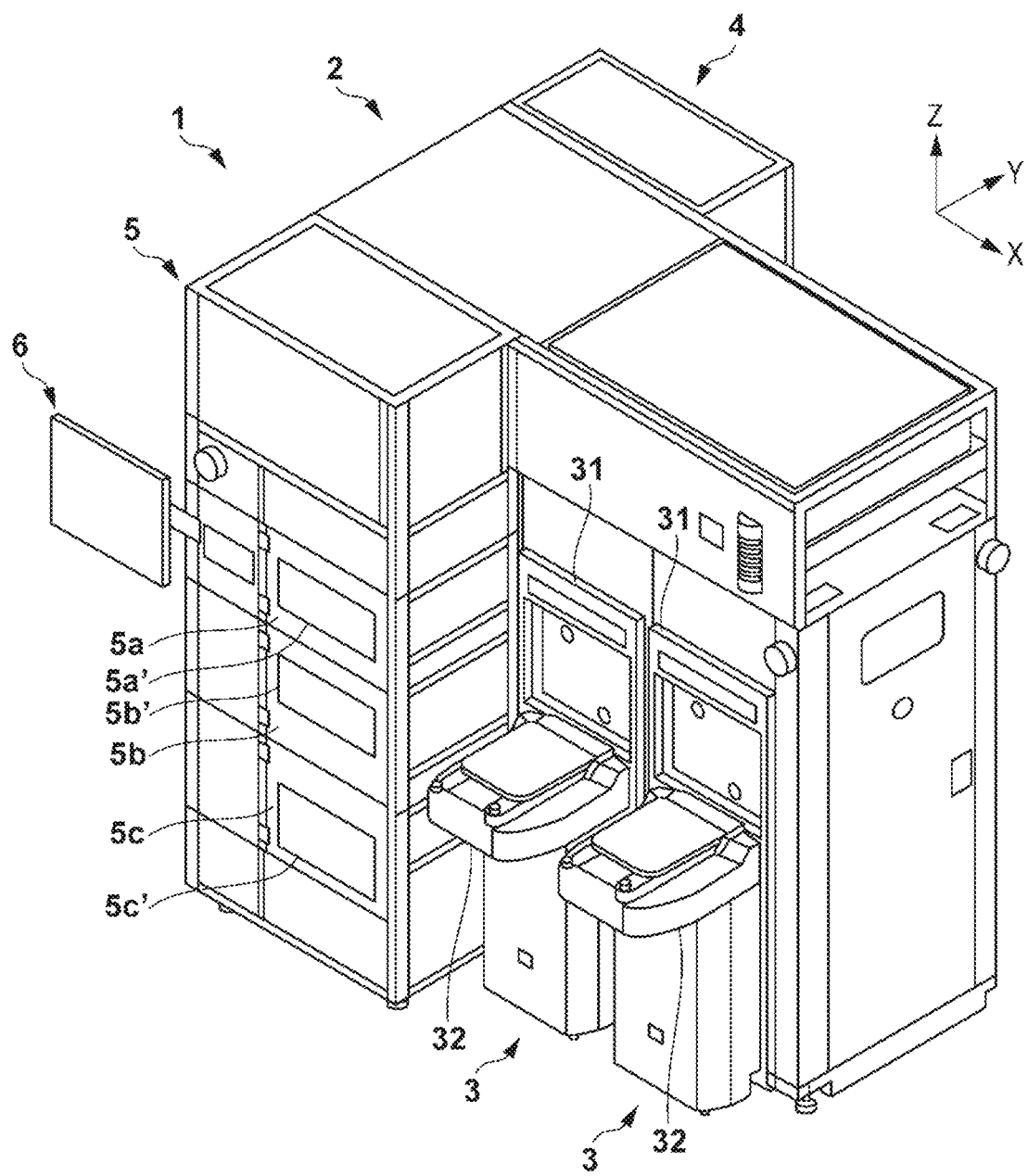
FIG. 1 is a perspective view of a transport system according to an embodiment of the present invention.

Hereinafter, embodiments will be described in detail with reference to the attached drawings. Note, the following embodiments are not intended to limit the scope of the claimed invention, and limitation is not made an invention that requires a combination of all features described in the embodiments. Two or more of the multiple features described in the embodiments may be combined as appropriate. Furthermore, the same reference numerals are given to the same or similar configurations, and redundant description thereof is omitted. In the drawings, arrows X and Y represent horizontal directions orthogonal to each other, and an arrow Z represents a vertical direction.

<Transport System>

FIG. 1 is a perspective view of a transport system 1 according to an embodiment of the present invention. The transport system 1 has a function of performing unpacking of a coin stack container and transferring a substrate (here, a semiconductor wafer) in the coin stack container to a container such as a FOUP. Additionally, the transport system 1 has a function of unloading a substrate from a container such as a FOUP and packing the unloaded substrate in a coin stack container. That is, the transport system 1 is a packing system that performs unpacking/packing (unpacking operation/packing operation) of a coin stack container.

The transport system 1 includes a substrate transport apparatus 2 incorporating a substrate transport mechanism, a plurality of load ports 3, an aligning apparatus 4 configured to align a substrate, a protection material transport apparatus 5 incorporating a protection material transport mechanism, and an information display apparatus 6. The information display apparatus 6 is, for example, a touch panel display and accepts a setting input to the transport system 1 or displays operation information or the like of the transport system 1.

<Substrate Transport Apparatus>

Figure 2:
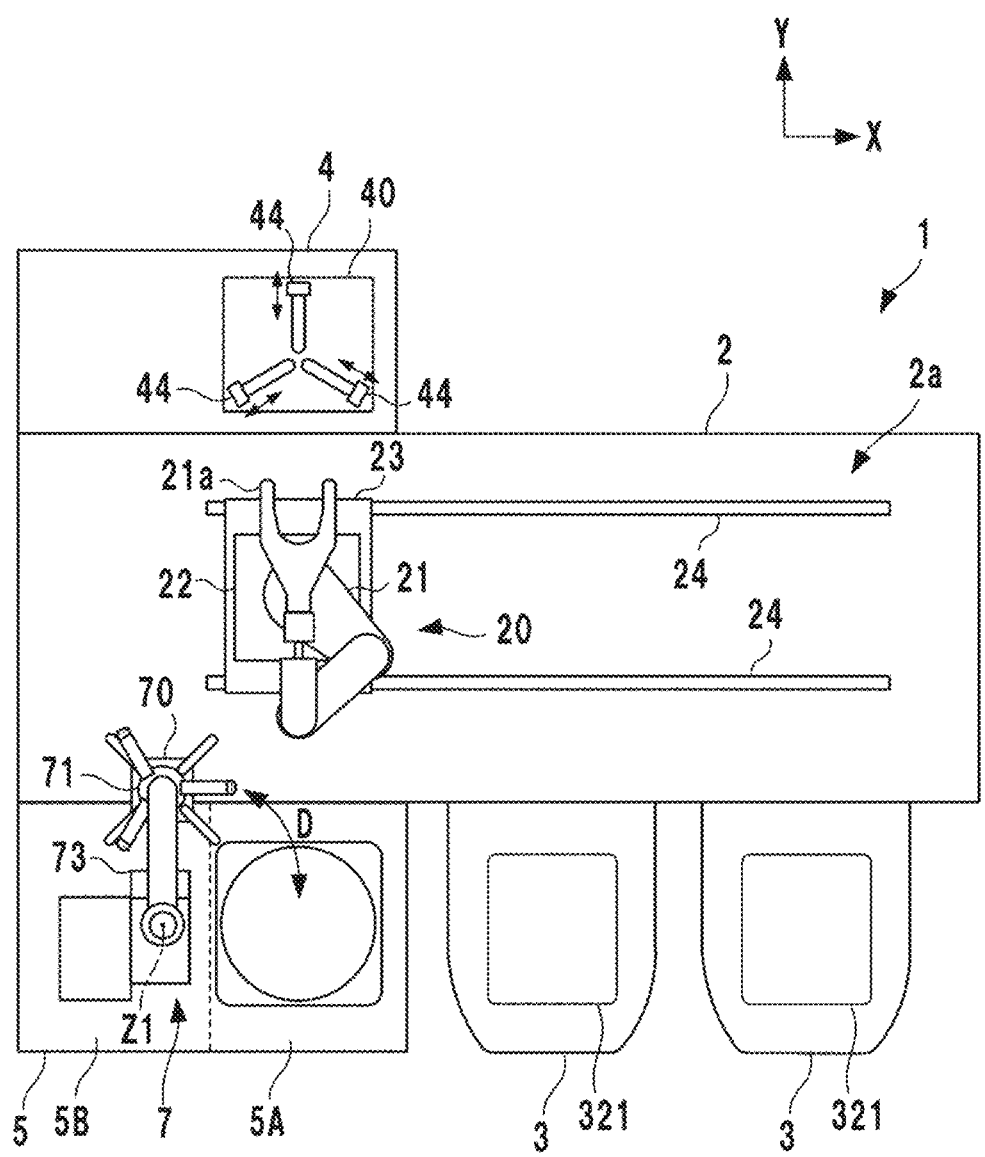
FIG. 2 is a plan view showing the internal layout of the transport system shown in FIG. 1.

The configuration of the substrate transport apparatus 2 will be described with reference to FIG. 2. FIG. 2 is a plan view showing the internal layout of the transport system 1, and the substrate transport apparatus 2 constitutes a transport mechanism that transports a substrate in the transport system 1. The substrate transport apparatus 2 includes a substrate transport robot 20 provided in an internal space 2a. The substrate transport robot 20 can reciprocally move in the X direction by guide of a pair of guide members 24 extended in the X direction. The pair of guide members 24 are, for example, rail members, and define the moving path of the substrate transport robot 20.

The substrate transport robot 20 includes a horizontal articulated mechanism 21, a base unit 22, and a traveling unit 23. The traveling unit 23 includes a driving mechanism that moves in the X direction along the guide members 24. The driving mechanism includes, for example, a driving source such as a motor, and a driving transmission mechanism such as a belt transmission mechanism or a rack-pinion mechanism. The base unit 22 is mounted on the traveling unit 23, and includes a driving mechanism that raises/lowers and turns the horizontal articulated mechanism 21. The driving mechanism includes, for example, a driving source such as a motor, and a driving transmission mechanism such as a belt transmission mechanism, a rack-pinion mechanism, or a gear mechanism. The horizontal articulated mechanism 21 includes a hand 21a, an arm that makes the hand 21a advance/retreat in the horizontal direction, a mechanism that freely reverses the hand 21a, and a driving mechanism thereof. The driving mechanism includes, for example, a driving source such as a motor, and a driving transmission mechanism such as a belt transmission mechanism. The hand 21a is provided with a plurality of suction portions that suck a substrate by suction of air or the like. When transporting a substrate, the substrate is sucked and held by the hand 21a.

In this embodiment, the load ports 3 and the protection material transport apparatus 5 are juxtaposed on one side of the moving path (guide members 24) of the substrate transport robot 20 along the moving path. Since this makes it possible to alternately perform transport of a protection material by the protection material transport apparatus 5 and transport of a substrate by the substrate transport apparatus 2 at the time of unpacking/packing, and perform the transport of the protection material and the transport of the substrate in parallel, tact time can be reduced. In addition, in the common side portion of the transport system 1, loading/unloading of a coin stack container and loading/unloading of a container such as a FOUP can be performed, and the workability of an operator can be improved.

The aligning apparatus 4 is arranged on the other side of the moving path (guide members 24) of the substrate transport robot 20. With this arrangement, at the time of packing, the substrate transport robot 20 can unload a substrate from the load port 3 (a container opening/closing apparatus such as a FOUP) and efficiently transport the substrate to the protection material transport apparatus 5 via the aligning apparatus 4.

The aligning apparatus 4 is arranged at a position facing the protection material transport apparatus 5. Since the substrate transport robot 20 faces the protection material transport apparatus 5 only by reversing to the back side after unloading a substrate from the aligning apparatus 4, positioning in the X direction is unnecessary, and any position shift never occurs.

<Load Port>

Figure 3:
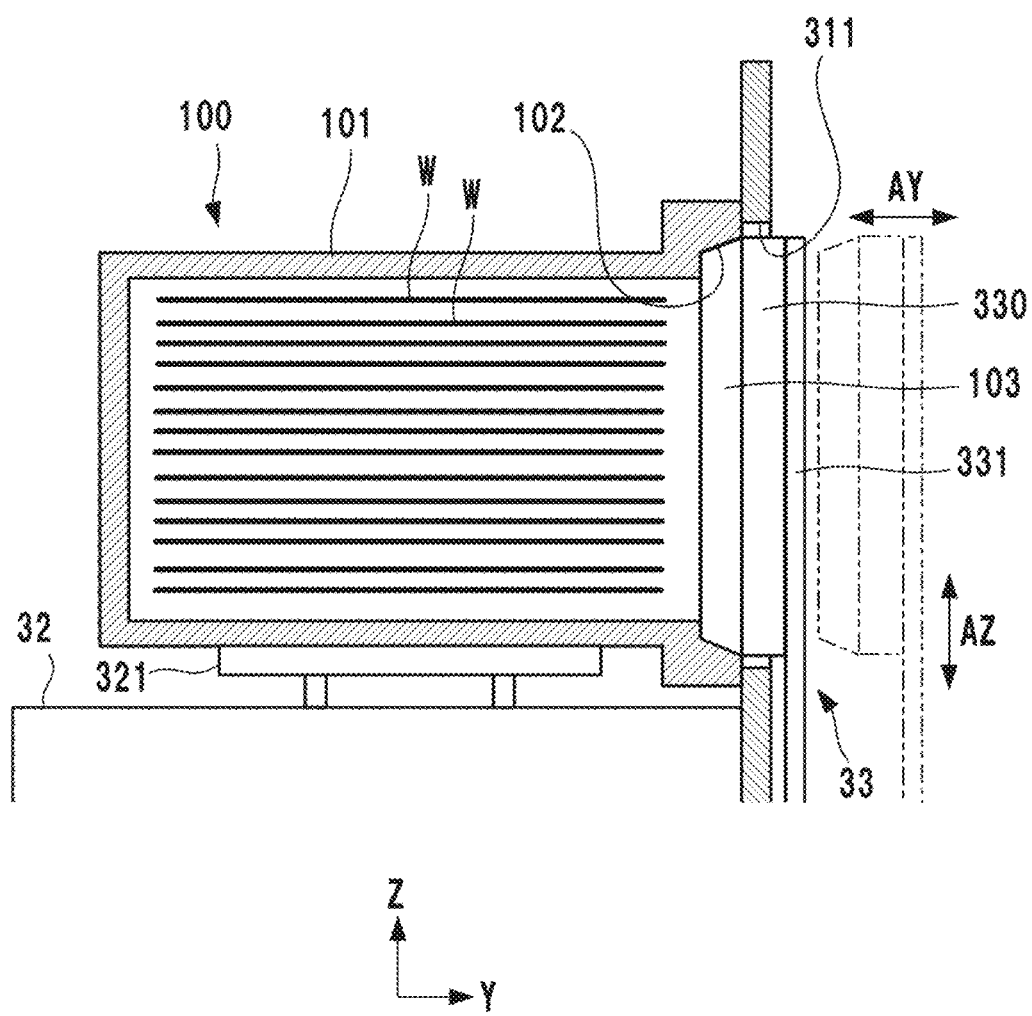
FIG. 3 is an explanatory view of a load port.

The configuration of the load port 3 will be described with reference to FIG. 3. FIG. 3 is a partial schematic side sectional view of the load port 3. The load port 3 is an opener that opens/closes a container 100. The container 100 is a FOUP, a FOSB, a SMIF, an open cassette, or the like. The container 100 includes a box-shaped container main body 101 having, in a side portion, an opening portion 102 used to put a circular substrate W as a semiconductor wafer in and out, and a lid (door) 103 detachably attached to the opening portion 102 to close the opening portion 102. Note that FIG. 3 shows a close position where the container 100 is closed by the lid 103, and an open position (indicated by an alternate long and two short dashed line in FIG. 3) where the lid 103 is opened by the load port 3.

The container 100 is mounted on a mounting portion 32 in a posture that the opening portion 102 faces a hole portion 311, as shown in FIG. 3. The horizontal articulated mechanism 21 of the substrate transport apparatus 2 can access the substrate W in the container main body 101 via the hole portion 311 and the opening portion 102.

The mounting portion 32 is provided in a table shape. The mounting portion 32 includes a movable dog plate 321 on which the container 100 is mounted. The dog plate 321 is moved by a moving mechanism (not shown) to advance/retreat in the Y direction between a position (the position shown in FIG. 3) close to the hole portion 311 of a wall body 31 and a position far apart. When transporting the container 100, the dog plate 321 is moved to the position (retreat position) far apart from the hole portion 311. When opening/closing the container 100 and in an open state of the container 100, the dog plate 321 is moved to the position (advance position) close to the hole portion 311.

In addition, the load port 3 includes an opening/closing mechanism 33. The opening/closing mechanism 33 includes a holding portion (port door) 330 that holds the lid 103, and a moving mechanism 331 that makes the holding portion 330 advance/retreat in the direction of an arrow AY and move the holding portion 330 up and down in the direction of an arrow AZ at the retreat position.

When the load port 3 and the substrate transport apparatus 2 with the above-described configurations are cooperatively controlled by a host controller, the substrate W is unloaded from the container main body 101, and the substrate W is loaded into the container main body 101.

<Aligning Apparatus>

As shown in FIG. 2, the aligning apparatus 4 includes a centering unit 40. The centering unit 40 of this embodiment is a device that performs centering of the substrate W but is not limited to this. For example, like an aligner conventionally used in a semiconductor manufacturing apparatus, the centering unit 40 may perform centering of the substrate W and adjustment of a notch (orientation flat) position.

In this embodiment, the centering unit 40 includes three chucks 44. The chucks 44 are synchronously opened/closed by an actuator (not shown). The substrate W placed on the centering unit 40 is gripped by the chucks 44, and centering is thus performed.

<Noncontact Coin Stack Container>

Figure 4A:
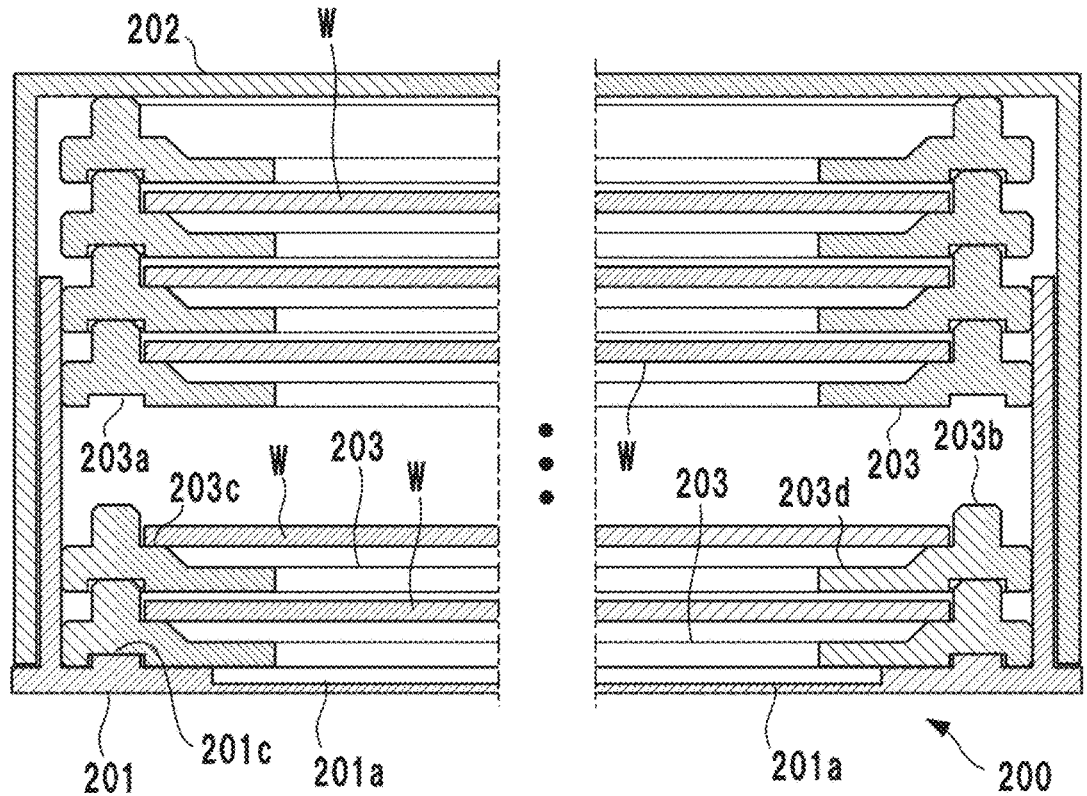
FIG. 4A is an explanatory view of a container.

FIG. 4A is an explanatory view of a container 200 that is a coin stack container or a sectional view thereof. The container 200 is a hollow body including a container main body portion 201, and a cover 202 serving as the lid of the container main body portion 201. A stacked body of a protection material 203 and the substrate W placed on the protection material 203 is stored in the container 200. The stacked body is placed on the container main body portion 201, and its movement in the radial direction is regulated by the peripheral wall of the container main body portion 201. A concave portion 201a configured to prevent interference that occurs when a holding unit 71 to be described later extracts the protection materials 203 at once is formed in the bottom surface inside the container main body portion 201. In addition, the container main body portion 201 includes, on the bottom surface, a convex portion 201c that engages with a concave portion 203a of the protection material 203 to be described later.

The protection material 203 is a spacer used to form a gap between the substrates W, and is made of, for example, a resin. The protection material 203 will sometimes be referred to as a spacer. The spacer 203 is a frame-shaped member conforming to the shape of the substrate W. In this embodiment, since the substrate W is circular, the spacer 203 has an annular shape. However, the shape of the spacer 203 is not limited to this. The spacer 203 may have, for example, a rectangular shape or a polygonal shape as long as the shape can avoid a protection region (circuit forming portion or the like) on the substrate W. At the peripheral edge portion of the spacer 203, the concave portion 203a is formed on the lower surface side, and a convex portion 203b and a placement surface 203c are formed on the upper surface side. The convex portion 203b is an annular projection that engages with the concave portion 203a. The concave portion 203a of the protection material 203 on the lowermost stage engages with the above-described convex portion 201c. Between the adjacent protection materials 203, the convex portion 203b of the protection material 203 on the lower stage side engages with the concave portion 203a of the protection material 203 on the upper stage side. By the engagement between the concave portion 203a and the convex portion 203b, the spacer 203 can more stably be stacked. The placement surface 203c is an annular plane on which the peripheral edge portion of the substrate W is placed.

In this way, when the spacer 203 is interposed between the substrates W, the plurality of substrates W can be stacked in the container 200 without making the circuit portion of each substrate W into contact with the other substrates W or the spacers 203.

<Protection Material Transport Apparatus>

Figure 5:
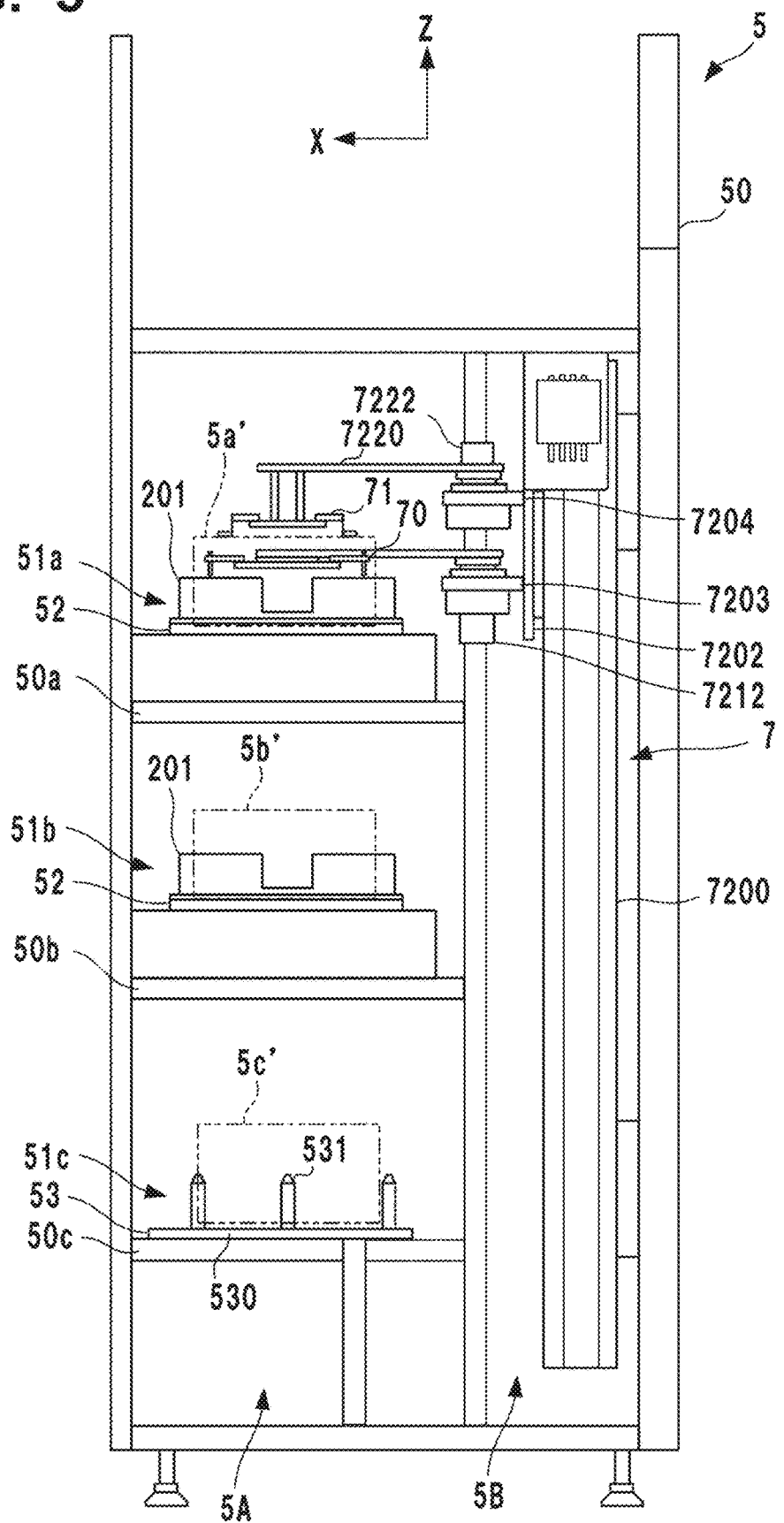
FIG. 5 is an explanatory view of a spacer transport apparatus.

The protection material transport apparatus 5 will be described with reference to FIGS. 1, 2, and 5. FIG. 5 is a view showing the outline of the protection material transport apparatus 5, and schematically shows a state in which an exterior panel is detached. The protection material transport apparatus 5 is an apparatus for transporting the spacer 203 that is a protection material. In this embodiment, the protection material transport apparatus 5 can perform not only transport of the protection material 203 in a case in which the spacer 203 is used as a protection material but also transport of a sheet-shaped protection material 303 to be described later by detaching/attaching some components. The sheet-shaped protection material 303 will sometimes be referred to as the sheet 303.

The protection material transport apparatus 5 includes a frame 50 formed by a plurality of columns and beams, and each component is supported by the frame 50. The frame 50 has a rectangular parallelepiped outer shape long in the Z direction, and its internal space includes a rack portion 5A and a robot storage portion 5B arranged in the X direction.

(Configuration of Rack Portion)

The frame 50 includes rack members 50a to 50c that define the internal space of the rack portion 5A in the Z direction. A placement portion 51a of the upper stage is formed by the rack member 50a, a placement portion 51b of the middle stage is formed by the rack member 50b, and a placement portion 51c of the lower stage is formed by the rack member 50c. By arranging the placement portions 51a to 51c in the vertical direction, the foot print of the protection material transport apparatus 5 can be made small.

The placement portions 51a to 51c are provided with horizontally openable doors 5a to 5c on the front of the transport system 1, as shown in FIG. 1. Windows 5a' to 5c' each formed by an acrylic panel or a glass panel and having transparency are formed in the doors 5a to 5c, respectively, and the placement portions 51a to 51c are visible from the outside.

The container 200 as an unpacking or packing target is placed on each of the placement portions 51a and 51b. The operator can load/unload the container 200 into/from the placement portions 51a and 51b by opening the doors 5a and 5b. In this embodiment, in a state in which the cover 202 is detached from the container 200, only the container main body portion 201 is placed on each of the placement portions 51a and 51b. However, the transport system 1 may be provided with a cover detachment mechanism such that the container 200 with the cover 202 is placed on each of the placement portions 51a and 51b, and the cover 202 is detached by the cover detachment mechanism. In this embodiment, the two placement portions 51a and 51b are provided. However, the number of placement portions may be one or three or more.

In unpacking or packing, the spacers 203 are placed on the placement portion 51c. That is, the placement portion 51c is a temporary storage place for the spacers 203. The spacers 203 are stacked on the placement portion 51c. By opening the door 5c, the operator can unload the spacers 203 from the placement portion 51c or load the spacers 203 into the placement portion 51c. This operation is performed when, for example, excess/deficiency of the spacers 203 has occurred.

Each of the placement portions 51a and 51b is provided with a container placement device 52, and the placement portion 51c is provided with a protection material placement device 53. The container placement device 52 and the protection material placement device 53 will be described below. Note that the container placement device 52 and the protection material placement device 53 will sometimes simply be referred to as the placement device 52 and the placement device 53 hereinafter. The placement device 52 will be described first.

Figure 6:
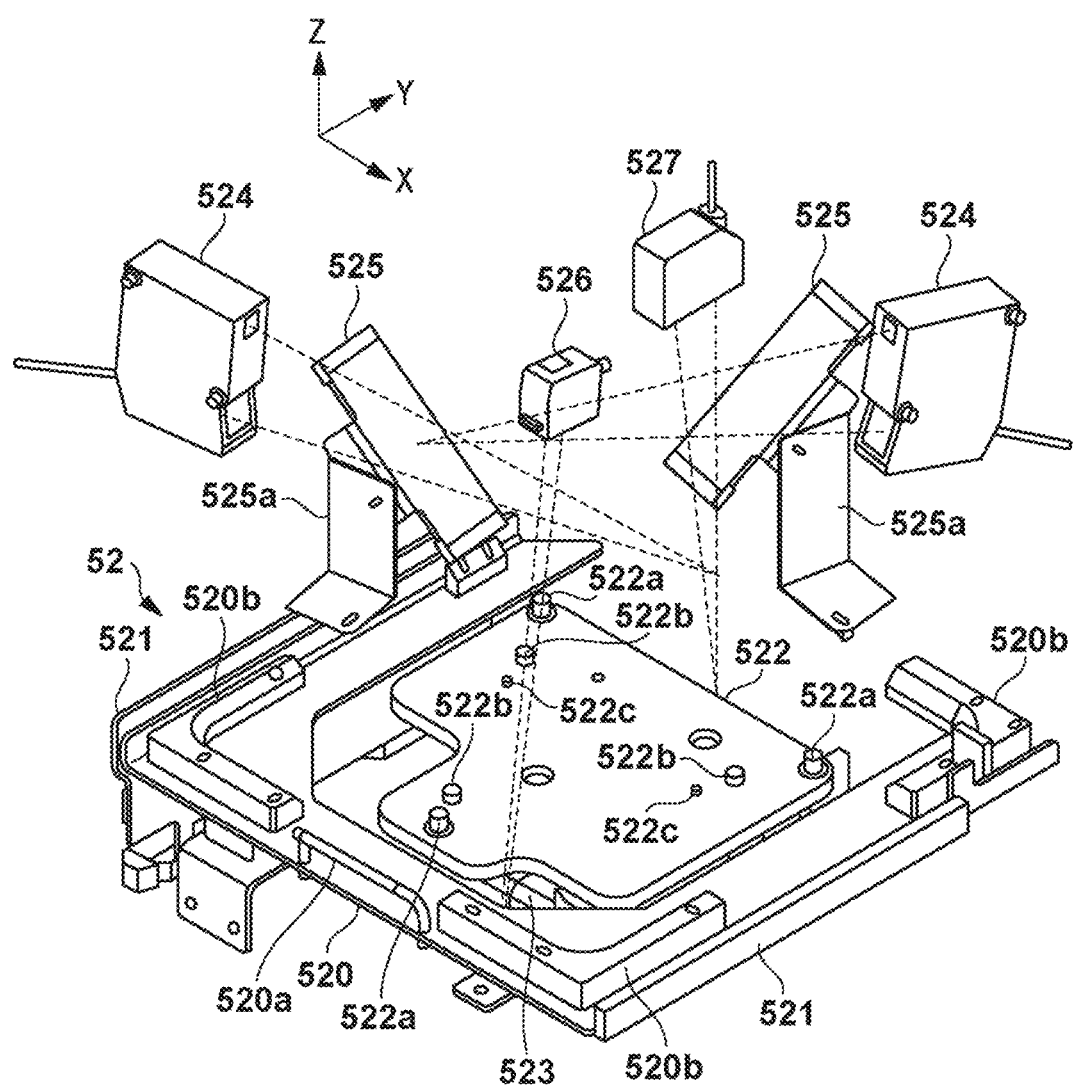
FIG. 6 is an explanatory view of a container placement apparatus.
Figure 7:
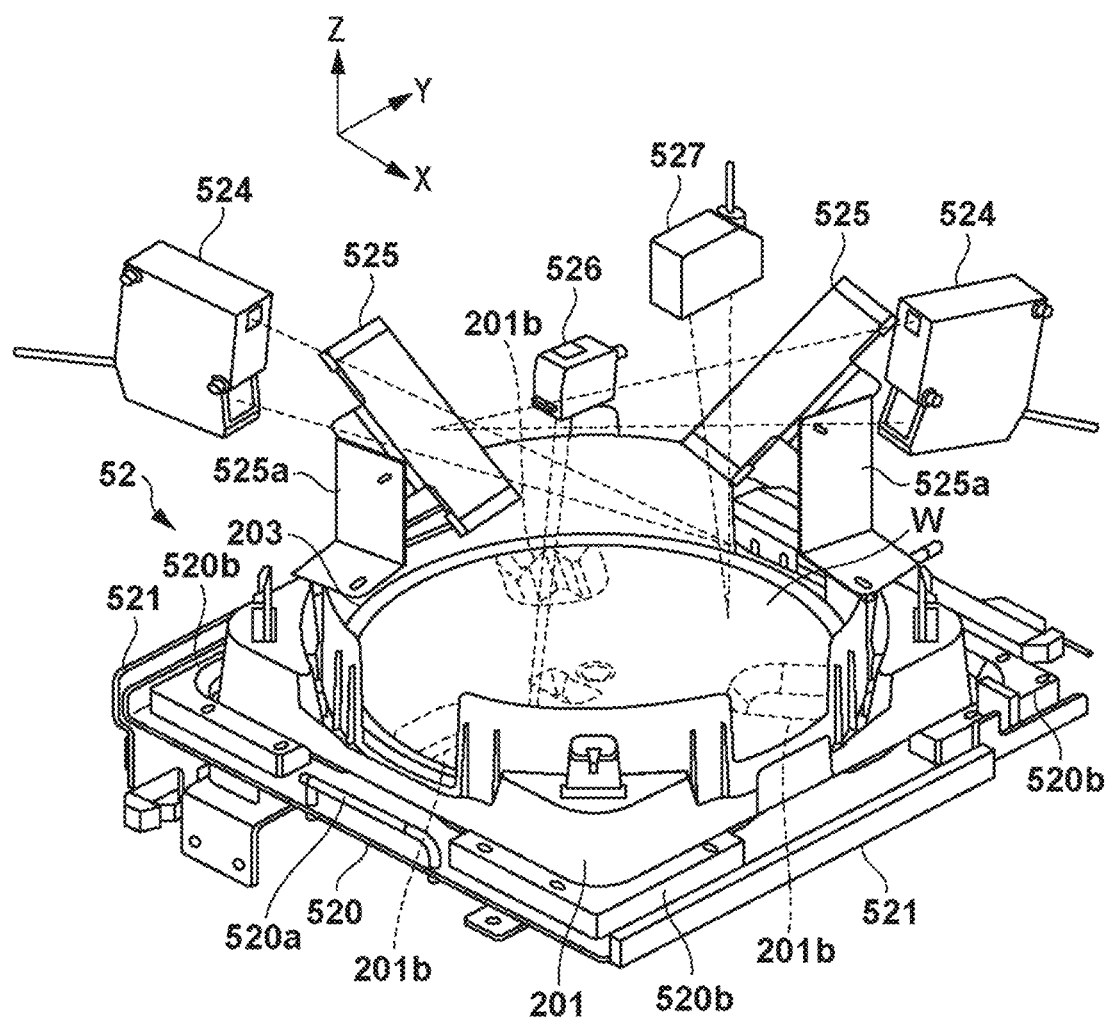
FIG. 7 is an explanatory view of a container placement apparatus.

FIG. 6 is a perspective view of the placement device 52, and FIG. 7 is a perspective view of the placement device 52 on which the container main body portion 201 is mounted. The placement device 52 includes a base plate 520, and a pair of guide members 521 that support the base plate 520 movably in the Y direction. The guide members 521 are, for example, slide rails.

The base plate 520 has a C-like outer shape that is open on the far side in the Y direction, and a handle 520a is provided on the near side in the Y direction. When loading the container main body portion 201 into the placement portion 51a or 51b, or when unloading it from the placement portion 51a or 51b, the operator opens the door 5a or 5b and grips the handle 520a, thereby drawing the base plate 520 at the position shown in FIGS. 6 and 7 from the placement portion 51a or 51b to the near side. Since a slide mechanism is provided in the placement device 52, and the whole device including the base plate 520 can retractably be put in or out of the protection material transport apparatus 5, the loading/unloading operation of the container main body portion 201 can easily be performed.

A plurality of guide members 520b are provided on the base plate 520. By guide of the plurality of guide members 520b, when the container main body portion 201 is placed on the base plate 520, the container main body portion 201 is roughly positioned with respect to the base plate 520, and rattling can be prevented.

An elevating table 522 is provided in the opening portion of the base plate 520. The elevating table 522 is moved in the Z direction by an elevating mechanism 523 arranged on the lower side. A plurality of pins 522a configured to position the container main body portion 201 are provided on the elevating table 522. The pins 522a are engaging pins for kinematic coupling, which engage with engaging portions 201b (in this embodiment, valley-shaped grooves) provided in the container main body portion 201 to correctly position the container main body portion 201 with respect to the elevating table 522.

Sensors 522b and 522c are provided on the elevating table 522. The sensors 522b are sensors that detect whether the container main body portion 201 is placed on the elevating table 522. In this embodiment, the sensors 522b are push button switches that are turned on by the weight of the container main body portion 201. The sensors 522c are sensors that detect attachment/detachment of an adapter 528 to be described later. The adapter 528 is a member attached when a coin stack container using the sheet 303 to be described later is used. In this embodiment, the sensors 522c are push button switches (presence sensors) that are turned on by the weight of the adapter 528.

When loading the container main body portion 201, the elevating table 522 is located at a retreat position lower than the base plate 520 by the elevating mechanism 523. After the operator draws the base plate 520 and places the container main body portion 201 on the base plate 520, the base plate 520 is returned to the original position. After that, the elevating table 522 is raised by the elevating mechanism 523 to lift the container main body portion 201 slightly from the base plate 520. At the time of lifting, the pins 522a engage with the engaging portions 201b of the container main body portion 201 to position the container main body portion 201, and the container main body portion 201 is supported on the elevating table 522. Note that the sensors 522c are arranged not to be turned on even when the container main body portion 201 is supported on the elevating table 522.

On the periphery of the placement device 52, sensors 524, 526, and 527 that detect the storage state of the spacers 203 and the substrates W in the container main body portion 201 are supported by the frame 50.

The sensor 524 is a laser positioning sensor, and two sensors 524 are provided in this embodiment. The sensor 524 bends the direction of a laser beam by a reflecting mirror 525 supported by the frame 50 via a bracket 525a, thereby detecting an aimed position. The sensor 524 detects, for example, the height of the stacked body of the spacers 203 and the substrates W on the container main body portion 201. The sensor 526 is a color sensor and is used to discriminate the type of the member of the uppermost layer in the stacked body of the spacers 203 and the substrates W on the container main body portion 201. The sensor 527 is a laser positioning sensor, and detects the height of the stacked body of only the spacers 203 stacked on the container main body portion 201.

Figure 8:
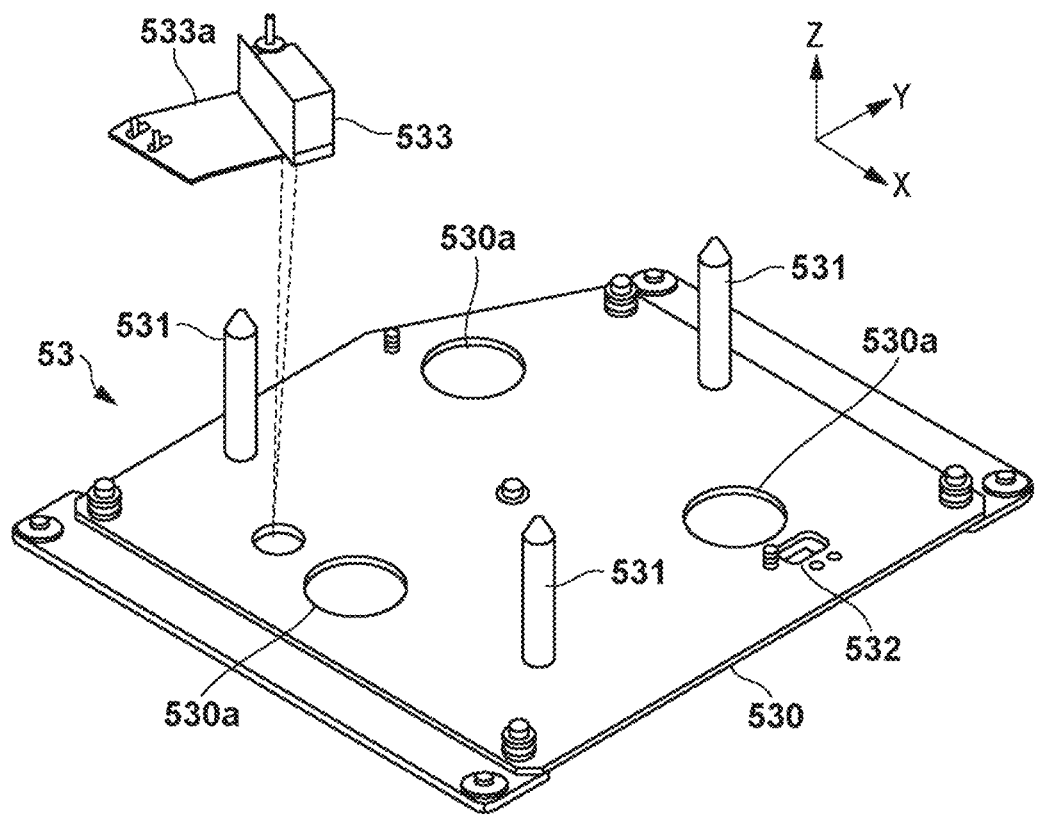
FIG. 8 is an explanatory view of a protection material placement apparatus.

The placement device 53 will be described next. FIG. 8 is a perspective view of the placement device 53. The placement device 53 includes a base plate 530. A plurality of positioning pins 531 stand on the base plate 530. In this embodiment, the number of positioning pins 531 is three.

Figure 4B:
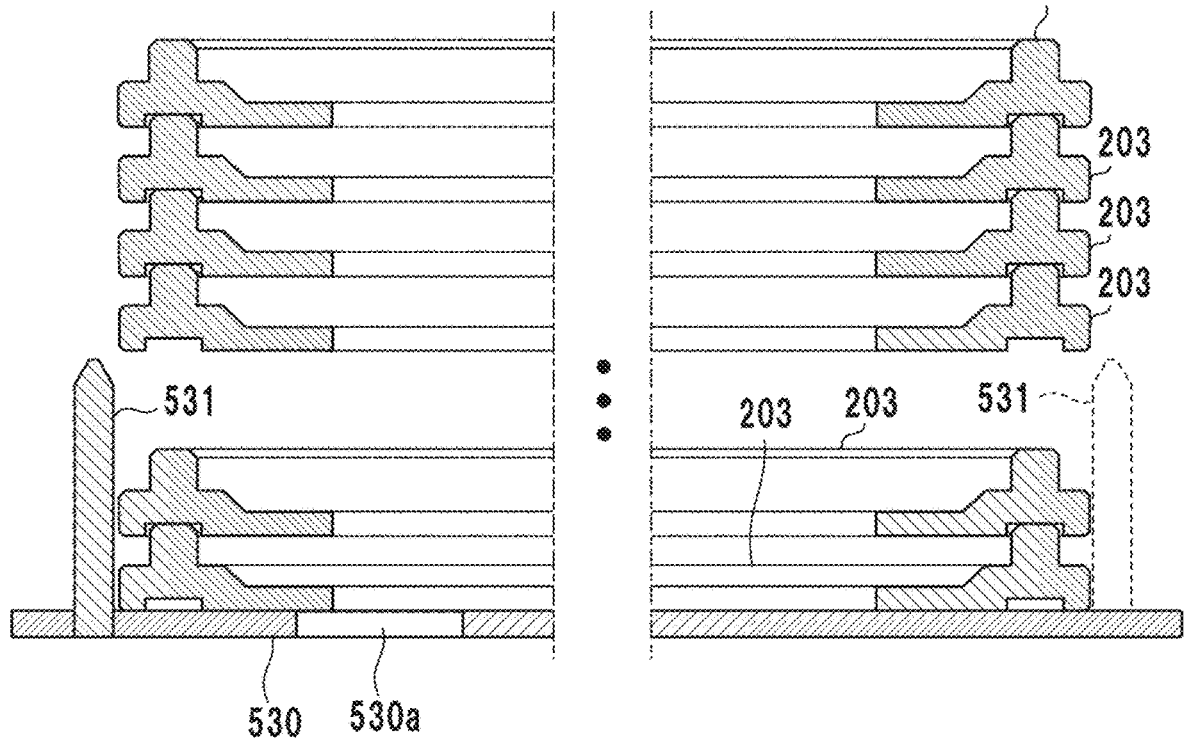
FIG. 4B is an explanatory view of a container.

The spacers 203 are stacked on the base plate 530 on the inner side of the three positioning pins 531. FIG. 4B shows an example of the spacers 203 stacked on the base plate 530. When the outer peripheral surfaces of at least some spacers 203 in a stacked body 203S to be described later are positioned by the positioning pins 531, the stacked body of the spacers 203 is positioned with respect to the base plate 530. Opening portions 530a are formed in the base plate 530 at positions overlapping the inner peripheral portion of the spacers 203. The spacers 203 to be positioned by the positioning pins 531 need not always be all spacers 203 forming the stacked body 203S. However, all spacers 203 may be positioned, as a matter of course.

A sensor 532 is provided on the base plate 530. The sensor 532 is a sensor that detects attachment/detachment of an adapter 534 to be described later. The adapter 534 is a member configured to hold the stacked body of the sheets 303 to be described later. In this embodiment, the sensor 532 is a reflection type optical sensor, and is arranged on the lower side of an opening provided in the base plate 530.

On the periphery of the placement device 53, a sensor 533 that detects the stacked state of the spacers 203 on the base plate 530 is provided. The sensor 533 is a laser positioning sensor and detects the height of the stacked body of the spacers 203 stacked on the base plate 530. The sensor 533 is supported by the frame 50 via a bracket 533a.

(Configuration of Robot Storage Portion)

Figure 9:
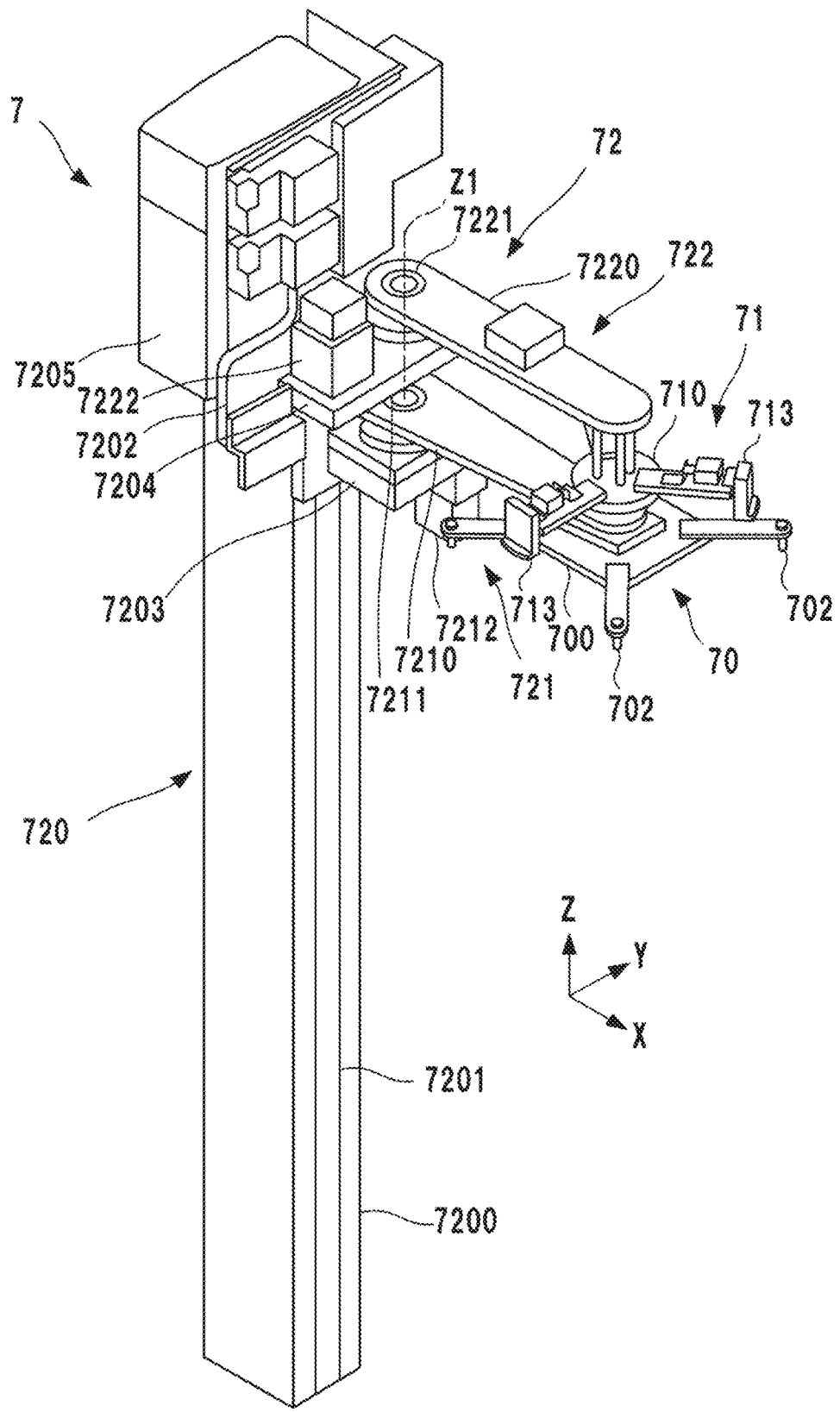
FIG. 9 is an explanatory view of a protection material transport robot.

A protection material transport robot 7 is provided in the robot storage portion 5B. The protection material transport robot 7 is a robot that transports the spacer 203 between the placement portion 51a or 51b and the placement portion 51c. The protection material transport robot 7 will be described with reference to FIGS. 1, 5, and 9. FIG. 9 is an explanatory view of the protection material transport robot 7 or a perspective view thereof. The protection material transport robot 7 will sometimes simply be referred to as the transport robot 7 hereinafter.

The transport robot 7 includes a holding unit 70, a holding unit 71, and a moving unit 72. Both the holding units 70 and 71 are units that hold the spacer 203, and the moving unit 72 is a unit that supports the holding units 70 and 71 and moves them between the placement portion 51a or 51b and the placement portion 51c. In this embodiment, the holding unit 70 and the holding unit 71 are arranged to overlap in the Z direction. This contributes to size reduction of the protection material transport apparatus 5 in the X and Y directions.

The moving unit 72 includes a moving unit 721 that pivotally supports the holding unit 70, a moving unit 722 that pivotally supports the holding unit 71, and a moving unit 720 that moves both the moving units 721 and 722. The moving units 721 and 722 are individual units for the holding units 70 and 71, and the moving unit 720 is a unit common to the holding units 70 and 71.

The moving unit 720 includes a column member 7200 extending in the Z direction. A guide groove 7201 that guides the movement of a slider 7202 is provided on a side portion of the column member 7200. The guide groove 7201 guides the movement of the slider 7202 in the Z direction.

The slider 7202 is a plate-shaped member having a thickness in the X direction, and moves up and down along the guide groove 7201. A driving unit 7205 includes, particularly, the driving source of a driving mechanism that moves the slider 7202 up and down. The driving mechanism includes the driving source such as a motor, and a transmission mechanism (for example, a ball screw mechanism or a belt transmission mechanism) that converts the rotational driving of the driving source into a linear motion in the Z direction and transmits it to the slider 7202. Some components of the transmission mechanism are incorporated in the column member 7200.

A base member 7203 that supports the moving unit 721, and a base member 7204 that supports the moving unit 722 are fixed to the slider 7202. Both the base members 7203 and 7204 are plate-shaped members having a thickness in the Z direction, and are fixed to the slider 7202 to overlap vertically in the Z direction. By moving the slider 7202 up and down, the moving units 721 and 722, that is, the holding units 70 and 71 can be moved up and down together.

The moving unit 721 is a unit that supports the holding unit 70 pivotally in the horizontal direction. The moving unit 721 includes an arm member 7210, a pivotal support portion 7211 that pivotally supports the arm member 7210, and a driving unit 7212. The arm member 7210 is a member extending in the horizontal direction. The holding unit 70 is supported at one end of the arm member 7210, and the other end is supported by a pivotal support portion 7211. The pivotal support portion 7211 is a mechanism that supports the arm member 7210 pivotally about a pivot center axis Z1 in the Z direction, and includes a rotor connected to the arm member 7210, and a support portion that is fixed to the base member 7203 and supports the rotor rotatably about the axis Z1. The driving unit 7212 includes a driving source such as a motor, and a transmission mechanism (for example, a belt transmission mechanism or a gear mechanism) that transmits the driving force of the driving source to the rotor of the pivotal support portion 7211.

The moving unit 722 is a unit that supports the holding unit 71 pivotally in the horizontal direction. The moving unit 722 includes an arm member 7220, a pivotal support portion 7221 that pivotally supports the arm member 7220, and a driving unit 7222. The arm member 7220 is a member extending in the horizontal direction. The holding unit 71 is supported at one end of the arm member 7220, and the other end is supported by a pivotal support portion 7221.

The pivotal support portion 7221 is a mechanism that supports the arm member 7220 pivotally about the pivot center axis Z1 in the Z direction, and includes a rotor connected to the arm member 7220, and a support portion that is fixed to the base member 7204 and supports the rotor rotatably about the axis Z1. The driving unit 7222 includes a driving source such as a motor, and a transmission mechanism (for example, a belt transmission mechanism or a gear mechanism) that transmits the driving force of the driving source to the rotor of the pivotal support portion 7221.

In this embodiment, the moving units 721 and 722 are arranged with an offset in the Z direction, and has the pivot center axis Z1 on the same axis. It is therefore possible to implement space saving and size reduction of the protection material transport apparatus 5 in the X and Y directions. In the moving unit 721 located on the lower side, the driving unit 7212 is arranged on the lower side of the base member 7203. In the moving unit 722 located on the upper side, the driving unit 7222 is arranged on the upper side of the base member 7204. Hence, the moving units 721 and 722 can be arranged closer in the Z direction.

In this embodiment, each of the moving units 721 and 722 independently makes the corresponding one of the holding units 70 and 71 pivot in the horizontal direction within the range of 90°. FIG. 5 shows a pivot position in a case in which the holding units 70 and 71 are located in the rack portion 5A. This pivot position will be referred to as an operation position. FIG. 2 shows a pivot position at which the holding units 70 and 71 pivot by 90° from the operation position and are located outside the rack portion 5A. This pivot position will be referred to as an elevating position. An arrow D in FIG. 2 indicates the pivot direction of the holding units 70 and 71.

Figure 10:
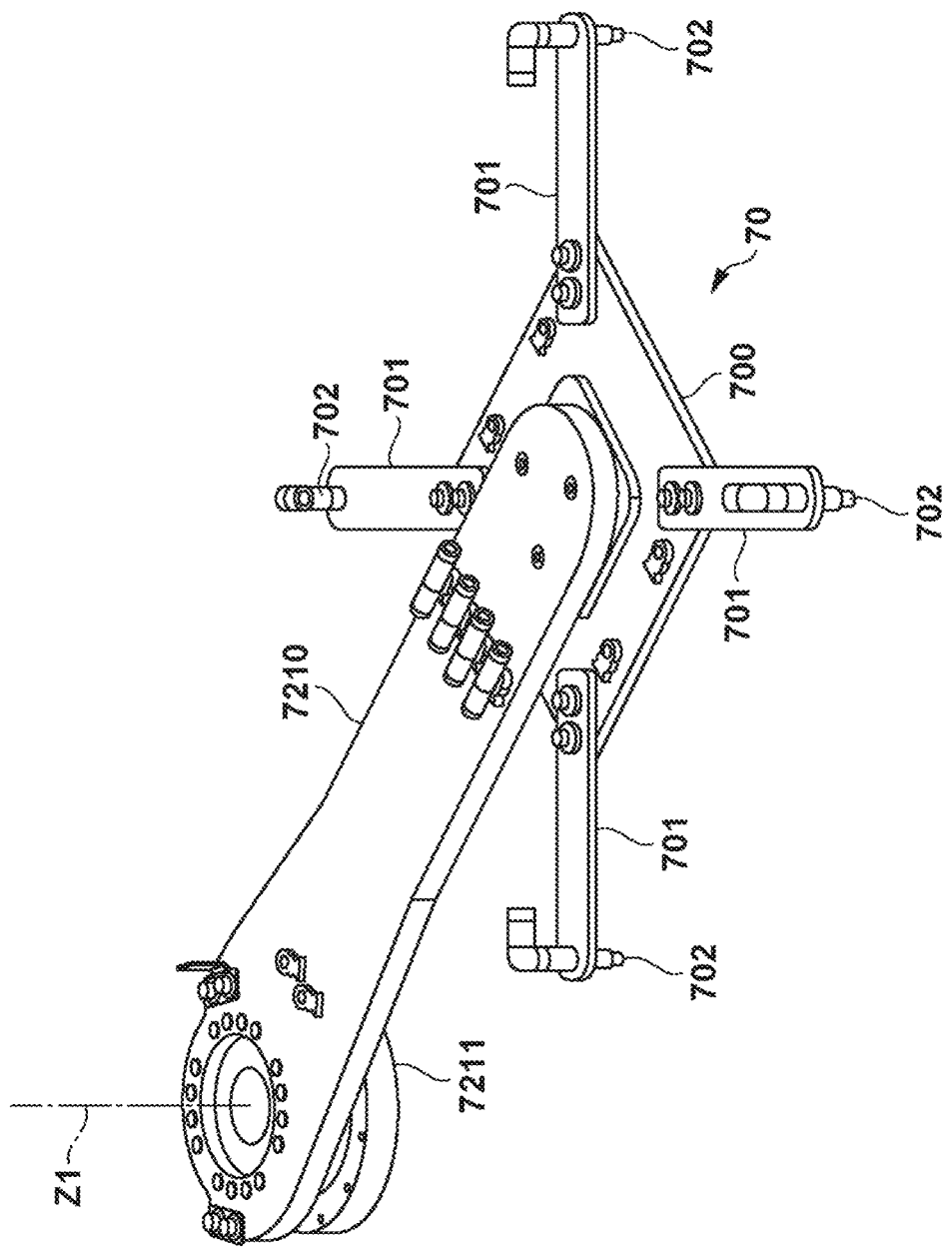
FIG. 10 is an explanatory view of a holding unit.

The configurations of the holding units 70 and 71 will be described next. The holding unit 70 will be described first. FIG. 10 is an explanatory view of the holding unit 70 or a perspective view of the holding unit 70 shown together with the arm member 7210 and the pivotal support portion 7211.

The holding unit 70 includes a plate-shaped rectangular base member 700 having a thickness in the Z direction, and a plurality of support members 701 radially extending from the four corners of the base member 700. A suction portion 702 is supported at the distal end of each support member 701. The suction portion 702 according to this embodiment is a nozzle member connected to a negative pressure source (not shown) and configured to suck air from an opening at the lower end. The four suction portions 702 are arranged on a virtual circle having the same diameter as the spacer 203 to suck the upper surface of the spacer 203 (in this embodiment, an upper surface 203d). One spacer 203 can be held in a horizontal posture by the four suction portions 702. Note that the number of suction portions 702 may be other than four. In addition, as the holding method of the spacer 203, a holding method other than suction (for example, grip or the like) may be used.

Figure 11:
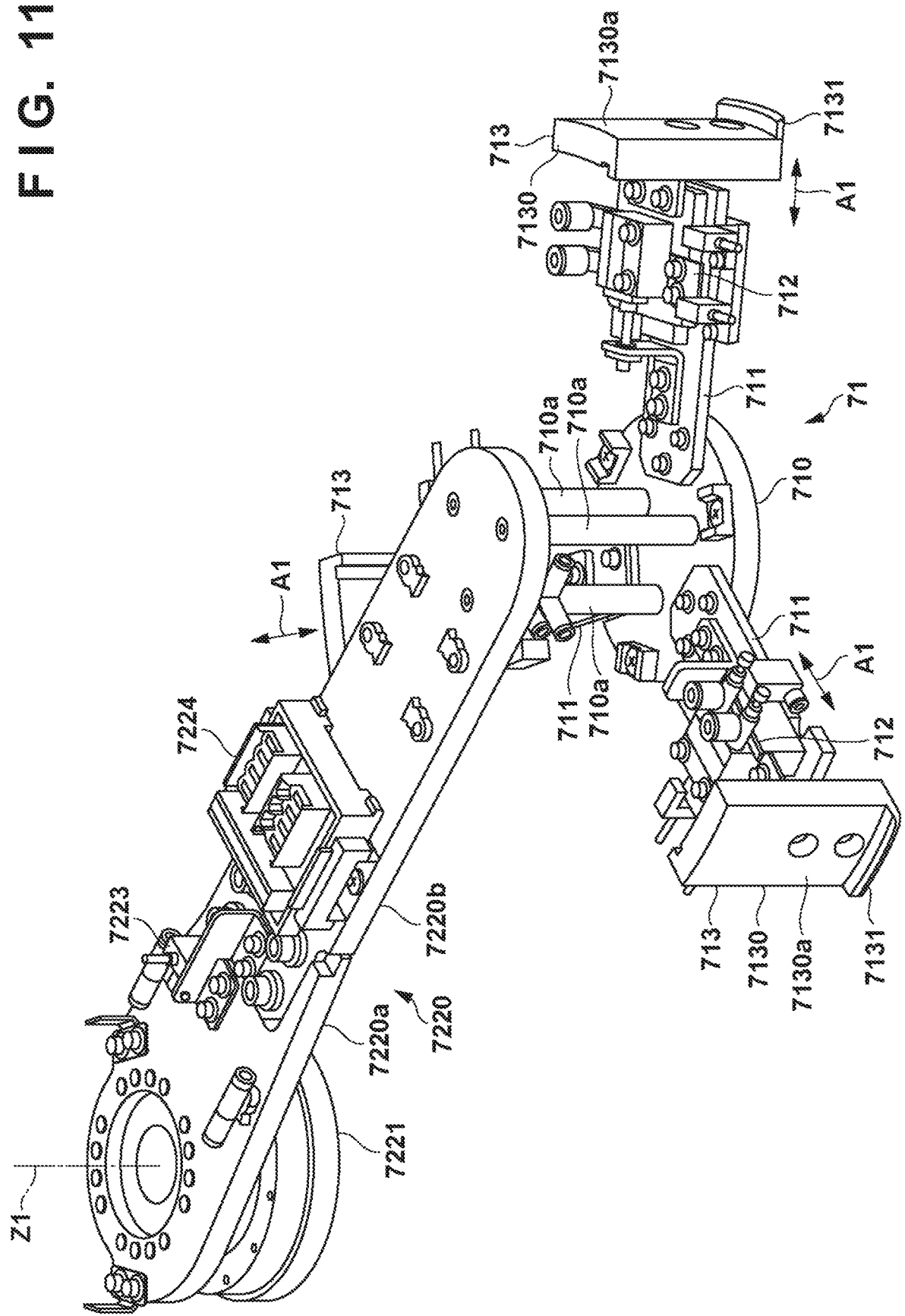
FIG. 11 is an explanatory view of a holding unit.

The holding unit 71 will be described next. FIG. 11 is an explanatory view of the holding unit 71 or a perspective view of the holding unit 71 shown together with the arm member 7220 and the pivotal support portion 7221.

The configuration of the arm member 7220 according to this embodiment will further be described. In this embodiment, the arm member 7220 has a two-member structure including a proximal-side member 7220a and a distal-side member 7220b, which are detachably connected to each other. The holding unit 71 and the distal-side member 7220b constitute an arm member that is one exchange unit. When the sheet 303 to be described later is used, the aspect is exchanged as a unit. Details will be described later.

The holding unit 71 includes a plate-shaped circular base member 710 having a thickness in the Z direction, and three support members 711 radially extending from the base member 710 in three directions. The base member 710 is connected to the arm member 7220 via a plurality of suspending shafts 710a. This can avoid interference between the stacked body of the spacers 203 and the arm member 7220 when holding the stacked body of the spacers 203 at once.

An engaging member 713 is supported at the distal end of each support member 711 via a displacement unit 712. The displacement unit 712 displaces the engaging member 713 expandably/contractably in the radial direction of the base member 710 (the longitudinal direction of the support member 711), as indicated by an arrow A1 in FIG. 11. The position at which the engaging member 713 is displaced outward in the radial direction will be referred to as an engaging position, and the position at which the engaging member 713 is displaced inward will be referred to as a retreat position. In this embodiment, the displacement unit 712 is an air cylinder that expands/contracts in the longitudinal direction of the support member 711.

A total of three engaging members 713 are provided. The three engaging members 713 are provided at equal intervals (equal angles) in the circumferential direction on a virtual circle with respect to the base member 710 as the center. When each engaging member 713 is located at the engaging position, the virtual circle corresponds to the inner peripheral circle of the spacer 203. Hence, the three engaging members 713 are provided at equal intervals in the circumferential direction of the spacer 203.

Each engaging member 713 includes a main body portion 7130 having an almost rectangular parallelepiped outer shape extending in the Z direction. An outer peripheral portion 7130a of the main body portion 7130 has a curved surface along the inner peripheral surface of the stacked body of the spacers 203. The engaging member 713 includes, at the lower end of the main body portion 7130 (the lower end of the outer peripheral portion 7130a), a flange-shaped engaging portion 7131 extending outward. When holding the stacked body of the spacers 203 at once, the engaging portion 7131 abuts against the spacer 203 of the lowermost layer from below and scoops the stacked body.

FIGS. 12A to 13B show an example of an operation of holding the stacked body 203S of the spacers 203 at once by the holding unit 71. The stacked body 203S of the spacers 203 is formed by, for example, stacking several tens of the spacers 203 as shown in FIG. 4B. The stacked body 203S is placed on the container main body portion 201 in the placement portion 51a or 51b or placed on the base plate 530 of the placement device 53.

Figure 12A:
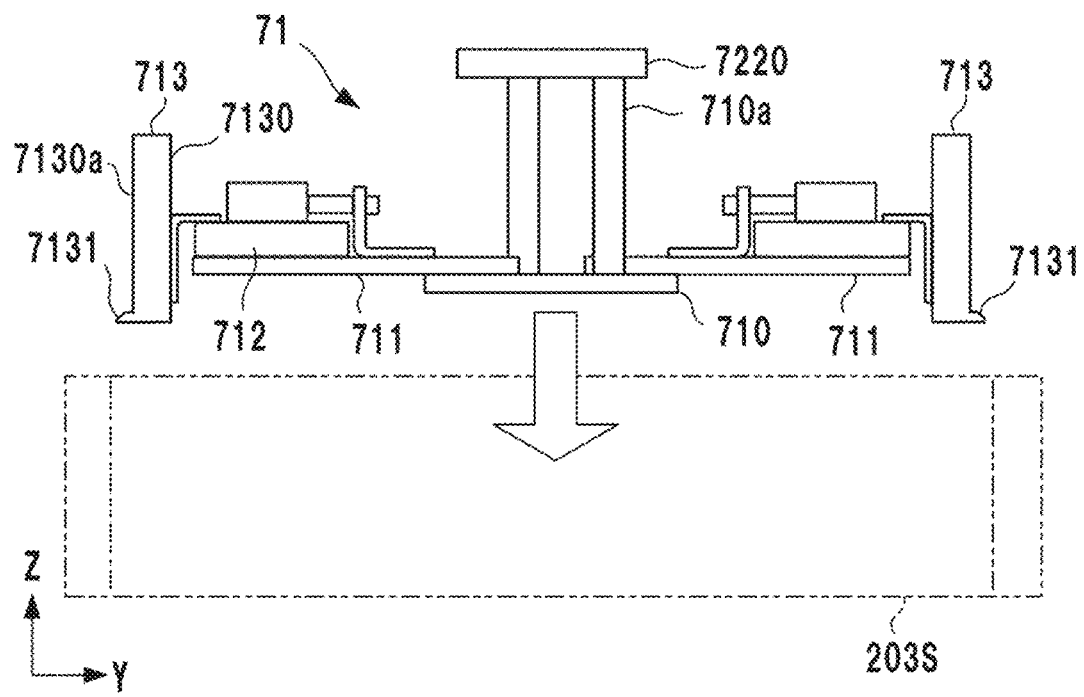
FIG. 12A is an explanatory view of a holding operation by the holding unit shown in FIG. 11.
Figure 12B:
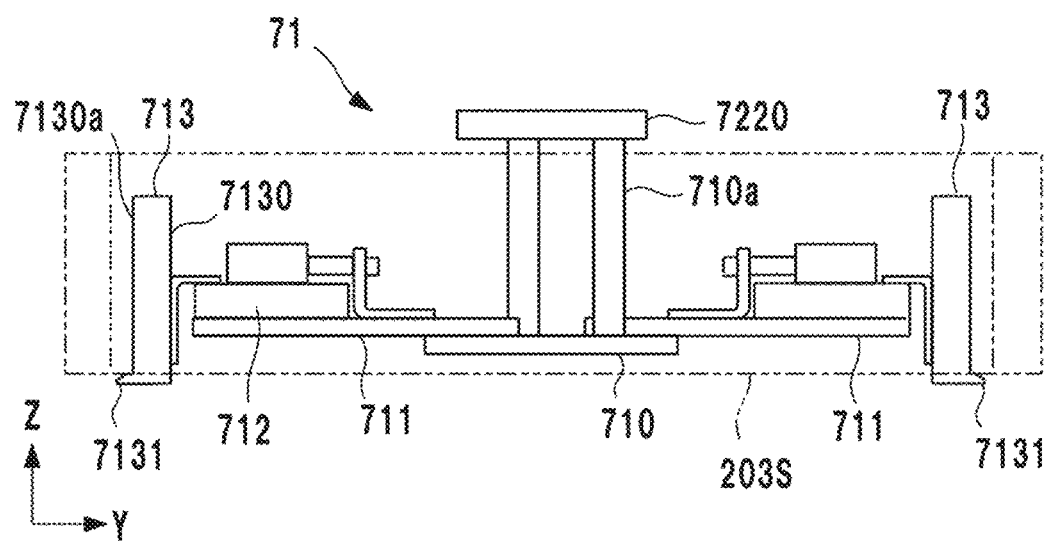
FIG. 12B is an explanatory view of a holding operation by the holding unit shown in FIG. 11.

As shown in FIG. 12A, the holding unit 71 is moved to the upper side of the stacked body 203S by the moving unit 72. At this time, the holding unit 71 is located at the operation position, and the holding unit 70 is located at the elevating position. In a state in which each engaging member 713 is located at the retreat position, the holding unit 71 is lowered to the internal space of the stacked body 203S by the moving unit 72, as shown in FIG. 12B. If the stacked body 203S is placed on the container main body portion 201, the engaging portions 7131 enter the concave portion 201a (see FIG. 4A). If the stacked body 203S is placed on the base plate 530, the engaging portions 7131 enter the opening portion 530a (see FIGS. 4B and 8).

Figure 13A:
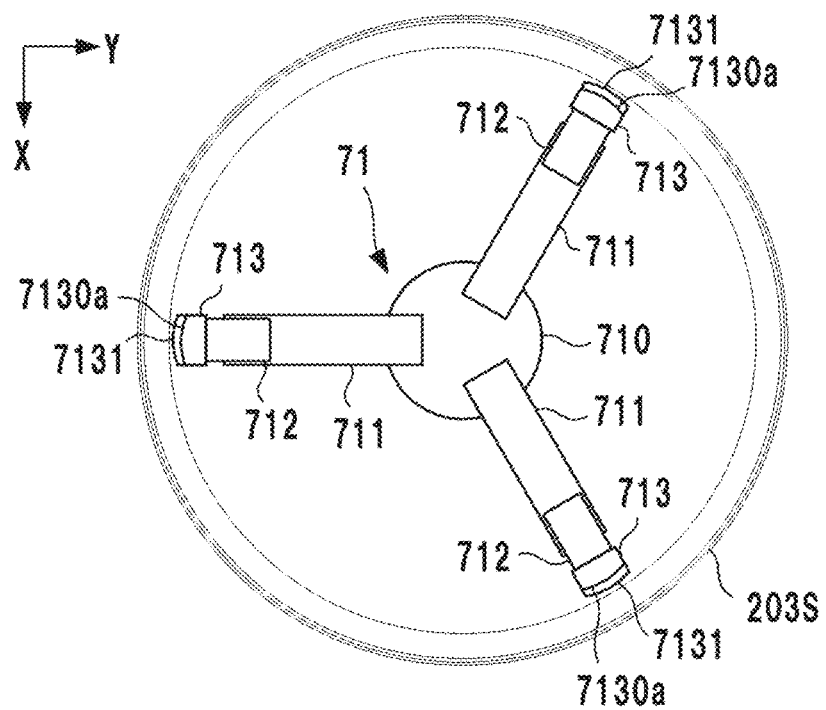
FIG. 13A is an explanatory view of a holding operation by the holding unit shown in FIG. 11.
Figure 13B:
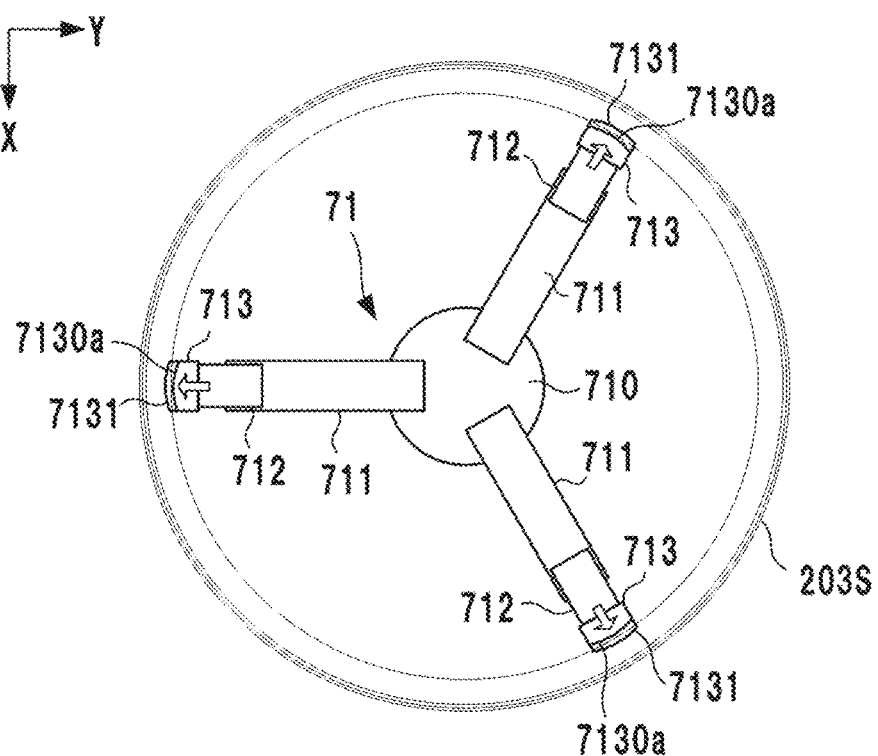
FIG. 13B is an explanatory view of a holding operation by the holding unit shown in FIG. 11.

FIG. 13A is a view showing a state in which the holding unit 71 is lowered from the upper side of the stacked body 203S. From this state, the displacement units 712 are driven to displace the engaging members 713 to the engaging positions, as shown in FIG. 13B. The stacked body 203S is thus held by the three engaging members 713 from the inside. More specifically, the engaging portions 7131 enter to the lower side of the spacer 203 of the lowermost layer of the stacked body 203S, and the stacked body 203S is placed on the three engaging portions 7131. Hence, the holding unit 71 can be moved in a state in which it raises the stacked body 203S at once, and a state in which the stacked body 203S is held is obtained.

Additionally, in this embodiment, the outer peripheral portions 7130a of the three engaging members 713 abut against the inner peripheral surface of the stacked body 203S. The holding force for the stacked body 203S thus improves. Adjacent spacers 203 that form the stacked body 203S are difficult to displace from each other in the radial direction because of the engagement between the convex portion 203b and the concave portion 203a. If the height of the outer peripheral portion 7130a (the height in the Z direction) is ⅔ or more of the height of the stacked body 203S, preferably, ¾ or more, the whole stacked body 203S can be held more stably.

<Control Apparatus>

Figure 14:
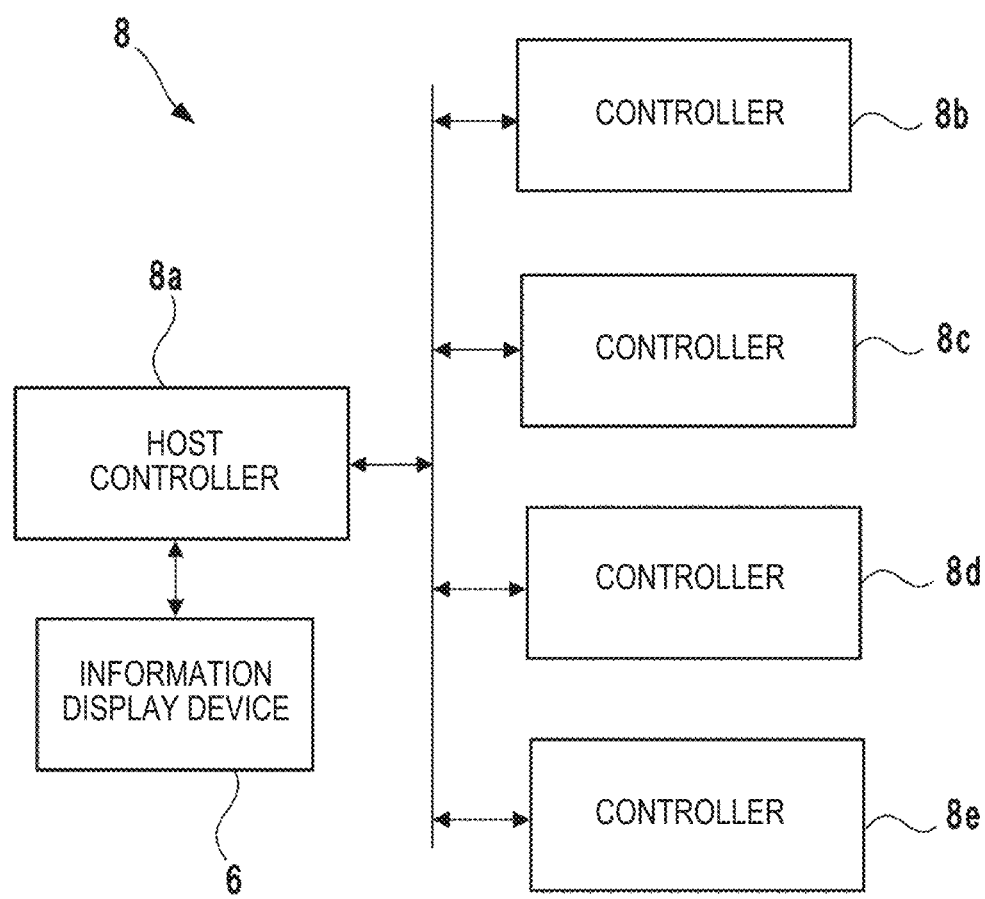
FIG. 14 is a block diagram of the control apparatus of the transport system shown in FIG. 1.

FIG. 14 is a block diagram of a control apparatus 8 of the transport system 1. The control apparatus 8 includes a host controller 8a that controls the entire system, a controller 8b that controls the substrate transport apparatus 2, a controller 8c that controls the load port 3, a controller 8d that controls the aligning apparatus 4, a controller 8e that controls the protection material transport apparatus 5, and these are communicably connected to each other. The controllers 8b to 8e each include, for example, a PLC (Programable Logic Controller), and an input/output interface that relays signals between the PLC and a sensor or an actuator. The host controller 8a performs these control operations by communication with the controllers 8b to 8e, thereby executing unpacking or packing of the substrates W.

Example of Control

An example of control of the transport system 1 by the control apparatus 8 will be described. An example of unpacking and packing of the substrates W will be described here. An example of unpacking will be described first.

Example of Unpacking

An example of unpacking will be described. Generally speaking, unpacking is an operation of alternately extracting the spacers 203 and the substrates W one by one from the stacked body of the spacers 203 and the substrates W placed on the container main body portion 201 on the placement portion 51a or 51b (on the placement device 52). In this embodiment, the protection material transport robot 7 extracts the spacers 203 and stacks them on the placement portion 51c. In addition, the substrate transport robot 20 extracts the substrates W and transfers the substrates W to the container 100 on the load port 3. As the unpacking progresses, the stacked body 203S of the spacers 203 is formed on the placement portion 51c. Finally, the protection material transport robot 7 transports the stacked body 203S to the container main body portion 201 on the placement portion 51a or 51b at once. The efficiency of unpacking can be improved by this batch transport.

An example of unpacking will be described in detail with reference to FIGS. 15A to 22. Here, the stacked body of the spacers 203 and the substrates W placed on the container main body portion 201 on the placement portion 51a (on the placement device 52) is the target of unpacking. However, a similar procedure is used when the stacked body of the spacers 203 and the substrates W placed on the container main body portion 201 of the placement portion 51b is the target of unpacking.

Figure 15A:
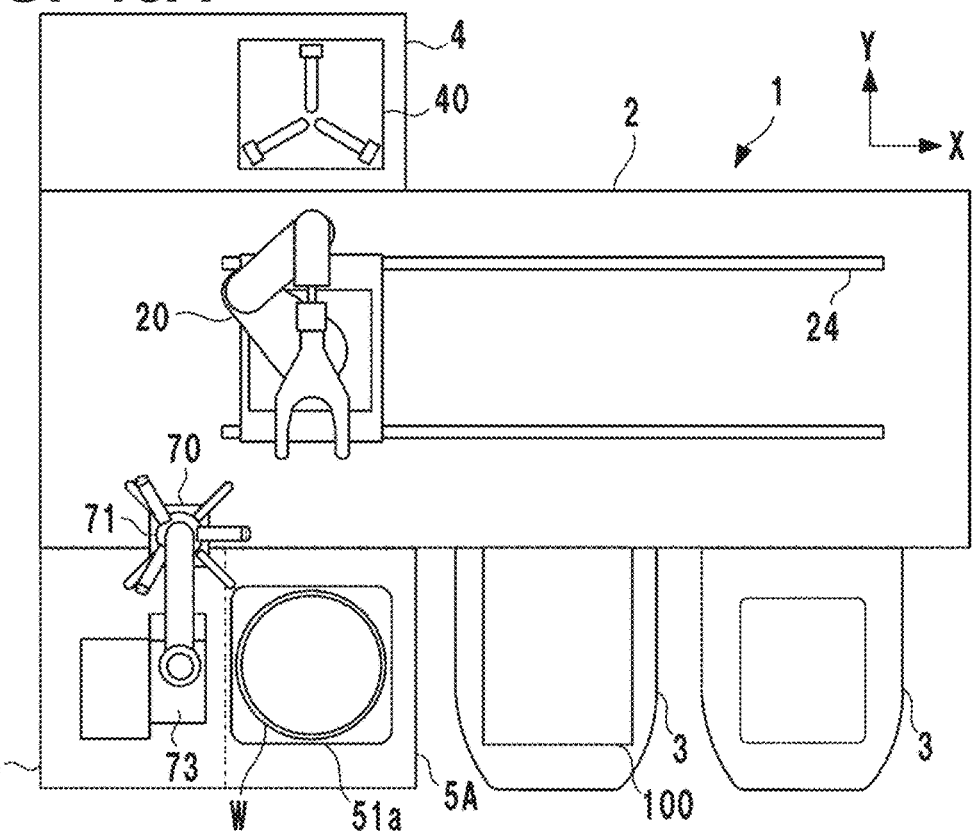
FIG. 15A is an explanatory view of the operation of the transport system shown in FIG. 1.
Figure 15B:
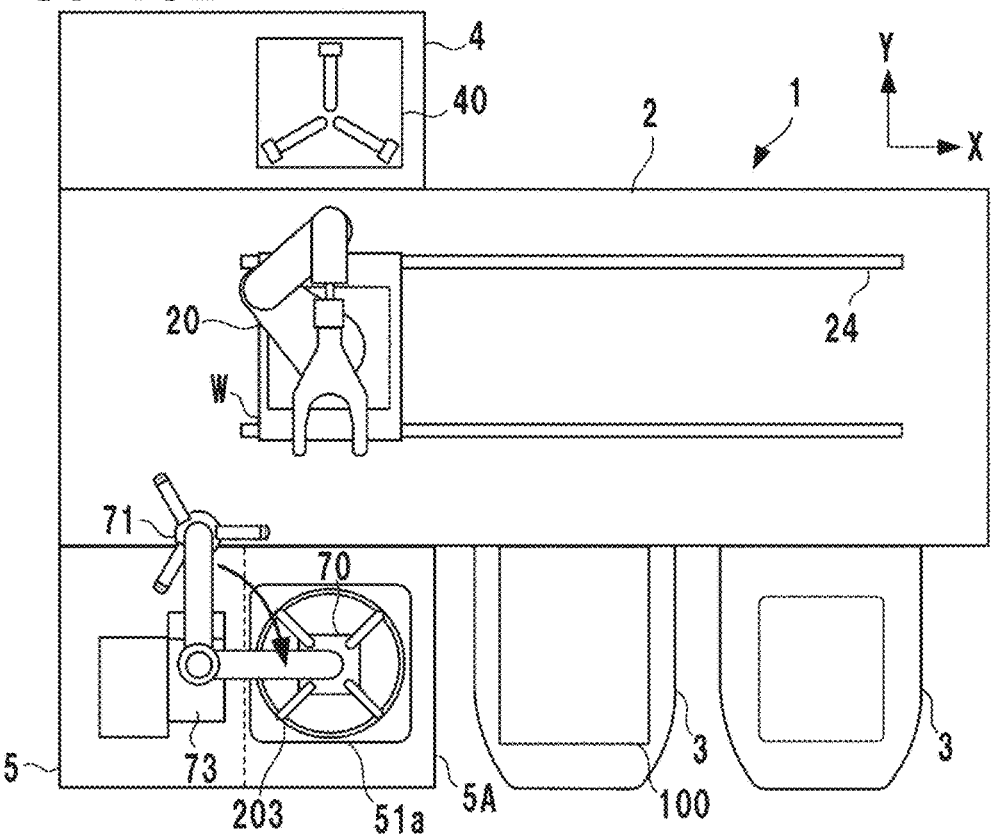
FIG. 15B is an explanatory view of the operation of the transport system shown in FIG. 1.

FIGS. 15A and 15B show a step of extracting, by the protection material transport robot 7, the spacer 203 of the uppermost layer from the stacked body of the spacers 203 and the substrates W. At the stage shown in FIG. 15A, the holding units 70 and 71 of the protection material transport robot 7 are located at the elevating position.

Figure 16A:
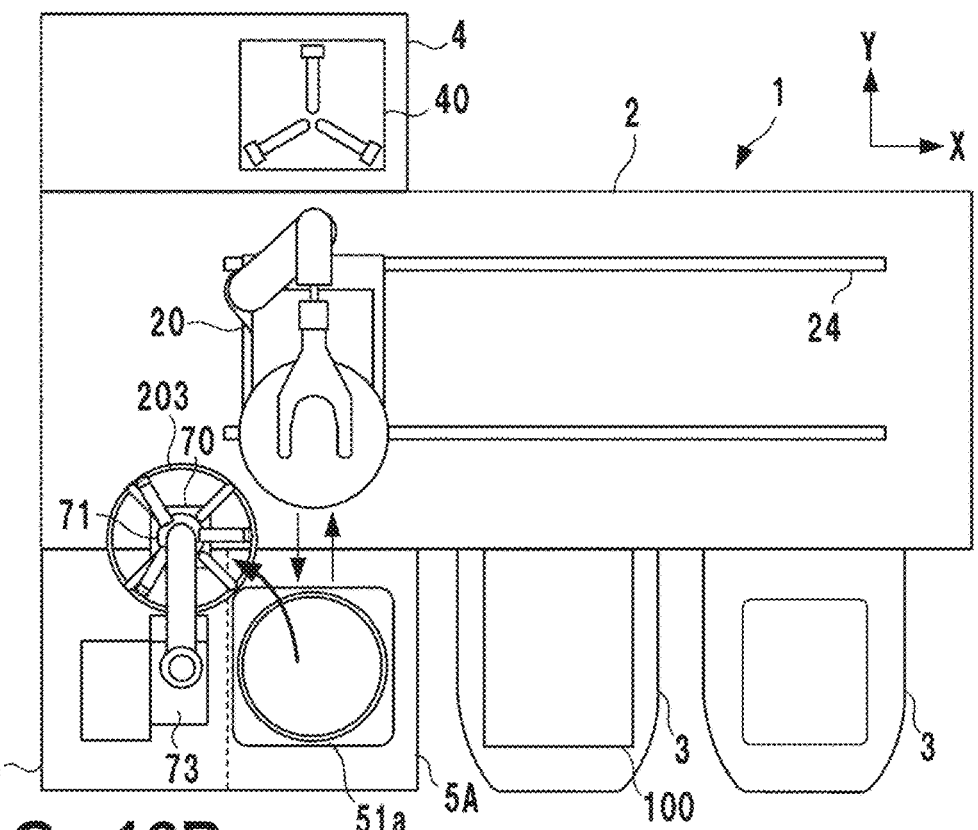
FIG. 16A is an explanatory view of the operation of the transport system shown in FIG. 1.

First, as shown in FIG. 15B, the protection material transport robot 7 is operated to make the holding unit 70 pivot to the operation position and locate it above the spacer 203 of the uppermost layer. Next, the holding unit 70 is lowered to hold the spacer 203 of the uppermost layer. After that, the holding unit 70 is raised and made to pivot and thus returned to the elevating position, as shown in FIG. 16A.

Note that when moving the holding unit 70 up and down, the holding unit 71 is also moved together up and down.

Figure 16B:
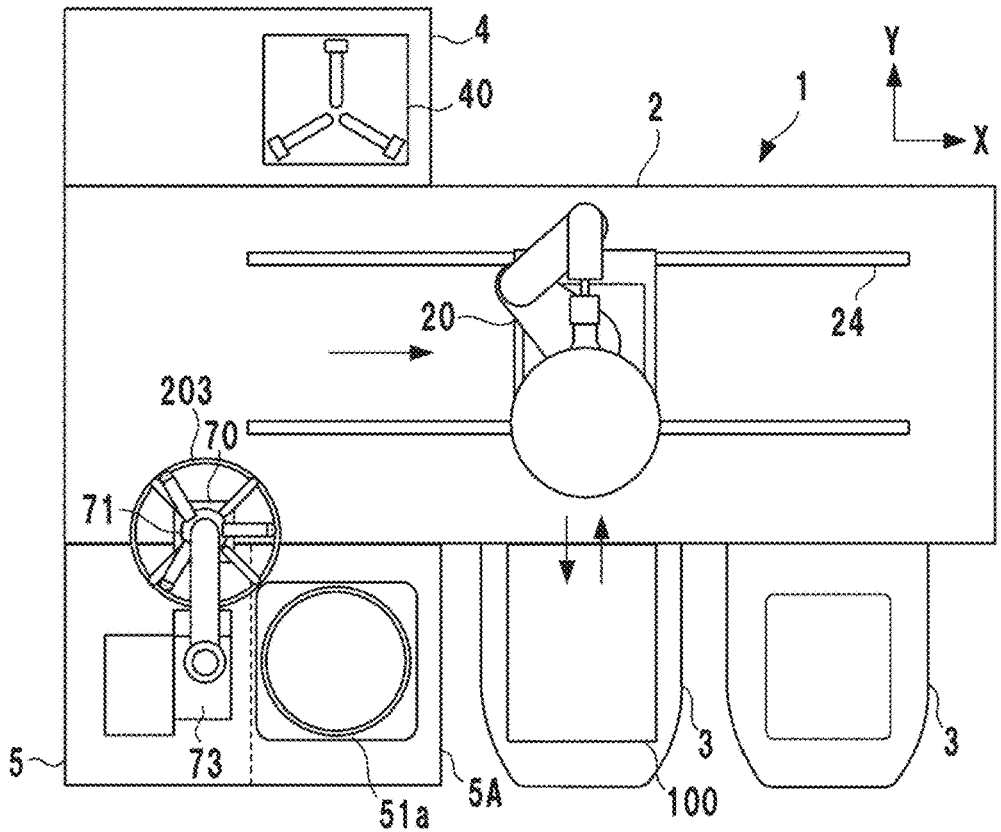
FIG. 16B is an explanatory view of the operation of the transport system shown in FIG. 1.

Next to this operation, the substrate transport robot 20 extends the horizontal articulated mechanism 21 to locate the hand 21a above the substrate W, lowers the horizontal articulated mechanism 21 by the base unit 22, and sucks the substrate W by the hand 21a. After that, the horizontal articulated mechanism 21 is raised by the base unit 22, and the horizontal articulated mechanism 21 is bent to extract the substrate W. Next, after the hand 21a is rotated by 180° to reverse the substrate W, the substrate transport robot 20 is made to travel up to a position facing the load port 3, as shown in FIG. 16B. After that, the substrate transport robot 20 is operated to extend the horizontal articulated mechanism 21 and extend the hand 21a into the container 100 on the load port 3, thereby transferring the substrate W into the container 100. The lid of the container 100 is opened in advance by the load port 3.

Figure 17:
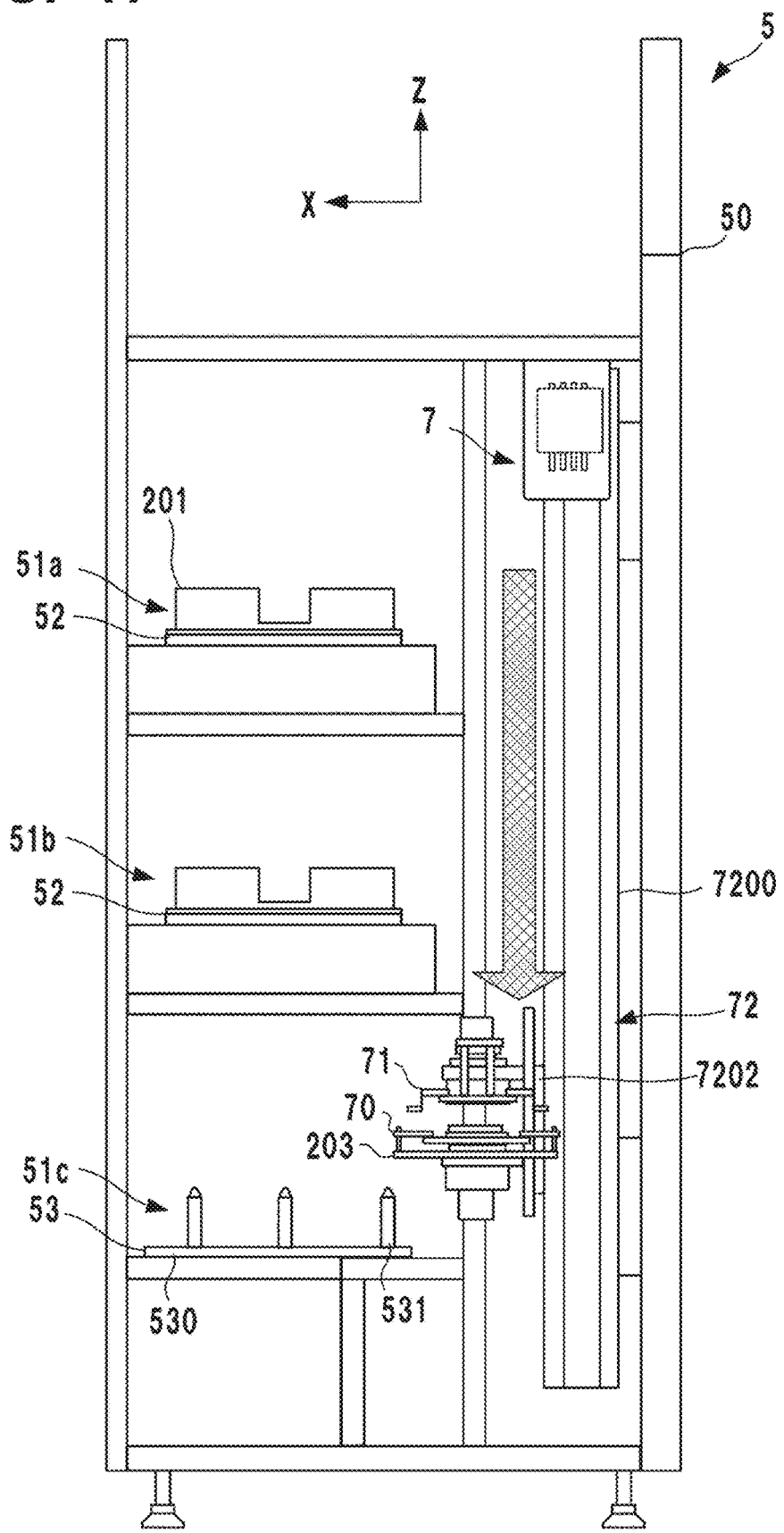
FIG. 17 is an explanatory view of the operation of the transport system shown in FIG. 1.
Figure 18:
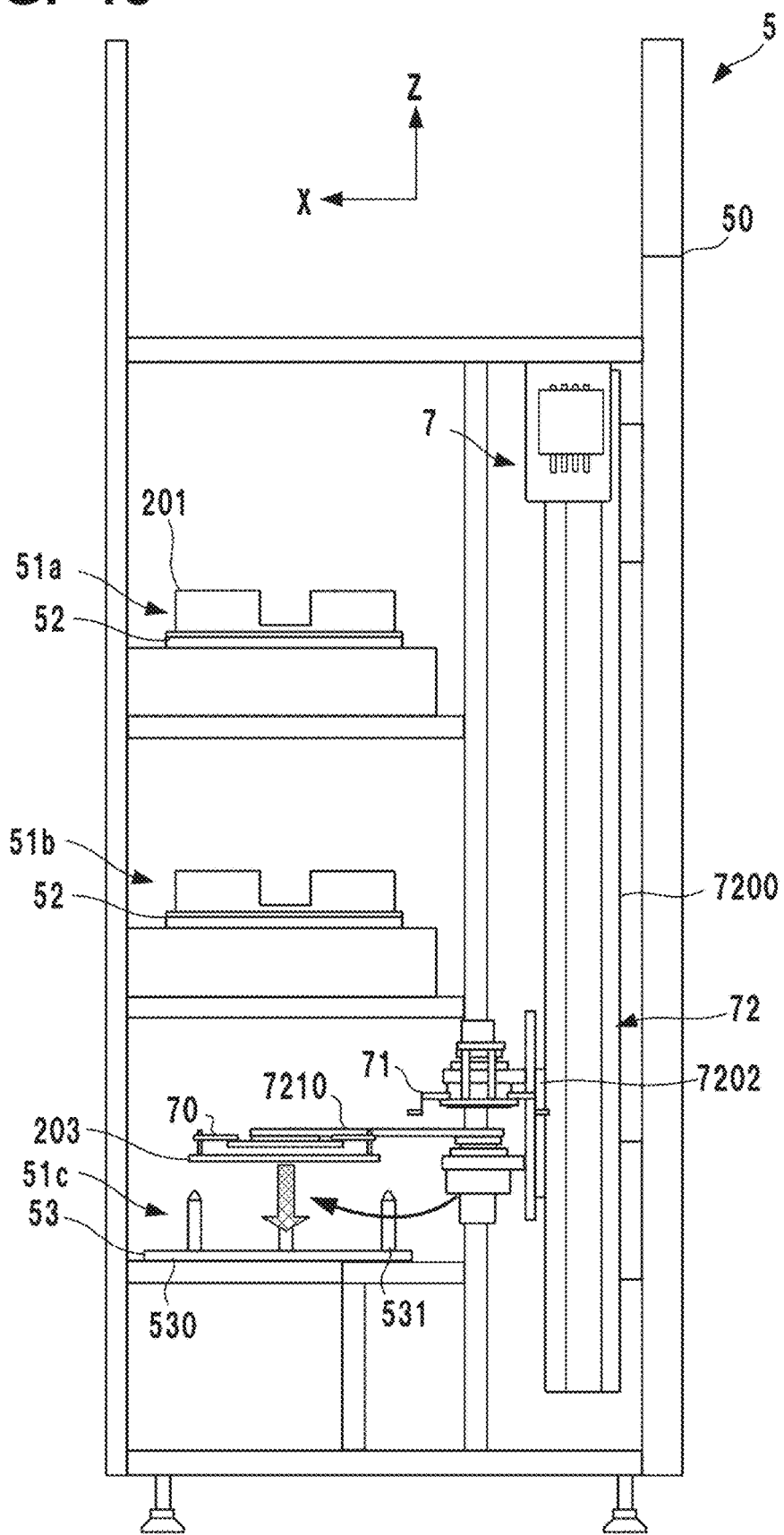
FIG. 18 is an explanatory view of the operation of the transport system shown in FIG. 1.

In parallel to the operation of the substrate transport robot 20, the holding unit 70 that holds the spacer 203 is lowered to the height of the placement portion 51c, as shown in FIG. 17. Then, as shown in FIG. 18, the holding unit 70 is made to pivot to the operation position, and the holding unit 70 is further lowered. At this time, the holding unit 71 remains at the elevating position. After that, holding of the spacer 203 by the holding unit 70 is canceled, and the spacer 203 is transferred onto the placement portion 51c (onto the placement device 53). After that, the holding unit 70 is made to pivot to the elevating position again.

The protection material transport robot 7 is further raised and located at the height of the placement portion 51a. At the same time as the start of traveling of the substrate transport robot 20, suction and transfer of the next spacer 203 are performed.

Figure 19:
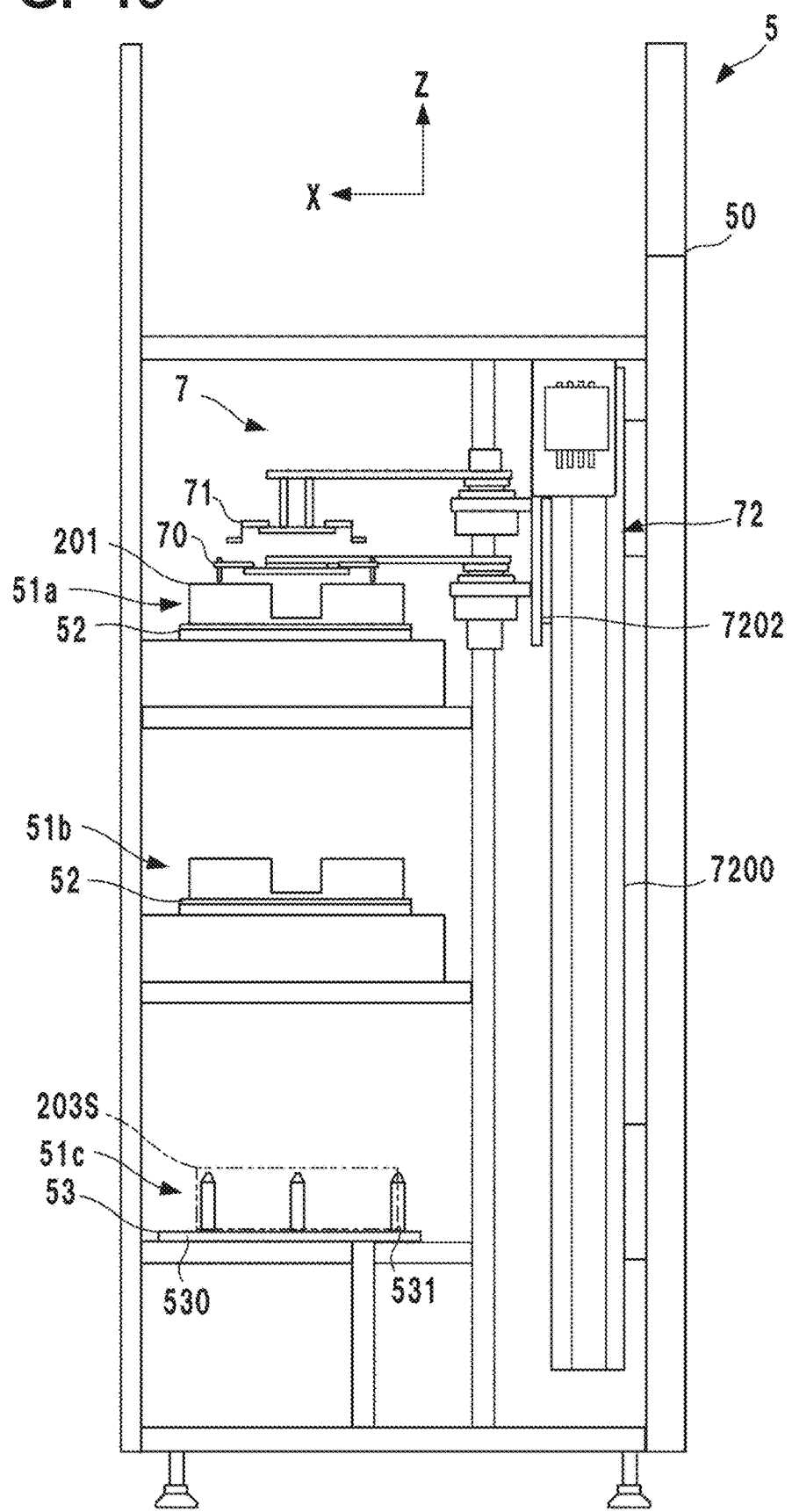
FIG. 19 is an explanatory view of the operation of the transport system shown in FIG. 1.

From then on, with a similar procedure, the spacer 203 is transferred onto the placement portion 51c by the protection material transport robot 7, and the substrate W is transferred to the container 100 by the substrate transport robot 20. When all the substrates W and all the spacers 203 on the placement portion 51a are extracted, the stacked body 203S of the spacers 203 is formed on the placement portion 51c, as shown in FIG. 19. The stacked body 203S is returned onto the container main body portion 201 on the placement portion 51a by the protection material transport robot 7.

Figure 20:
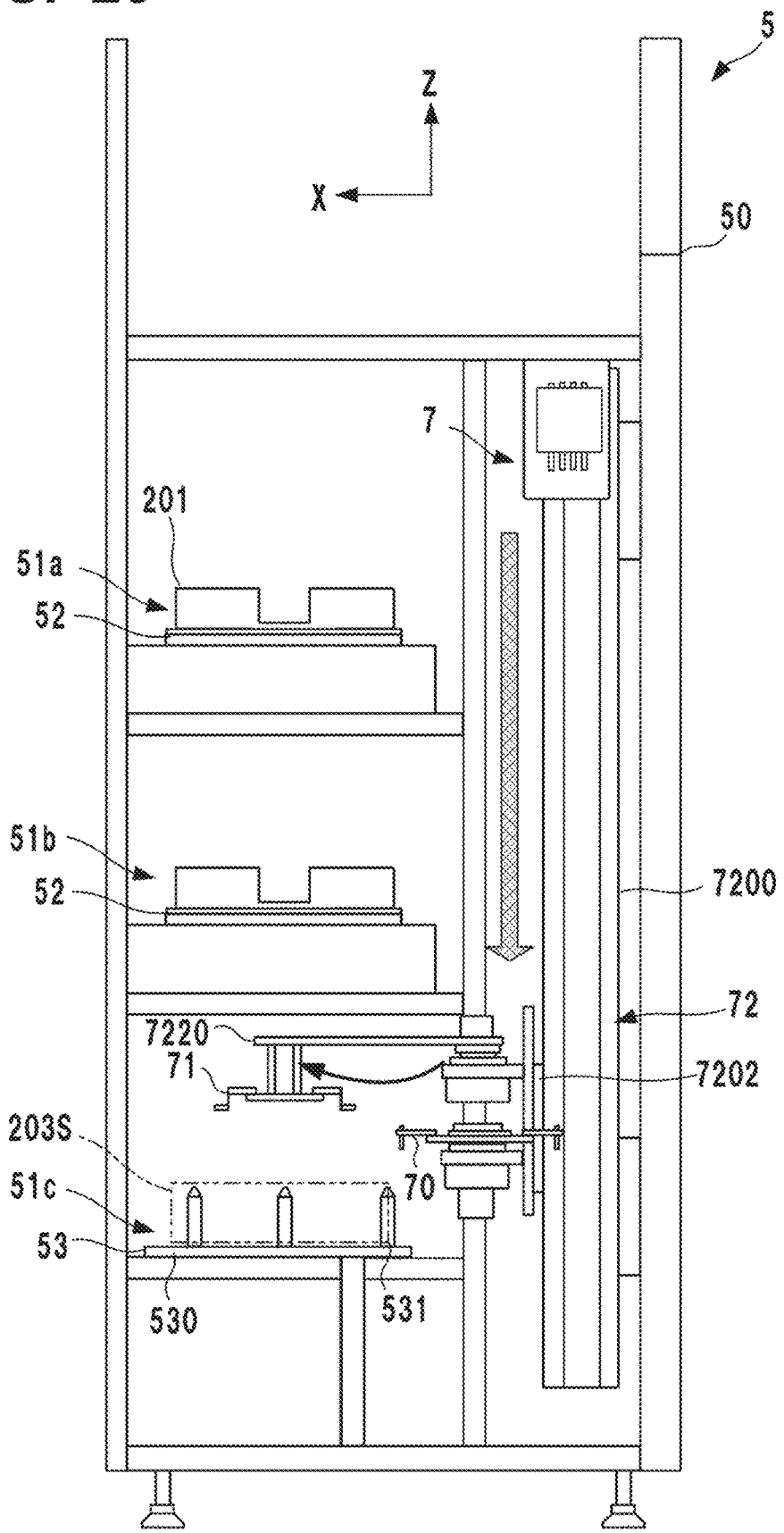
FIG. 20 is an explanatory view of the operation of the transport system shown in FIG. 1.
Figure 21:
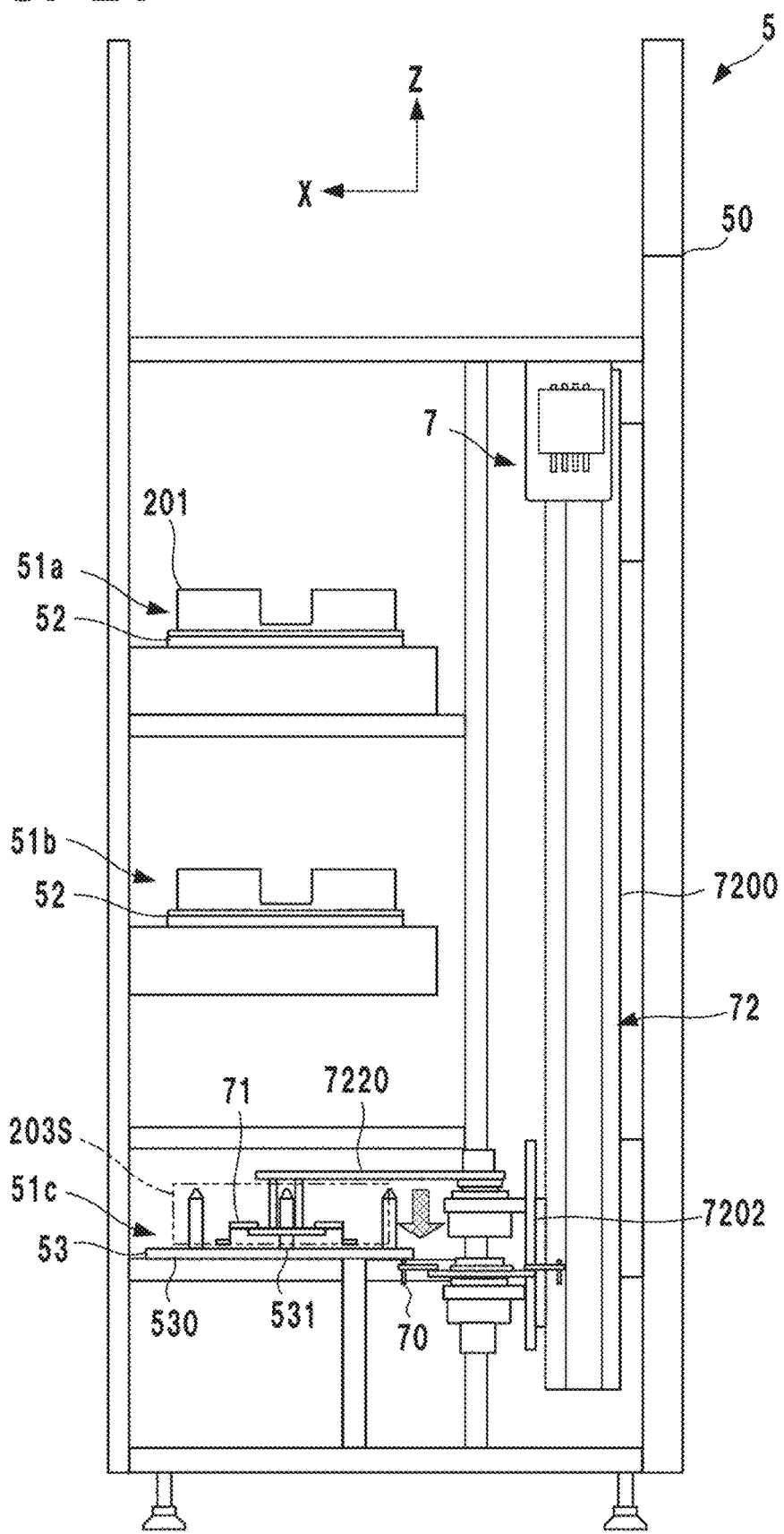
FIG. 21 is an explanatory view of the operation of the transport system shown in FIG. 1.
Figure 22:
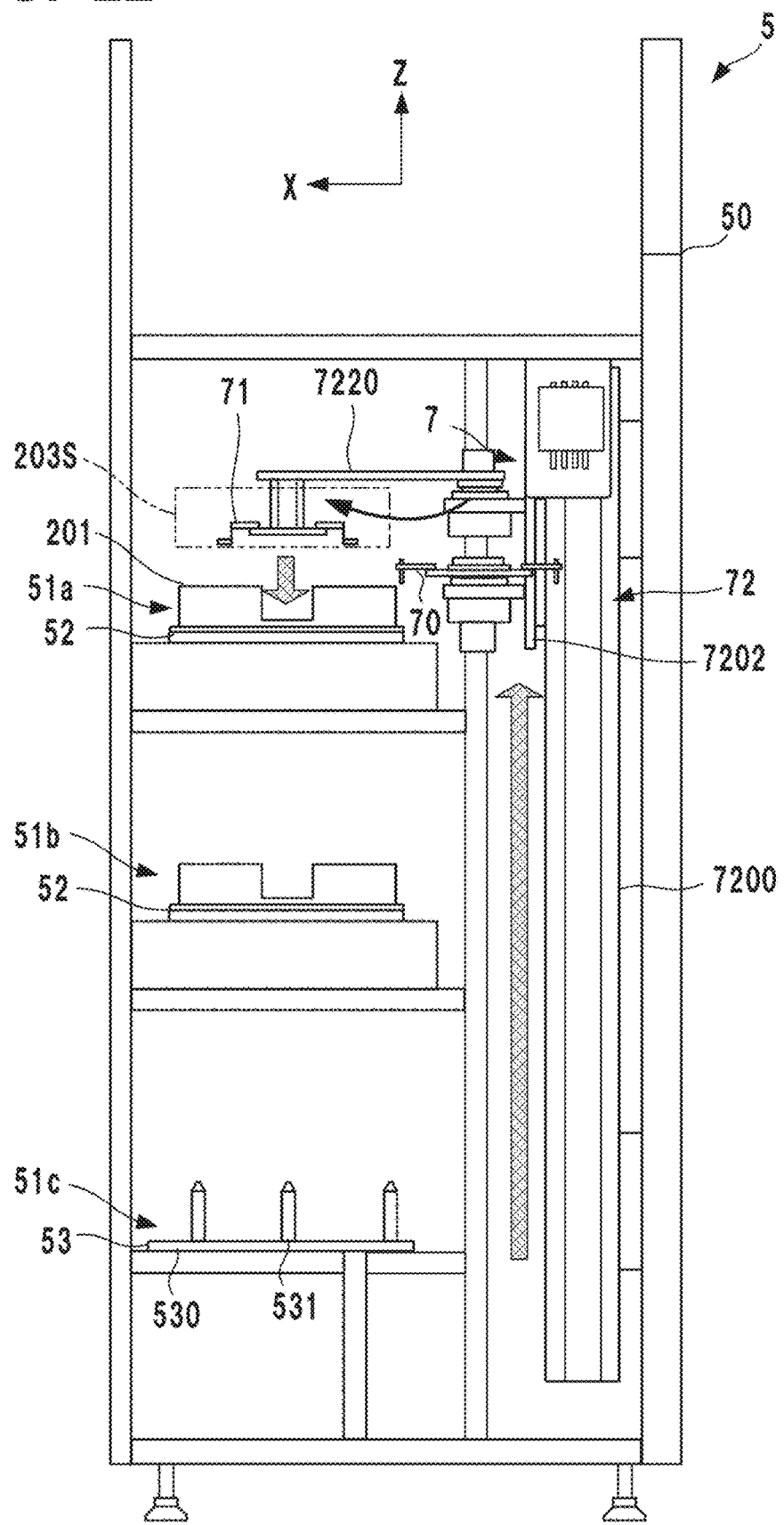
FIG. 22 is an explanatory view of the operation of the transport system shown in FIG. 1.

First, as shown in FIG. 20, the holding unit 71 is lowered, made to pivot to the operation position, and located above the stacked body 203S. The holding unit 70 remains at the elevating position. As shown in FIG. 21, the holding unit 71 is lowered inside the stacked body 203S, and the stacked body 203S is held by the holding unit 71. Next, the stacked body 203S held by the holding unit 71 is transported at once to the container main body portion 201 on the placement portion 51a. More specifically, raise of the holding unit 71, pivot to the elevating position, raise to the height of the placement portion 51a, and pivot to the operation position are performed, and the holding unit 71 and the stacked body 203S are moved to the upper side of the container main body portion 201, as shown in FIG. 22. The holding unit 71 is lowered in the container main body portion 201, and holding of the stacked body 203S is canceled, thereby transferring the stacked body 203S to the container main body portion 201.

The operation at the time of unpacking is thus completed. Note that in this embodiment, at the time of batch transport of the stacked body 203S shown in FIGS. 21 and 22, all the spacers 203 are transported at once. However, these may be transported at once divisionally a plurality of times. For example, when returning the stacked body 203S formed by a total of 26 spacers 203 to the container main body portion 201, first, the stacked body 203S formed by a half (13) of the spacers 203 may be transported, and after that, the stacked body 203S formed by the remaining half of the spacers 203 may be transported. In this case as well, the transport efficiency can be increased as compared to a case in which the spacers 203 are transported one by one.

Additionally, in this embodiment, at the time of unpacking, all the spacers 203 are transported from the container main body portion 201 to the placement portion 51c. However, one spacer 203 may be left in the container main body portion 201. This is because in this embodiment, when returning the spacers 203 on the placement portion 51c to the container main body portion 201, the spacer 203 of the lowermost layer in the container main body portion 201 has no substrate W under it, and therefore need not always be transported to the placement portion 51c. When the spacer 203 of the lowermost layer in the container main body portion 201 is not transported to the placement portion 51c, at the time of packing after the unpacking, the labor of transferring one spacer 203 from the placement portion 51c to the placement portion 51a can be saved, and the tact time can be reduced.

Example of Packing

An example of packing will be described. Generally speaking, packing is an operation reverse to unpacking, that is, an operation of alternately stacking the spacers 203 and the substrates W one by one in the container main body portion 201 on the placement portion 51a or 51b (on the placement device 52). In this embodiment, first, the protection material transport robot 7 transports the stacked body 203S of the spacer 203 at once from the container main body portion 201 on the placement portion 51a onto the placement portion 51c. The efficiency of packing can be improved by this batch transport. Next, the protection material transport robot 7 extracts one spacer 203 from the stacked body 203S on the placement portion 51c and transfers it to the container main body portion 201.

The substrate transport robot 20 extracts the substrate W from the container 100 on the load port 3 and transfers it to the aligner 40. The substrate W is centered by the aligner 40. The centered substrate W is extracted from the aligner 40 by the substrate transport robot 20 and transferred to the container main body portion 201. Transfer of the spacer 203 and transfer of the substrate W to the container main body portion 201 are alternately repeated, and the stacked body of the spacers 203 and the substrates W is formed on the container main body portion 201.

An example of packing will be described in detail with reference to FIGS. 23A to 27B. Forming the stacked body of the spacers 203 and the substrates W in the container main body portion 201 on the placement portion 51a (on the placement device 52) will be described here. However, a similar procedure is used when the stacked body of the spacers 203 and the substrates W is formed in the container main body portion 201 on the placement portion 51b.

Figure 23A:
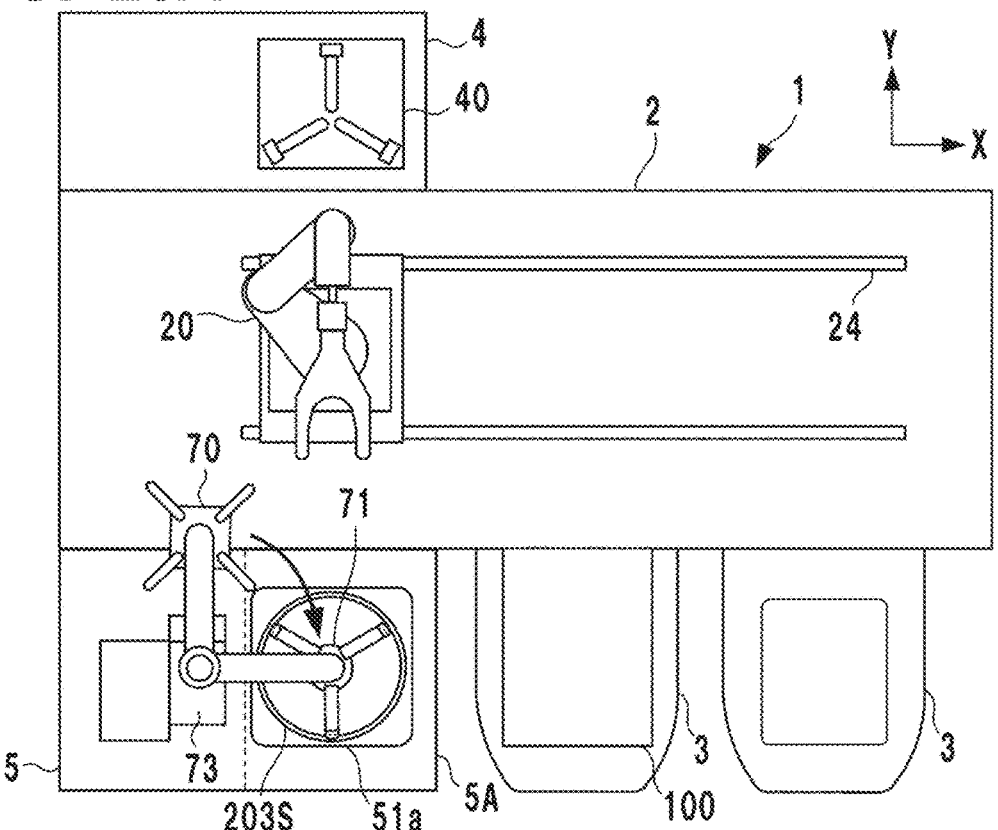
FIG. 23A is an explanatory view of the operation of the transport system shown in FIG. 1.
Figure 23B:
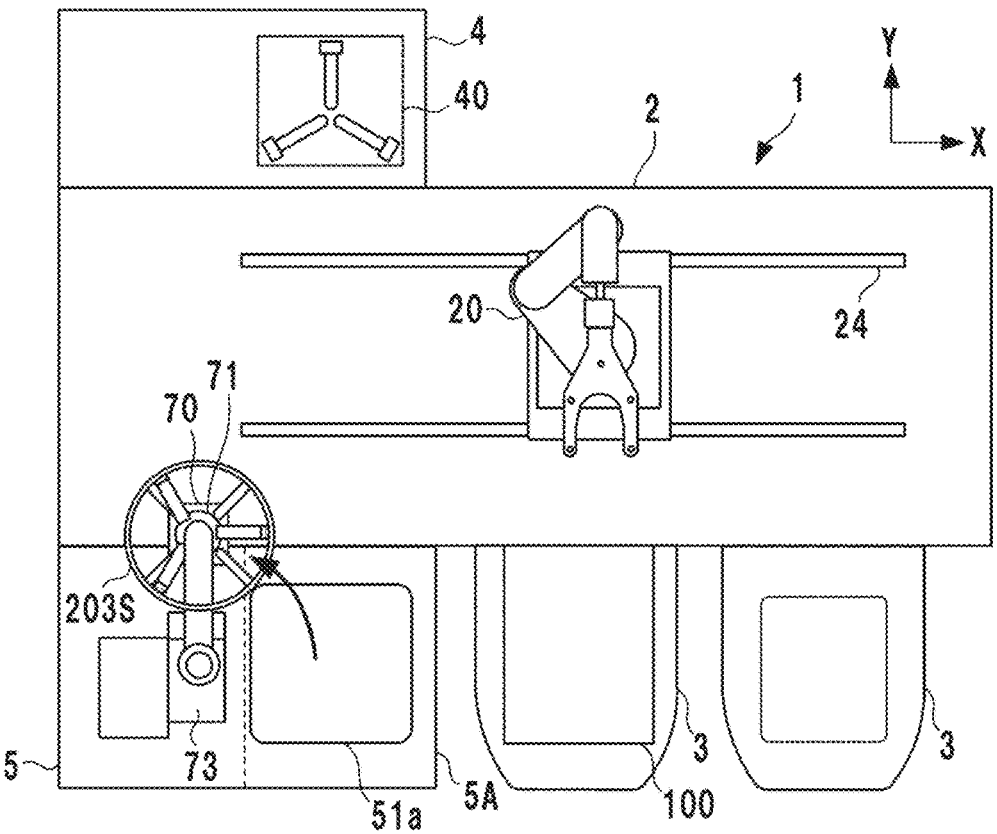
FIG. 23B is an explanatory view of the operation of the transport system shown in FIG. 1.

After the stacked body 203S on the container main body portion 201 is transferred to the placement portion 51c, an operation of extracting one spacer 203 from the stacked body 203S on the placement portion 51c and transferring it to the container main body portion 201 is performed. As shown in FIG. 23A, the holding unit 71 is made to pivot to the operation position such that the holding unit 71 is located above the stacked body 203S. At this time, the holding unit 70 remains at the elevating position. The holding unit 71 is lowered in the stacked body 203S, and the displacement unit 712 is driven to extend the engaging member 713 to the engaging position. The stacked body 203S is thus held by the support members 711. After that, the holding unit 71 is raised and made to pivot to the elevating position as shown in FIG. 23B. In parallel, the substrate transport robot 20 makes a preparation for extracting the substrate W from the container 100 on the load port 3.

Figure 24:
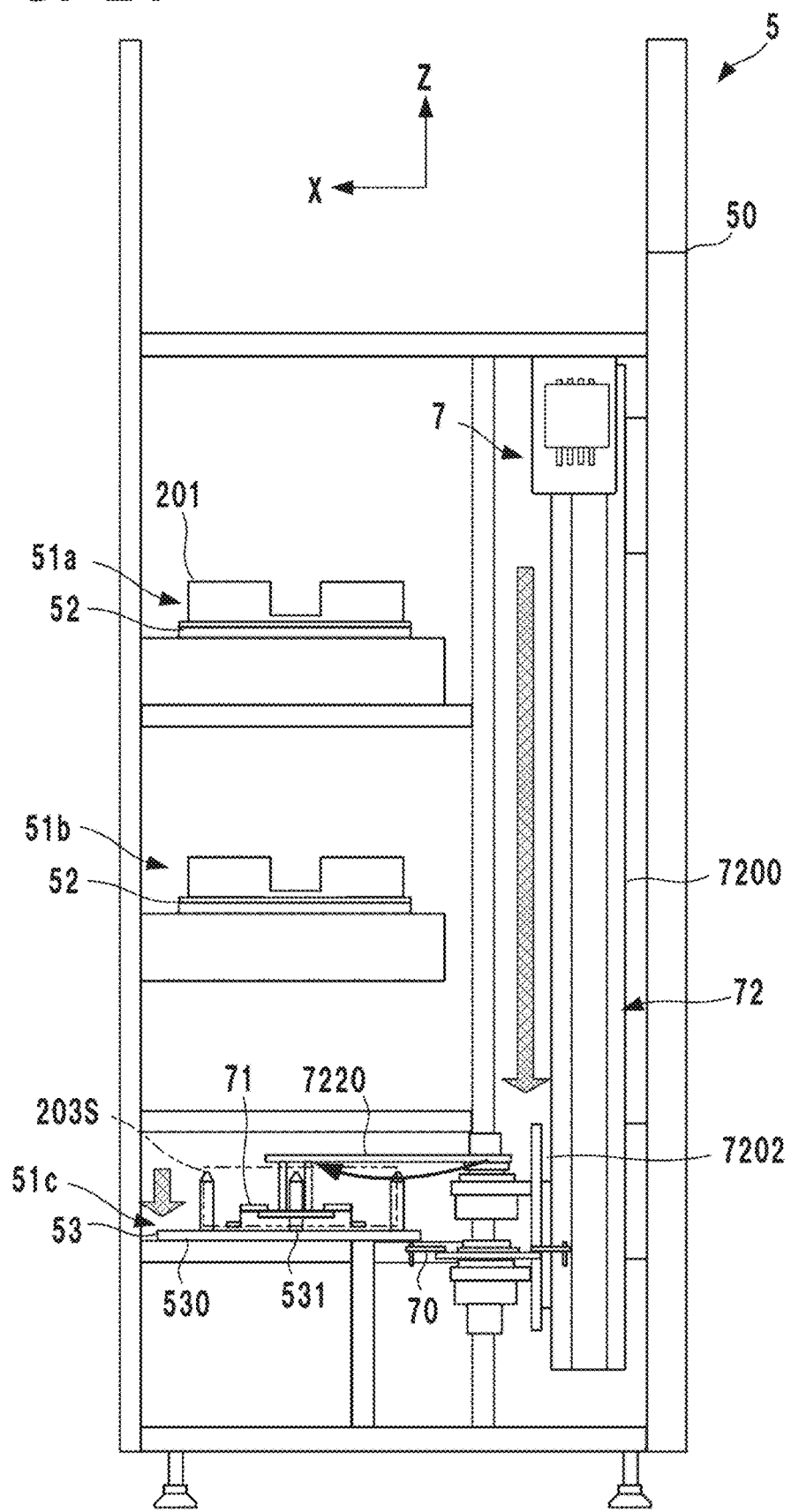
FIG. 24 is an explanatory view of the operation of the transport system shown in FIG. 1.

Subsequently, the holding unit 71 is lowered to the height of the placement portion 51c and made to pivot to the operation position. After that, as shown in FIG. 24, the holding unit 71 is lowered inside the positioning pins 531 on the base plate 530. After that, holding of the stacked body 203S by the holding unit 71 is canceled, and the stacked body 203S is transferred onto the placement portion 51c. The stacked body 203S is thus transferred at once.

Figure 25:
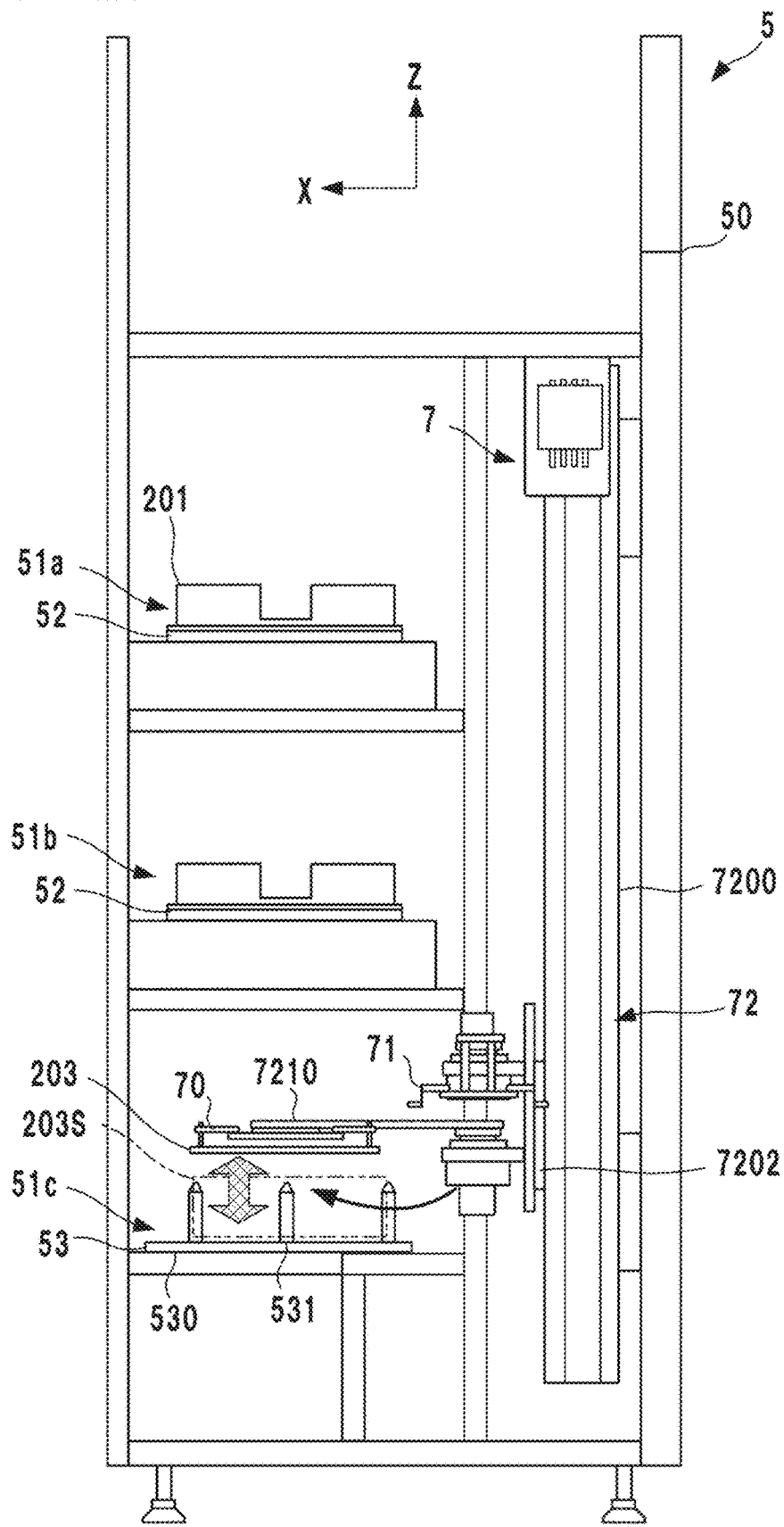
FIG. 25 is an explanatory view of the operation of the transport system shown in FIG. 1.

Next, an operation of holding one spacer 203 by the holding unit 70 is started. After the holding unit 71 is raised to the upper side of the stacked body 203S, the holding unit 71 pivots to the elevating position, and the holding unit 70 pivots to the operation position. Also, as shown in FIG. 25, the holding unit 70 is lowered inside the positioning pins 531 on the base plate 530 and performs suction, and the spacer 203 of the uppermost layer of the stacked body 203S is held by the holding unit 70. After that, the holding unit 70 is raised, thereby holding only one spacer 203 of the uppermost layer.

Figure 26:
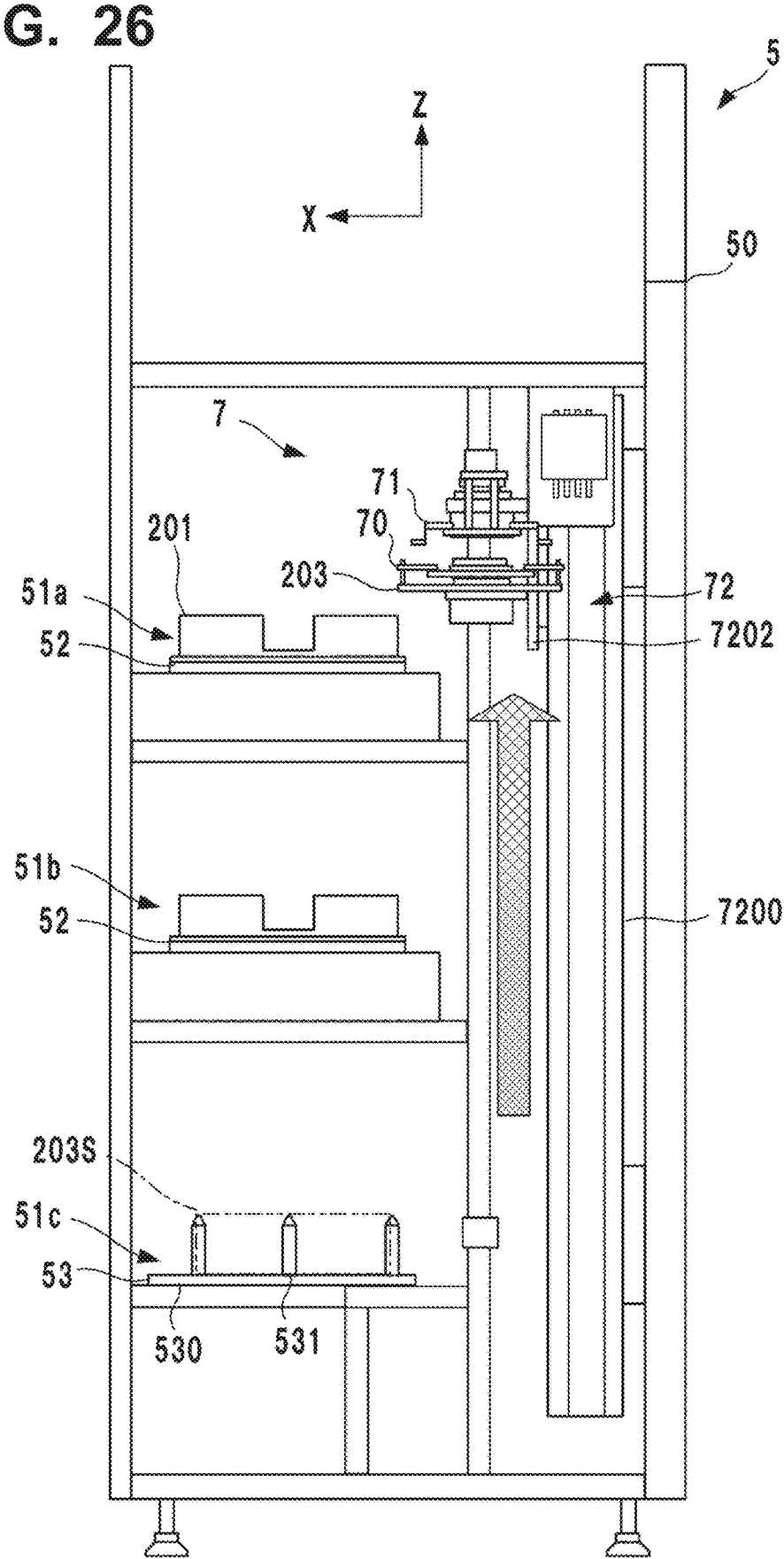
FIG. 26 is an explanatory view of the operation of the transport system shown in FIG. 1.
Figure 27A:
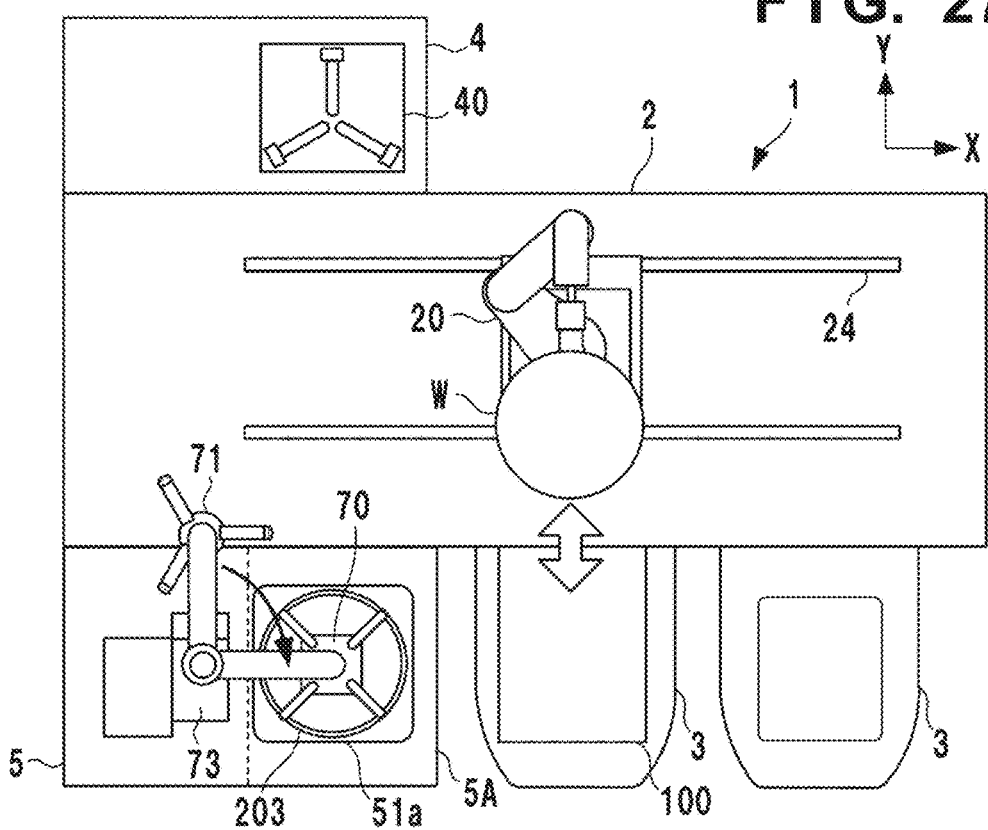
FIG. 27A is an explanatory view of the operation of the transport system shown in FIG. 1.
Figure 27B:
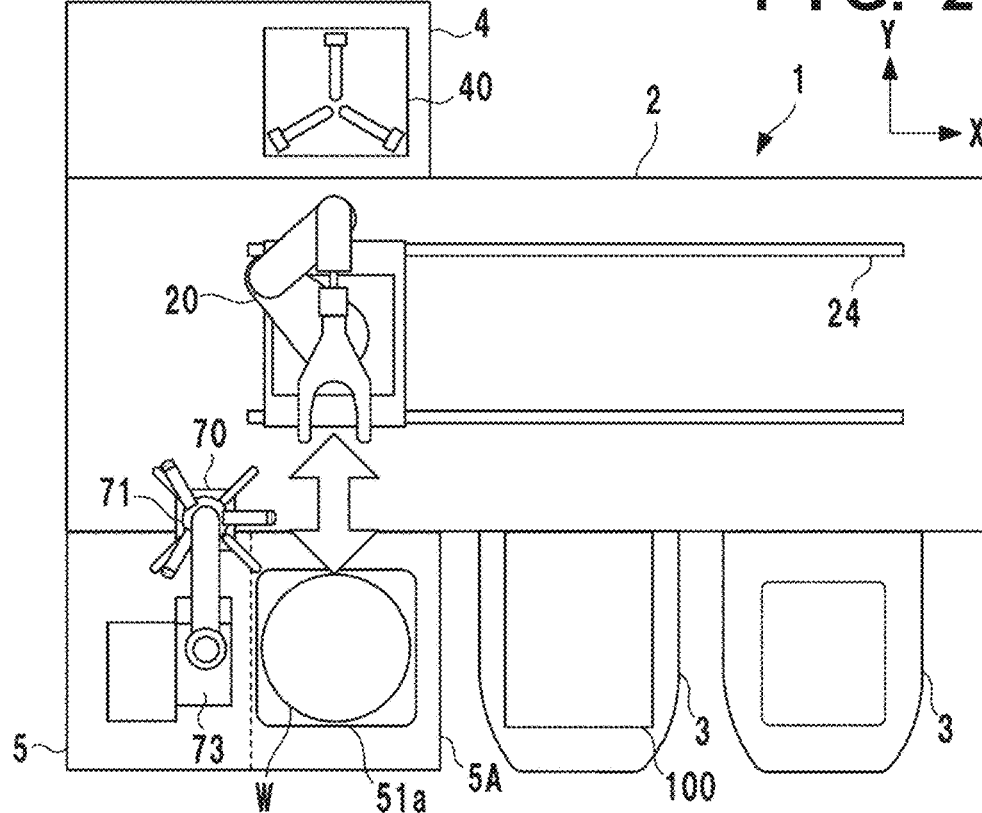
FIG. 27B is an explanatory view of the operation of the transport system shown in FIG. 1.

After the holding unit 70 is made to pivot to the elevating position, as shown in FIG. 26, the holding unit 70 is raised to the height of the container main body portion 201. As shown in FIG. 27A, the holding unit 70 is made to pivot to the operation position and further lowered, thereby transferring the spacer 203 onto the container main body portion 201. In parallel, the substrate transport robot 20 extracts the substrate W from the container 100 on the load port 3. The extracted substrate W is transferred to the aligner 40. The substrate W is centered by the aligner 40. The centered substrate W is extracted from the aligner 40 by the substrate transport robot 20, and as shown in FIG. 27B, the substrate transport robot 20 transfers the substrate W onto the spacer 203 placed on the container main body portion 201.

From then on, with a similar procedure, the spacer 203 is transferred from the placement portion 51c to the container main body portion 201 by the protection material transport robot 7, the substrate W is transferred to the container 100 to the container main body portion 201 by the substrate transport robot 20 via the aligner 40, and the stacked body of the spacers 203 and the substrates W is formed on the container main body portion 201. In this embodiment, after this, the operator extracts the container main body portion 201 from the protection material transport apparatus 5, and attaches the cover 202 to the container main body portion 201, thereby completing packing of the coin stack container 200. However, the present invention is not particularly limited to this embodiment, and the protection material transport apparatus 5 itself may be provided with a mechanism that automatically attaches the cover 202 to the container main body portion 201. In this case, the coin stack container 200 for which packing is completed is extracted from the protection material transport apparatus 5.

Note that as in the case of unpacking, at the time of batch transport of the stacked body 203S shown in FIGS. 23A to 24, instead of transporting all the spacers 203 at once, these may be transported at once divisionally a plurality of times. Additionally, at the time of batch transport, instead of transporting all the spacers 203 from the container main body portion 201 to the placement portion 51c, one spacer 203 may be left in the container main body portion 201.

<Contact Coin Stack Container>

Figure 28:
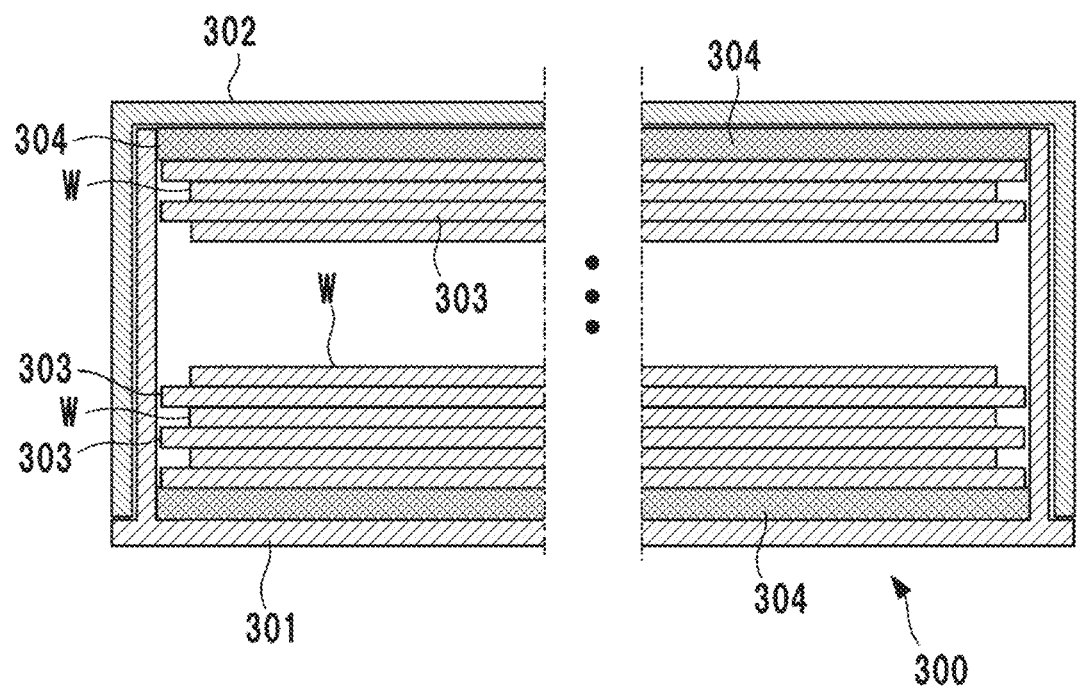
FIG. 28 is an explanatory view of a container.

The protection material transport apparatus 5 according to this embodiment can cope with not only the above-described noncontact coin stack container 200 but also a contact coin stack container. FIG. 28 is an explanatory view of a container 300 that is a contact coin stack container or a sectional view thereof. The container 300 is a hollow body including a container main body portion 301, and a cover 302 serving as the lid of the container main body portion 301. A stacked body in which the sheets 303 that are protection materials and the substrates W are alternately stacked is stored in the container 300. The stacked body is placed on the container main body portion 301, and its movement in the radial direction is regulated by the peripheral wall of the container main body portion 301. A cushion 304 is provided on each of the bottom portion and the top portion of the container 300.

The sheet 303 is a spacer wholly in contact with the adjacent substrates W and is made of, for example, paper. The sheet 303 has a circular shape conforming to the shape of the substrate W, and has a larger diameter than the substrate W.

<Support to Sheet>

The protection material transport apparatus 5 can support the sheet 303 or the container 300 by exchanging or detaching/attaching some components when performing unpacking/packing of the container 300.

(Exchange of Holding Unit)

Figure 29:
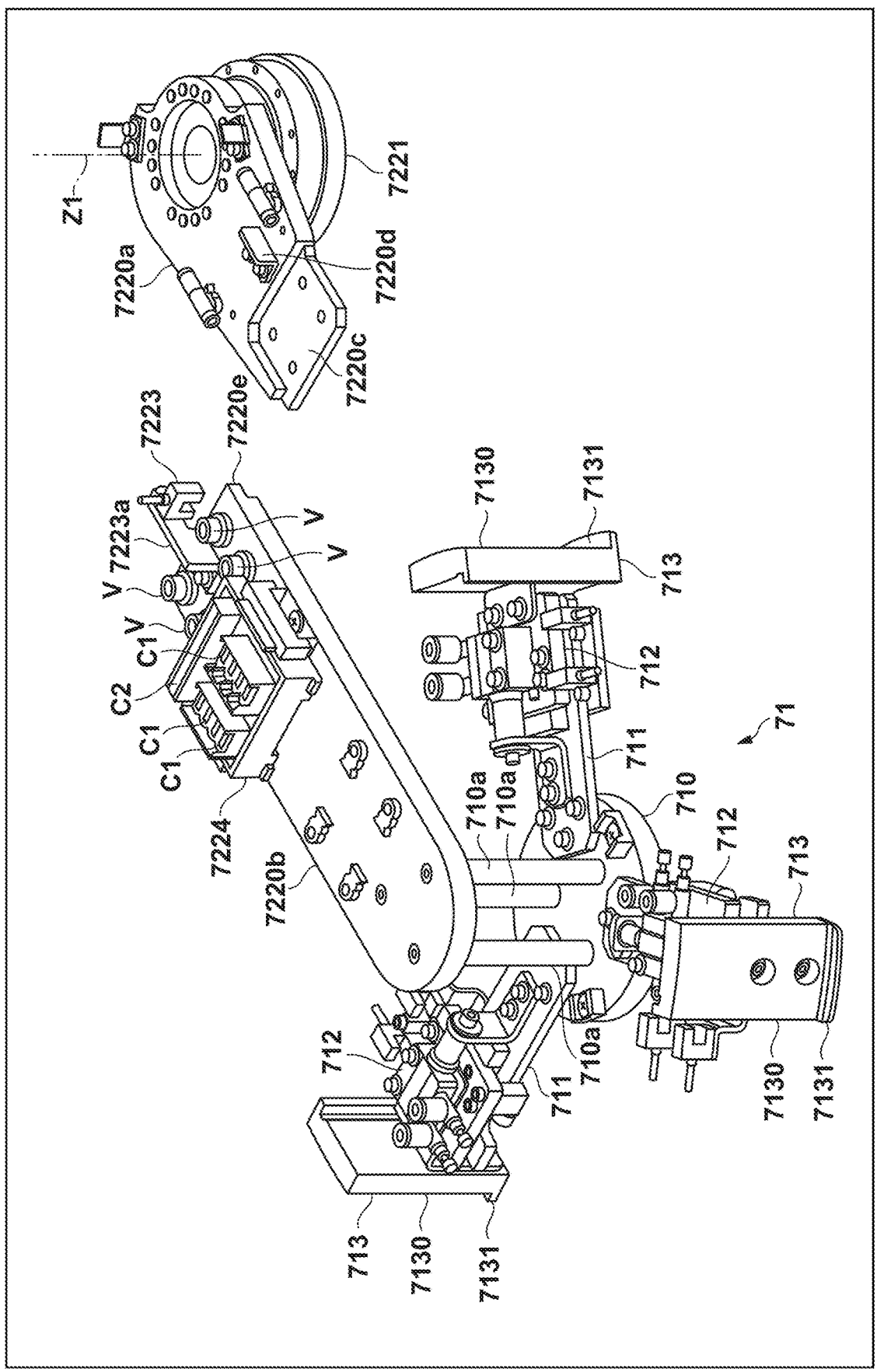
FIG. 29 is an exploded perspective view of a part of the protection material transport robot.
Figure 30:
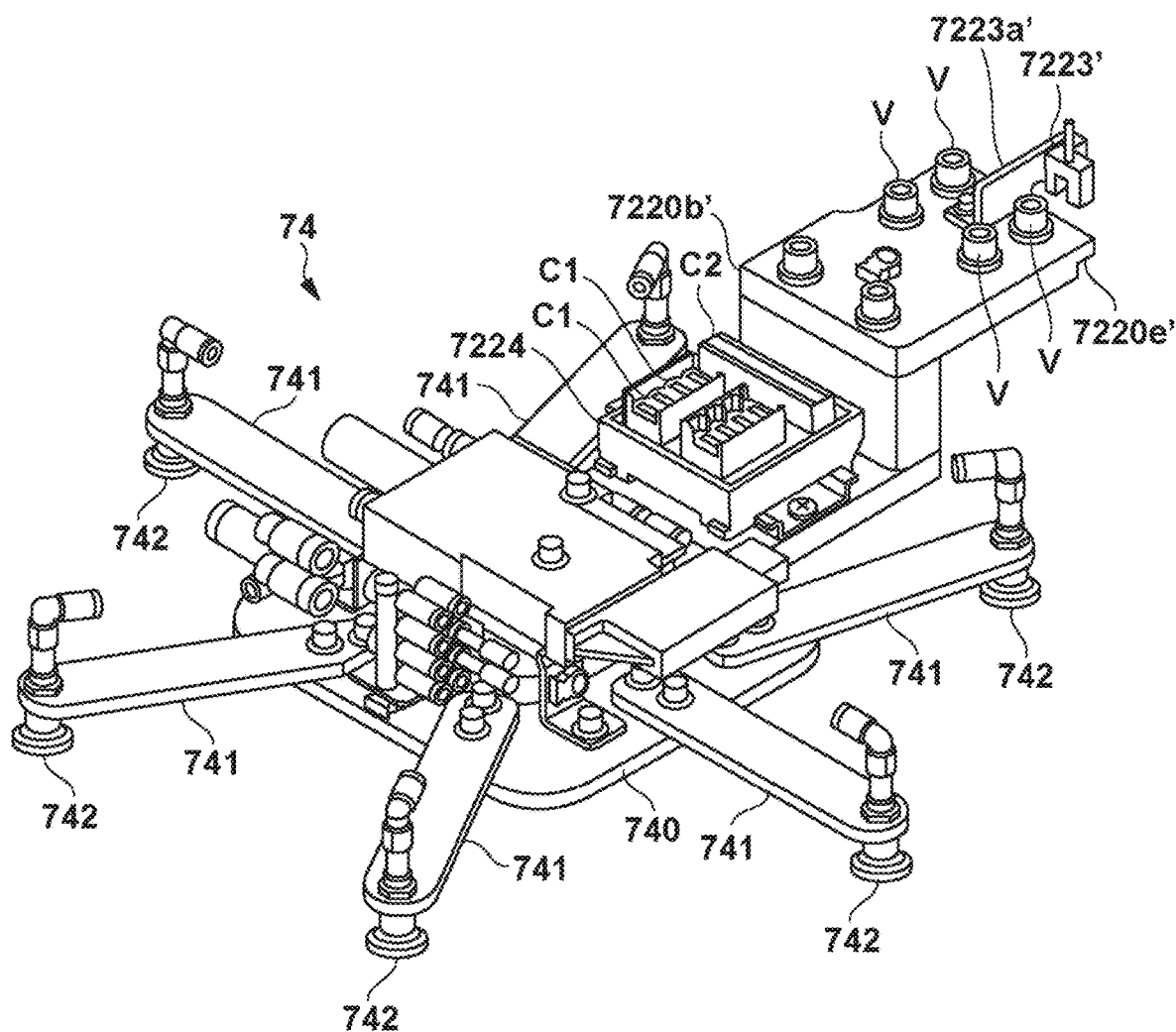
FIG. 30 is an explanatory view of a holding unit.

To support the sheet 303, the holding unit 71 is exchanged to a holding unit 74 that supports holding of the sheet 303. FIG. 29 is an explanatory view of the exchange structure of the holding unit 71, and FIG. 30 is an explanatory view of the holding unit 74. Note that the holding unit 70 is not used to transport the sheet 303. Hence, when transporting the sheet 303, the holding unit 70 need not particularly be detached. However, the holding unit 70 may be configured to be detachable and may be detached.

The arm member 7220 according to this embodiment has a two-member structure including the proximal-side member 7220a and the distal-side member 7220b, which are detachably connected to each other. FIG. 29 shows a state in which the proximal-side member 7220a and the distal-side member 7220b are separated. A positioning portion 7220c is formed in the proximal-side member 7220a. In this embodiment, the positioning portion 7220c is formed into a concave shape. When an end portion 7220e of the distal-side member 7220b is fitted on the inner peripheral wall and the bottom wall of the positioning portion 7220c, the proximal-side member 7220a and the distal-side member 7220b are positioned. The end portion 7220e has a shape matching the shape of the positioning portion 7220c. Screw holes are formed in the positioning portion 7220c, and the proximal-side member 7220a and the distal-side member 7220b are fixed by a plurality of bolts V.

The holding unit 74 will be described. The holding unit 74 includes a plate-shaped rectangular base member 740 having a thickness in the Z direction, and a plurality of support members 741 radially extending from the base member 740. In this embodiment, six support members 741 are provided. A suction portion 742 is supported at the distal end of each support member 741. The suction portion 742 according to this embodiment is a nozzle member connected to a negative pressure source (not shown) and configured to suck air from an opening at the lower end. The six suction portions 742 are arranged on a virtual circle having a diameter smaller than the sheet 303 to suck the upper surface of the sheet 303. Note that the number of suction portions 742 may be other than six. In addition, as the holding method of the sheet 303, a holding method other than suction (for example, chuck using the Bernoulli's effect or Coanda effect) may be used.

A distal-side member 7220b' to which the holding unit 74 is attached has a crank shape. An end portion 7220e' of the distal-side member 7220b' has a shape matching the positioning portion 7220c. Like the distal-side member 7220b, the proximal-side member 7220a and the distal-side member 7220b' are fixed by the plurality of bolts V.

The holding unit 71 forms one exchange unit as an arm member integrated with the distal-side member 7220b. The holding unit 74 forms one exchange unit as an arm member integrated with the distal-side member 7220b'.

The distal-side member 7220b to which the holding unit 71 is attached and the distal-side member 7220b' to which the holding unit 74 is attached are respectively provided with sensors 7223 and 7223' and relay connectors 7224 to which the signal lines of the sensors 7223 and 7223' are connected. The sensors 7223 and 7223' are supported by the distal-side members 7220b and 7220b' via brackets 7223a and 7223a', respectively. The sensors 7223 and 7223' are sensors that detect whether the proximal-side member 7220a and the distal-side member 7220b or 7220b' are connected, that is, whether the holding unit 71 or the holding unit 74 is attached. In this embodiment, the sensors 7223 and 7223' are optical sensors (photointerrupters) that detect a detection piece 7220d provided on the proximal-side member 7220a.

The relay connector 7224 includes a plurality of connecting portions C1 to which the signal lines of various kinds of components including the sensors 7223 and 7223' are connected, and a connecting portion C2 to which a harness configured to electrically connect the relay connector 7224 and the controller 8e is connected. The terminals of the connecting portions C1 and the terminals of the connecting portion C2 are electrically connected inside. The connecting portions C1 include a connecting portion to which the signal line of the sensor 7223 that detects attachment of the holding unit 71 is connected, and a connecting portion to which the signal line of the sensor 7223' that detects attachment of the holding unit 74 is connected, and the detection results of the sensors 7223 and 7223' are output from different terminals of the connecting portion C2 to the controller 8e.

(Adapter of Container)

Figure 31:
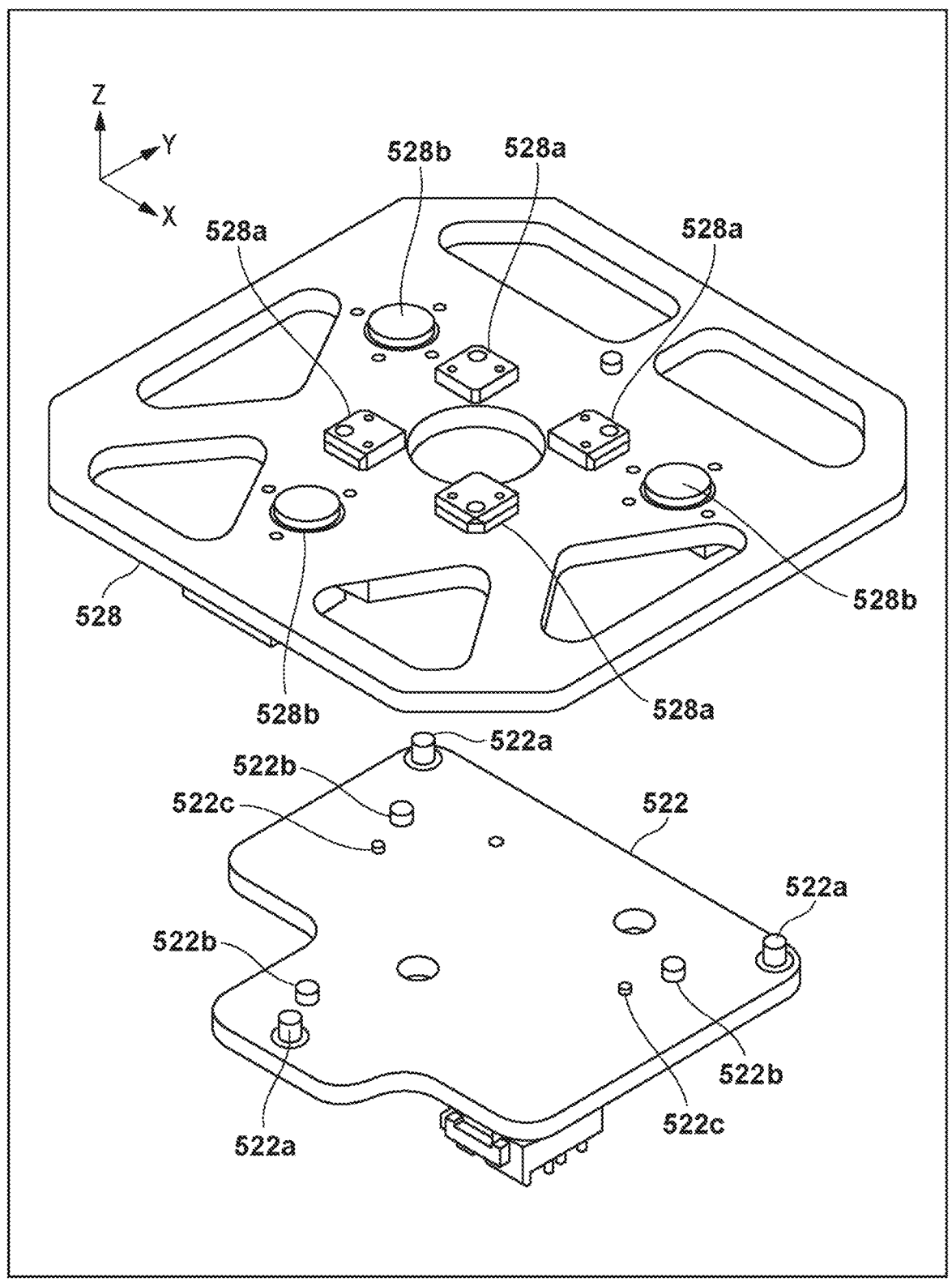
FIG. 31 is an explanatory view of an adapter.

When the container 300 is the target of unpacking/packing, the container main body portion 301 is placed on the placement device 52 via the adapter 528. The adapter 528 is attached to the elevating table 522 of the placement device 52. FIG. 31 is a perspective view of the elevating table 522 and the adapter 528 of the placement device 52.

The adapter 528 is a plate-shaped member having a rectangular shape as a whole. Engaging portions (not shown) that engage with the pins 522a are formed in the bottom surface of the adapter 528, and the adapter 528 is positioned by engagement between the engaging portions and the pins 522a. A plurality of positioning members 528a that position the container main body portion 301 with respect to the adapter 528 are provided on the upper surface of the adapter 528.

In addition, a plurality of sensor dogs 528b are provide on the adapter 528. The sensor dogs 528b are supported to be movable in the Z direction and extend through the adapter 528 in the Z direction. The sensor dogs 528b are arranged at positions corresponding to the sensors 522b of the elevating table 522. When the container main body portion 301 is placed on the adapter 528, the sensor dogs 528b are pushed downward by the weight of the container main body portion 301, and the sensors 522*b* are turned on. That is, the sensors 522*b* can detect, via the sensor dogs 528*b*, whether the container main body portion 301 is placed on the adapter 528. Attachment of the adapter 528 to the elevating table 522 is detected by the sensors 522*c*.

(Adapter of Sheet)

Figure 32:
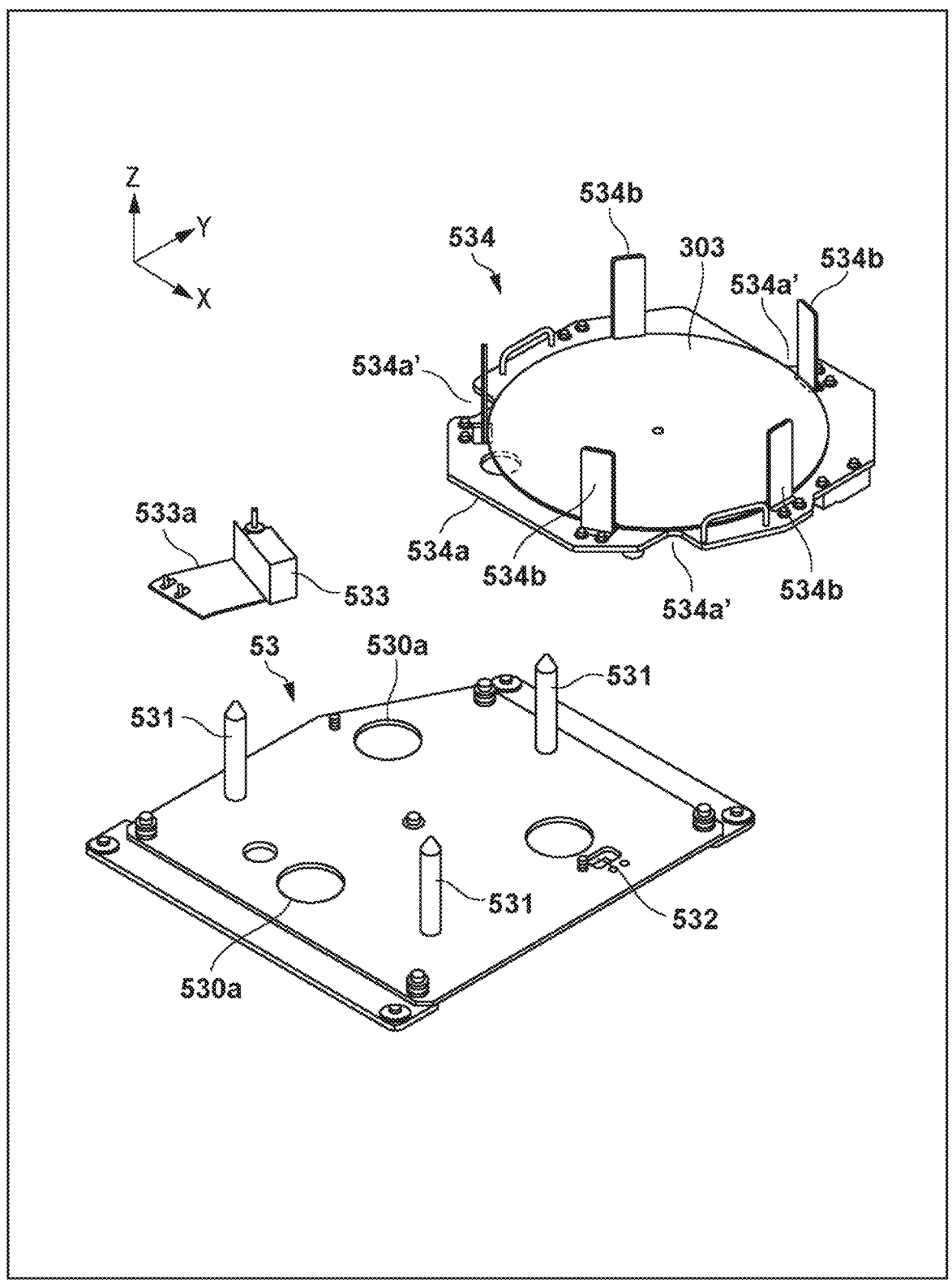
FIG. 32 is an explanatory view of an adapter.

In this embodiment, the sheet 303 is not reused and is discarded at the time of unpacking. At the time of unpacking, the sheet 303 is newly supplied. Hence, the adapter 534 serving as the magazine of the sheets 303 is attached to the placement device 53. FIG. 32 is a perspective view of the placement device 53 and the adapter 534.

The adapter 534 includes a base plate 534*a* on which the stacked body of the sheets 303 is placed, and a plurality of guide members 534*b* that stand on the base plate 534*a* and guide the stacked body of the sheets 303 from the outside. Notches 534*a*' configured to engage with the positioning pins 531 of the placement device 53 and prevent interference are formed in the base plate 534*a*, and the adapter 534 is positioned with respect to the placement device 53 by the positioning pins 531. Attachment of the adapter 534 is detected by the sensor 532.

(Input Ports of Controller)

Figure 33:
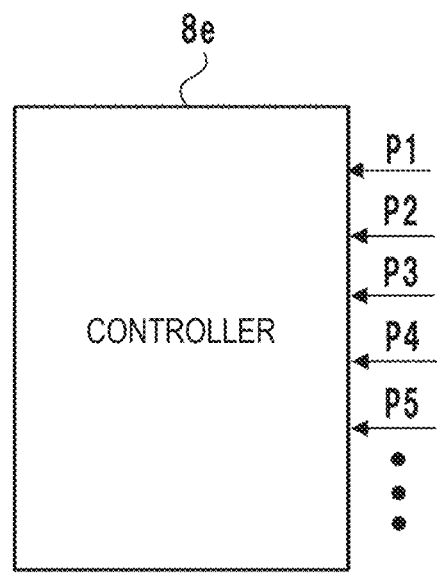
FIG. 33 is an explanatory view of the input port of a controller.

In this embodiment, attachment of the holding units 70 and 74 and the attachment/detachment of the adapters 528 and 534 are automatically determined. To do this, ports to which the detection results are input are assigned to the input ports of the controller 8*e*. FIG. 33 is an explanatory view of the input ports.

In the example of FIG. 33, input ports P1 to P5 are shown. For example, the input port P1 is a port to which the detection result of the sensor 7223 is input, the input port P2 is a port to which the detection result of the sensor 7223' is input, the input ports P3 and P4 are ports to which the detection results of the sensors 522*c* of the placement portions 51*a* and 51*b* are input, and the input port P5 is a port to which the detection result of the sensor 532 is input.

(Unpacking and Packing)

Unpacking and packing of the container 300 will be described. Unpacking will be described first.

Unpacking of the container 300 is basically the same as unpacking of the container 200. That is, unpacking is an operation of alternately extracting the sheets 303 and the substrates W one by one from the stacked body of the sheets 303 and the substrates W placed on the container main body portion 301 on the placement portion 51*a* or 51*b* (on the placement device 52). However, the sheet 303 is not reused and is discarded. This operation will be described with reference to FIGS. 34 and 35.

Figure 34:
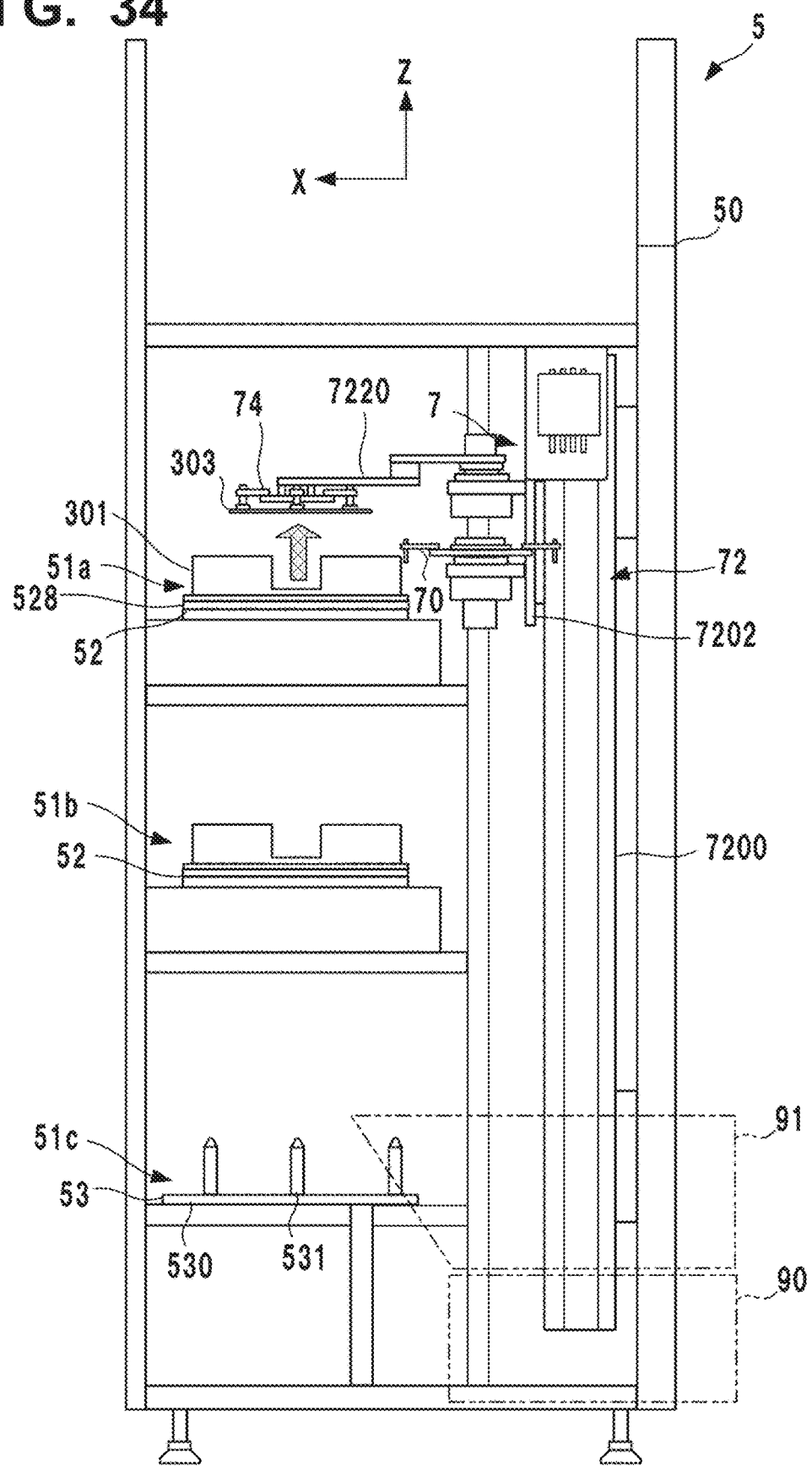
FIG. 34 is an explanatory view of the operation of the transport system shown in FIG. 1.

FIG. 34 shows an operation of extracting the sheet 303 from the container main body portion 301 on the placement portion 51*a*. The container main body portion 301 is placed on the placement device 52 via the adapter 528. The holding unit 74 is attached to the protection material transport robot 7 in place of the holding unit 71. When extracting the sheet 303 from the container main body portion 301, the holding unit 74 is made to pivot to the operation position by the moving unit 72 and located above the container main body portion 301. After that, the holding unit 74 is lowered to suck and hold the sheet 303 of the uppermost layer.

Next, the holding unit 74 is raised, as shown in FIG. 34, to start an operation of discarding the held sheet 303. The sheet 303 is put in a disposal box 90 installed in the transport system 1 in advance by the operator. A guide plate (chute) 91 that guides the sheet 303 to be put in to the disposal box 90 is installed on the upper side of the disposal box 90 in advance by the operator.

Figure 35:
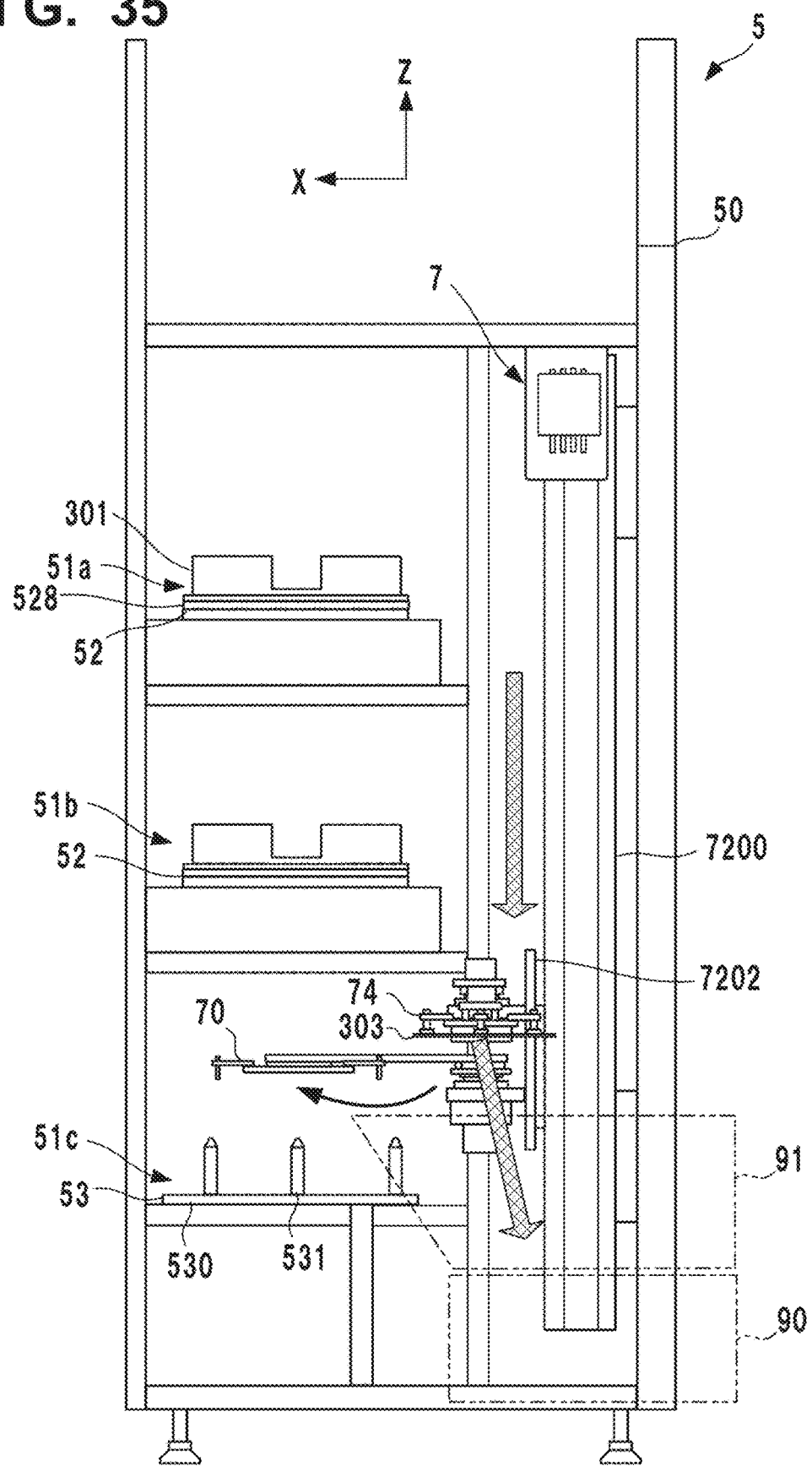
FIG. 35 is an explanatory view of the operation of the transport system shown in FIG. 1.

From the state shown in FIG. 34, the holding unit 74 that holds the sheet 303 is made to pivot to the elevating position by the moving unit 72 and then lowered. As shown in FIG. 35, after the holding unit 70 is made to pivot to the operation position to open the space below the holding unit 74, the holding unit 74 cancels holding of the sheet 303. The sheet 303 naturally drops onto the guide plate 91 and is collected in the disposal box 90.

Packing will be described next. Packing of the container 300 is also basically the same as packing of the container 200. That is, packing is an operation of alternately stacking the sheets 303 and the substrates W one by one on the container main body portion 301 on the placement portion 51*a* or 51*b* (on the placement device 52). However, as the sheet 303, a new sheet is supplied. This operation will be described with reference to FIG. 36.

Figure 36:
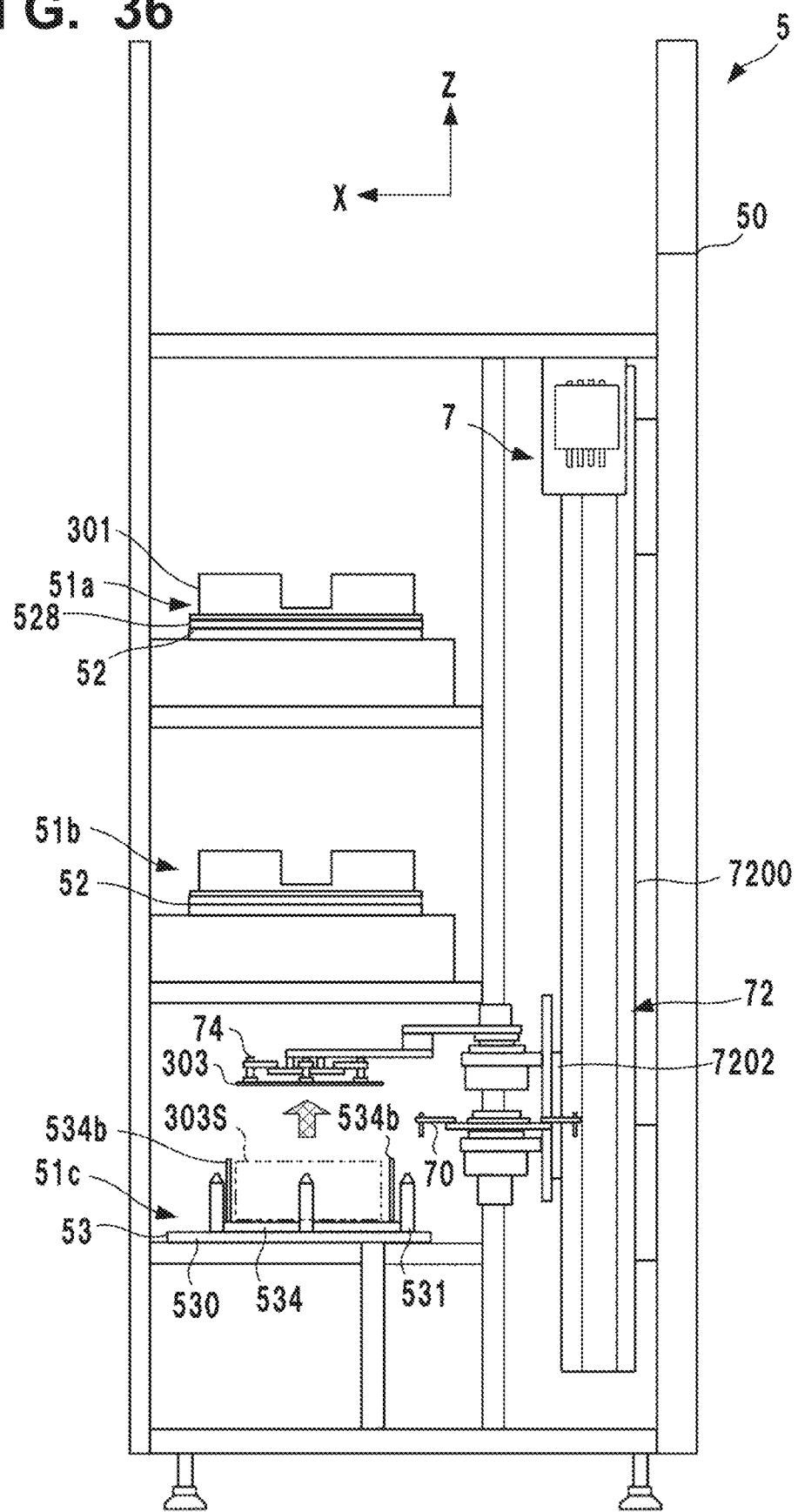
FIG. 36 is an explanatory view of the operation of the transport system shown in FIG. 1.

A stacked body 303S of the new sheets 303 is prepared on the placement device 53 via the adapter 534. In the protection material transport robot 7, the holding unit 74 extracts the sheet 303 of the uppermost layer from the stacked body 303S and transports it to the container main body portion 301. The holding unit 74 is made to pivot to the operation position by the moving unit 72 and located above the stacked body 303S, and then lowered to suck and hold the sheet 303 of the uppermost layer. Next, the holding unit 74 is raised, as shown in FIG. 36, to start an operation of transporting the held sheet 303 to the container main body portion 301. Transport of the sheet 303 to the container main body portion 301 is similar to transport of the spacer 203.

As described above, according to this embodiment, it is possible to perform unpacking/packing in correspondence with contact and noncontact coin stack containers.

<Automatic Determination of Consistency of Components>

Figure 37:
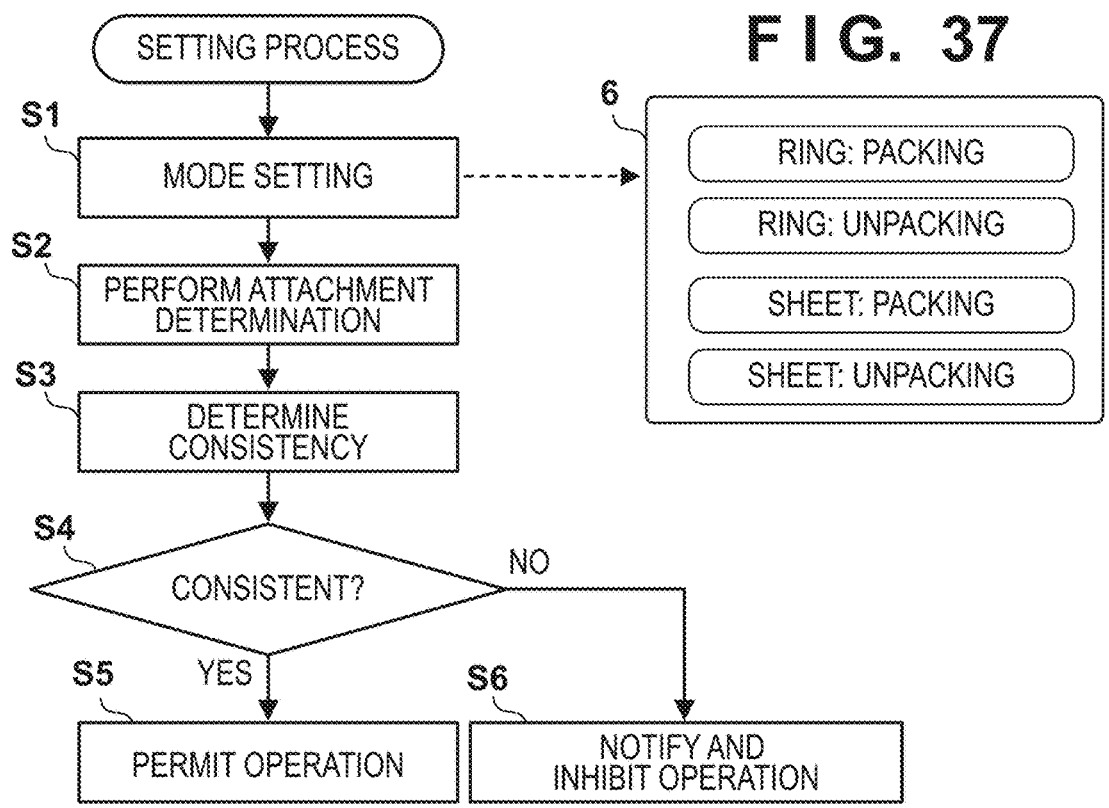
FIG. 37 is a flowchart showing an example of processing of the controller.

As described above, the protection material transport apparatus 5 according to this embodiment can cope with contact and noncontact coin stack containers by exchanging or attaching/detaching some components. Exchange and attachment/detachment of components are done by the operator. Hence, if the type of the coin stack container to be used (in other words, the type of the protection material) is not consistent with components, the unpacking/packing operation is not appropriately performed. Hence, in this embodiment, consistency of components is automatically determined. FIG. 37 is a flowchart showing an example of processing, and shows an example of processing executed by the controller 8*e* that controls the protection material transport apparatus 5.

FIG. 37 shows an example of processing of presetting the operation mode of the protection material transport apparatus 5 by the operator. In step S1, a setting of an operation mode is accepted. Any method is usable as the setting method. In this embodiment, types of operation modes are displayed on the information display apparatus 6, and the operator can make a selection. FIG. 37 also shows a display example. In the example of FIG. 37, four types of operation modes are shown.

"Ring: packing" is an operation mode to perform packing for the noncontact coin stack container 200, and the type of the protection material is the spacer 203. "Ring: unpacking" is an operation mode to perform unpacking for the noncontact coin stack container 200, and the type of the protection material is the spacer 203. "Sheet: packing" is an operation mode to perform packing for the contact coin stack container 300, and the type of the protection material is the sheet 303. "Sheet: unpacking" is an operation mode to perform unpacking for the contact coin stack container 300, and the type of the protection material is the sheet 303.

If the operator selects one of the operation modes, attachment determination is performed in step S2. Here, the attachment/detachment of a constituent component of the protection material transport robot 7 and the placement portions 51a to 51c corresponding to the type of the protection material is determined. More specifically, as for the protection material transport robot 7, which one of the holding unit 71 and the holding unit 74 is attached is determined. As for the placement portions 51a and 51b, attachment/detachment of the adapter 528 is determined. As for the placement portion 51c, attachment/detachment of the adapter 534 is determined. These determinations can be done based on the detection results of the sensors 7223, 7223', 522c, 522c, and 532, which are input to the input ports P1 to P5.

In step S3, the operation mode selected in step S1 is collated with the result of attachment/detachment determination in step S2, and the consistency is determined. The relationship between the operation modes and normal component states is as follows.

"Ring: Packing"
  The holding unit 71 is attached, and the adapters 528 and 534 are not attached.
"Ring: Unpacking"
  The holding unit 71 is attached, and the adapters 528 and 534 are not attached.
"Sheet: Packing"
  The holding unit 74 is attached, and the adapters 528 and 534 are attached.
"Sheet: Unpacking"
  The holding unit 74 is attached, and the adapters 528 and 534 are attached.

Note that in the "sheet: unpacking" mode, the attachment/detachment of the adapter 534 may not matter.

In step S4, subsequent processing is branched depending on whether the result of consistency determination in step S3 represents consistency. If consistent, the process advances to step S5 to permit the operation of the protection material transport apparatus 5 in the selected operation mode. After that, a transport operation or the like in the selected operation mode is started in accordance with an operation start instruction of the operator. If not consistent, the process advances to step S6 to notify the operator that an error has occurred in attachment/detachment of a component, and inhibit the operation of the protection material transport apparatus 5 in the selected operation mode. The notification can be made by, for example, display or a voice. The display may be done on the information display apparatus 6.

With the above-described processing, it is possible to prevent mix-up of components corresponding to an operation mode while corresponding to the types of the coin stack container and the protection material. Note that in this embodiment, when using the sheet 303, the adapters 528 and 534 are used, and the type of the protection material is the spacer 203 by default. However, the adapters may be attached when the sheet 303 is used as the default protection material, and the spacer 203, that is, unpacking/packing of the noncontact coin stack container is performed.

Also, in the example shown in FIG. 37, consistency between the type of the selected operation mode and the attachment/detachment of components is determined. However, consistency between components may be determined.

Figure 38:
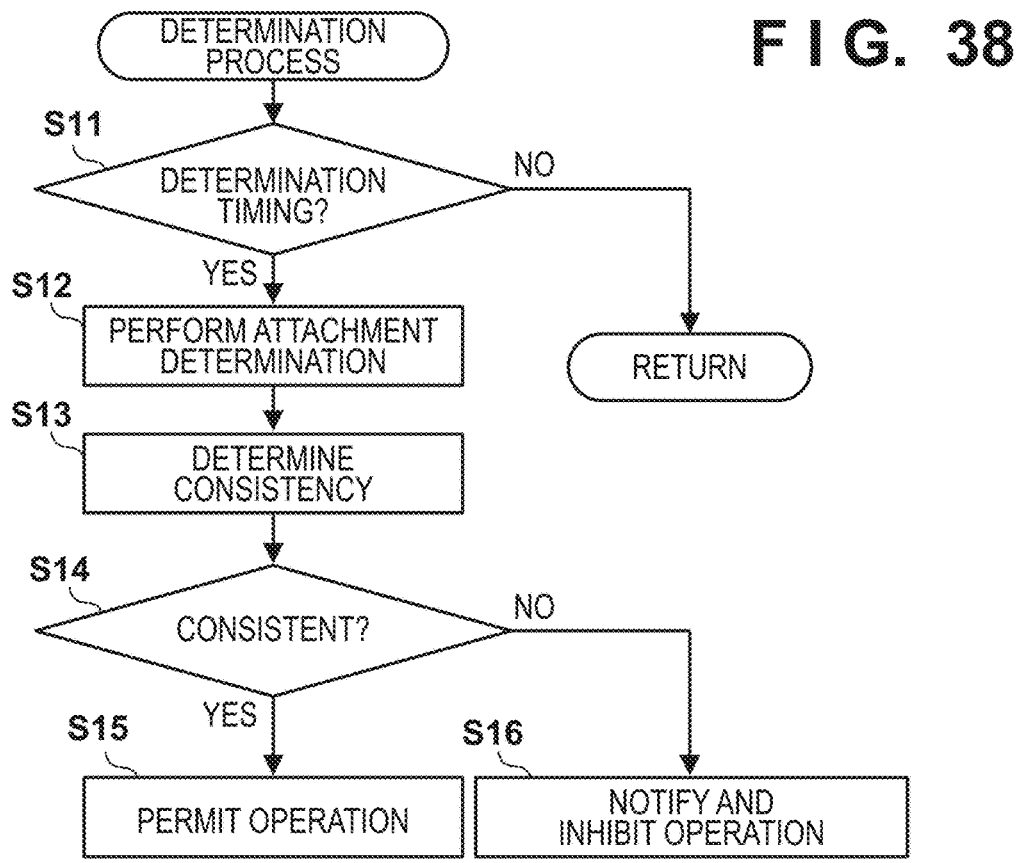
FIG. 38 is a flowchart showing another example of processing of the controller.

FIG. 38 is a flowchart showing an example of the processing, which is an example of processing executed by the controller 8e.

In step S11, it is determined whether it is a predetermined determination timing. The determination timing is, for example, a timing at which an unpacking or packing operation start instruction is issued or a timing of system activation.

In step S12, attachment determination is performed. This is the same processing as in step S2 of FIG. 37. In step S13, consistency between components is determined. Here, for example, the following combinations are determined as consistent.

The holding unit 71 is attached, and the adapters 528 and 534 are not attached.
The holding unit 74 is attached, and the adapters 528 and 534 are attached.

For example, if the attachment of the holding unit 71 is detected, and the attachment of the adapter 528 is also detected, it is determined that the components are not consistent. Additionally, for example, if the attachment of the holding unit 74 is detected, and the attachment of the adapter 528 is not detected, it is determined that the components are not consistent.

In step S14, subsequent processing is branched depending on whether the result of consistency determination in step S13 represents consistency. If consistent, the process advances to step S15 to permit the operation of the protection material transport apparatus 5. If not consistent, the process advances to step S16 to perform processing similar to step S6 of FIG. 37.

<Another Layout Example of Transport System>
(Holding Units and Moving Units)

Figure 39:
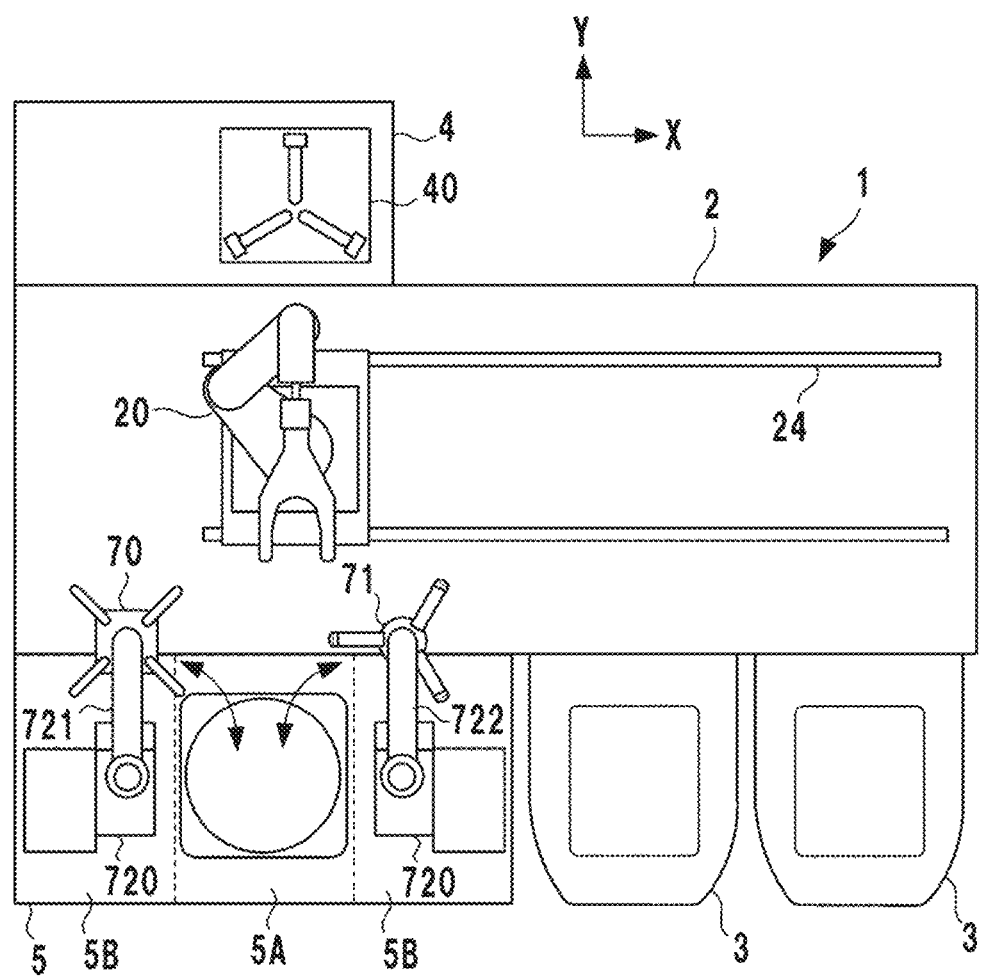
FIG. 39 is a plan view showing another example of the layout of the transport system.

In the above-described embodiment, the protection material transport apparatus 5 in which the holding unit 70 and the holding unit 71 share the moving unit 720 that moves these has been exemplified. However, the moving unit 720 may be provided individually for each of the holding units 70 and 71. FIG. 39 shows an example of this. In the example shown in FIG. 39, the robot storage portions 5B are arranged on both sides of the rack portion 5A in the X direction.

One of the two robot storage portions 5B is provided with the holding unit 70, the moving unit 721 that makes the holding unit 70 pivot, and the moving unit 720 that moves the moving unit 721 in the vertical direction. The other is provided with the holding unit 71, the moving unit 722 that makes the holding unit 71 pivot, and the moving unit 720 that moves the moving unit 722 in the vertical direction. In this example, the holding units 70 and 71 can be not only independently made to pivot but also independently moved up and down. The holding units 70 and 71 can access the spacers 203 in the common rack portion 5A.

(Arrangement of Placement Portions)

In this embodiment, the placement portion 51c is arranged on the lower side of the placement portions 51a and 51b. However, the placement portion 51c may be arranged on the upper side of the placement portions 51a and 51b. In addition, the placement portion 51c may be arranged between the placement portion 51a and the placement portion 51b.

Figure 40:
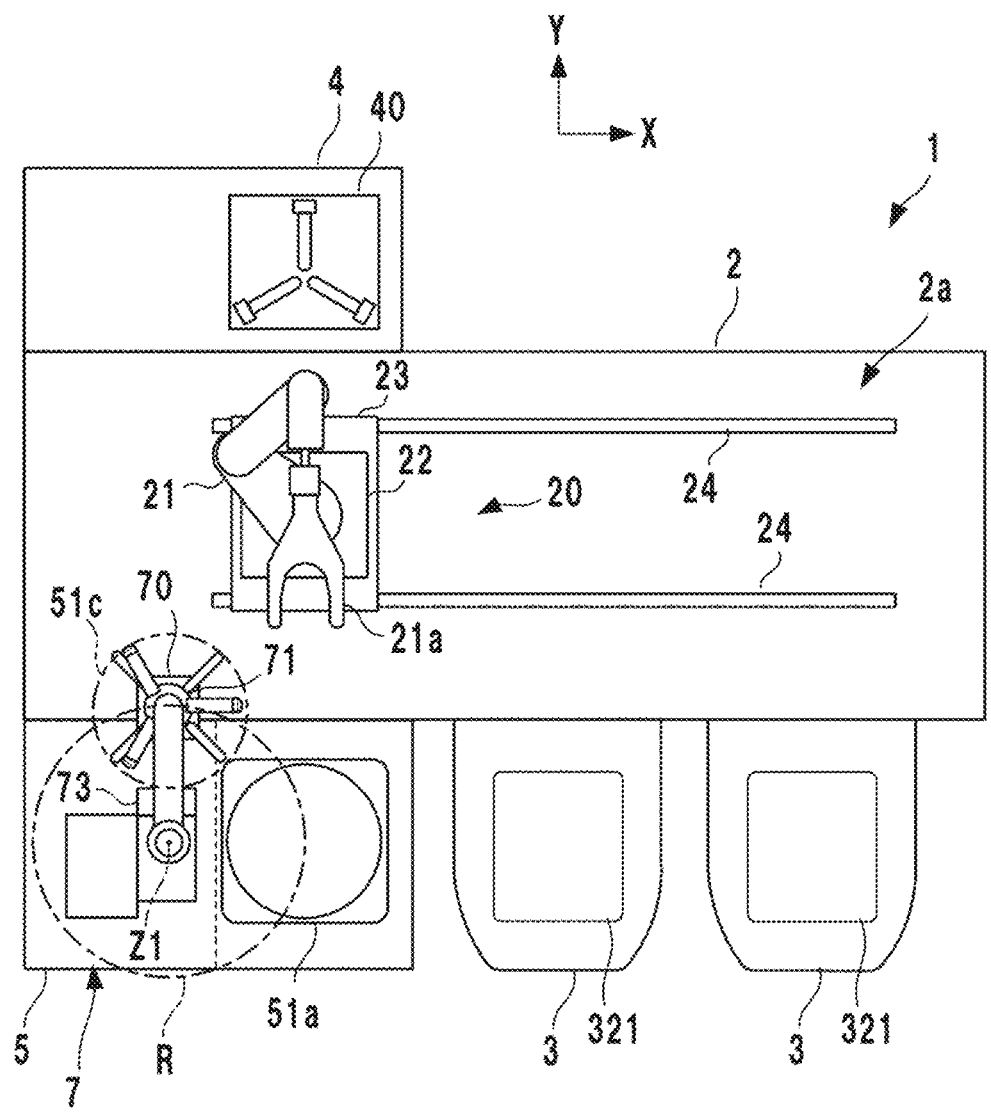
FIG. 40 is a plan view showing still another example of the layout of the transport system.
Figure 41:
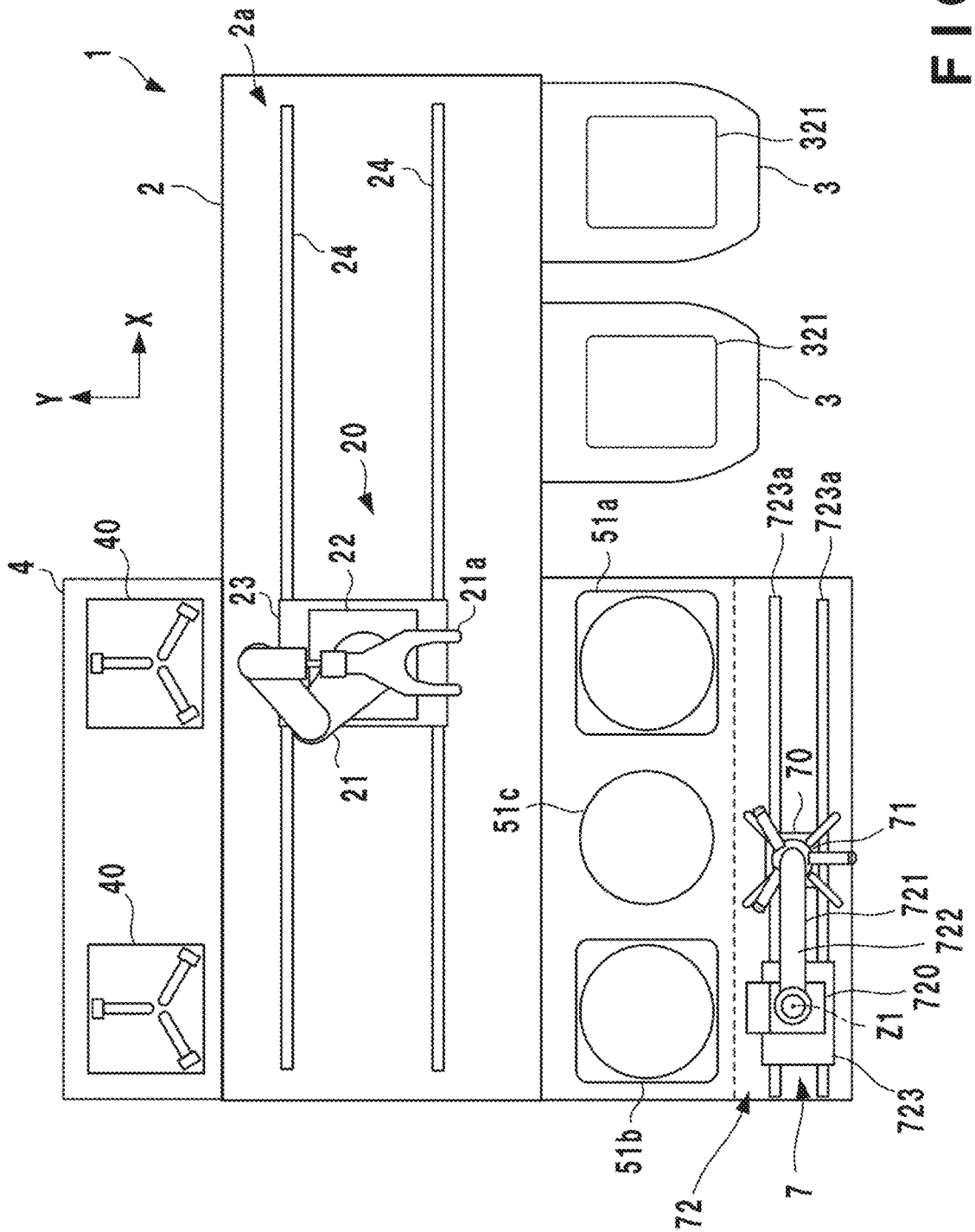
FIG. 41 is a plan view showing still another example of the layout of the transport system.

The placement portion 51c may be arranged with an offset in the horizontal direction with respect to the placement portions 51a and 51b. FIGS. 40 and 41 show an example of this.

FIG. 40 shows an example in which the placement portion 51c is offset in the horizontal direction with respect to the placement portions 51a and 51b within the pivot range of the holding units 70 and 71. The arrangement of the placement portion 51c is indicated by a broken line. As for the offset of the placement portion 51c in the vertical direction with respect to the placement portions 51a and 51b, the placement portion 51c may be arranged at the same height as one of the placement portions 51a and 51b. Alternatively, the placement portion 51c may be arranged at a height different from both the placement portions 51a and 51b.

The placement portion 51c indicated by an alternate long and two short dashed line is located on the vertical moving track of the holding units 70 and 71 at the elevating position. However, the arrangement of the placement portion 51c in the horizontal direction is not limited to this. For example, when the pivot enable range of the holding units 70 and 71 about the pivot center axis Z1 is defined as a track R indicated by an alternate long and short dashed line, an arbitrary position on the track R can appropriately be selected, and the peripheral configuration only need to be designed in correspondence with the selected position. In this case as well, as for the offset of the placement portion 51c in the vertical direction with respect to the placement portions 51a and 51b, the placement portion 51c may be arranged at the same height as one of the placement portions 51a and 51b. Alternatively, the placement portion 51c may be arranged at a height different from both the placement portions 51a and 51b.

An example shown in FIG. 41 shows an example in which the placement portions 51a to 51c are arranged side by side at the same height. In the example shown in FIG. 41, the placement portions 51a to 51c are arranged side by side in the X direction, and the placement portion 51c is arranged between the placement portion 51a and the placement portion 51b. However, the arrangement direction and the arrangement order of the placement portions 51a to 51c are not limited to these.

In the example shown in FIG. 41, the protection material transport robot 7 further includes a component (moving unit 723) capable of reciprocating in the X direction. The moving unit 723 is a traveling body that moves in the X direction along a pair of rail-shaped guide members 723a extending in the X direction. The driving mechanism of the moving unit 723 can be formed by a driving mechanism such as a motor, and a driving force transmission mechanism such as a ball screw mechanism or a belt transmission mechanism.

The moving unit 720 is mounted on the moving unit 723, and the moving units 721 and 722 are moved up and down by the moving unit 720. Hence, the holding units 70 and 71 can make a pivotal motion by the moving units 721 and 722, upward/downward movement by the moving unit 720, and horizontal movement in the X direction by the moving unit 723. The position of the holding units 70 and 71 in FIG. 41 corresponds to the elevating position in the embodiment, and is a position above the pair of guide members 723a. The operation position of the holding units 70 and 71 in the example shown in FIG. 41 is a position above the placement portion 51a, 51b, or 51c after making a pivotal motion counterclockwise by 90° from the position shown in FIG. 41.

Even in the layout shown in FIG. 40 or 41, unpacking and packing can be performed as in the above-described embodiment.

Preferred embodiments of the present invention have been described above. The invention is not limited to the foregoing embodiments, and various variations/changes are possible within the spirit of the invention. Therefore, to apprise the public of the scope of the present invention, the following claims are made.

What is claimed is:

1. A transport apparatus comprising:
a transport unit configured to transport a protection material in each operation of a packing operation of forming a stacked body of the protection material and a substrate in a container and an unpacking operation of alternately extracting the protection material and the substrate from the stacked body in the container;
a protection material placement portion on which the protection material is stacked;
a container placement portion on which a container main body portion of the container is placed;
a control unit configured to control the transport unit in an operation mode selected from a plurality of operation modes corresponding to types of the protection material;
an attachment determination unit configured to determine attachment/detachment of components that are selected in correspondence with the type of the protection material and form the transport unit, the protection material placement portion, and the container placement portion; and
a consistency determination unit configured to determine consistency between the selected operation mode and a determination result of the attachment determination unit.

2. The transport apparatus according to claim 1, wherein the types of the protection material are a sheet and a frame-shaped spacer,
the transport unit comprises:
a first holding unit configured to hold one spacer; and
a second holding unit selectively attached as the component that forms the transport unit,
the second holding unit comprises
a sheet holding unit configured to hold the sheet, or
a spacer holding unit configured to hold a plurality of stacked spacers at once, and
the attachment determination unit determines which one of the sheet holding unit and the spacer holding unit is attached.

3. The transport apparatus according to claim 2, wherein the spacer holding unit comprises:
a plurality of holding members configured to hold the stacked spacers from an inside; and
a displacement unit configured to support and expandably/contractably displace the plurality of holding members, and
each of the holding members comprises, at a lower end, a flange-shaped engaging portion extending outward.

4. The transport apparatus according to claim 3, wherein the spacer has an annular shape,
the plurality of holding members are arranged at equal intervals in a circumferential direction of the spacer, and
each holding member includes an outer peripheral portion that abuts along an inner peripheral surface of the stacked spacer, and includes the engaging portion at a lower end of the outer peripheral portion.

5. The transport apparatus according to claim 2, wherein the transport unit includes:
a first moving unit configured to pivotally support the first holding unit;
a second moving unit configured to pivotally support the second holding unit; and
a third moving unit configured to move the first moving unit and the second moving unit together, the third moving unit moves the first moving unit and the second moving unit up and down, and the first moving unit and the second moving unit are arranged with an offset in a vertical direction and include pivot center axes on the same axis.

6. The transport apparatus according to claim 2, comprising:

a first connection unit configured to electrically connect a sensor configured to detect attachment of the sheet holding unit to the attachment determination unit; and a second connection unit configured to electrically connect a sensor configured to detect attachment of the spacer holding unit to the attachment determination unit, wherein the attachment determination unit comprises:

a first input port to which an electrical signal from the first connection unit is input; and a second input port to which an electrical signal from the second connection unit is input, and the attachment determination unit determines, based on to which one of the first input port and the second input port the electrical signal is input, which one of the sheet holding unit and the spacer holding unit is attached.

7. The transport apparatus according to claim 5, wherein the second moving unit comprises a positioning portion configured to position the second holding unit.

8. The transport apparatus according to claim 2, wherein the sheet holding unit comprises a plurality of suction portions configured to suck an upper surface of the sheet.

9. The transport apparatus according to claim 2, wherein the first holding unit comprises a plurality of suction portions configured to suck an upper surface of the spacer.

10. The transport apparatus according to claim 1, wherein the types of the protection material are a sheet and a frame-shaped spacer, the transport apparatus comprises a detachable adapter as the component that forms the protection material placement portion, when the adapter is not attached, one of the sheet and the spacer can be stacked on the protection material placement portion, the other of the sheet and the spacer can be stacked on the protection material placement portion by attaching the adapter, and the attachment determination unit determines presence/absence of attachment of the adapter.

11. The transport apparatus according to claim 1, wherein the types of the protection material are a sheet and a frame-shaped spacer, the transport apparatus comprises a detachable adapter as the component that forms the container placement portion, when the adapter is not attached, one of a container main body portion for the sheet and a container main body portion for the spacer can be stacked on the container placement portion, the other of the container main body portion for the sheet and the container main body portion for the spacer can be placed on the container placement portion by attaching the adapter, and the attachment determination unit determines presence/absence of attachment of the adapter.

12. The transport apparatus according to claim 1, further comprising notification unit configured to notify inconsistency when the consistency determination unit determines inconsistency.

13. The transport apparatus according to claim 1, wherein the control unit operates the transport unit on condition that the consistency determination unit determines consistency.

14. A transport apparatus comprising:

a control unit configured to setting an operation mode in correspondence with a protection material selected from a plurality of types in each operation of a packing operation of forming a stacked body of the protection material and a substrate in a container and an unpacking operation of alternately extracting the protection material and the substrate from the stacked body in the container;

a protection material placement member which is attached/detached in correspondence with the selected protection material and on which the protection material is placed;

a container placement member which is attached/detached in correspondence with the selected protection material and on which a container main body portion of the container is placed;

a transport unit configured to transport the protection material, the transport unit being selected in correspondence with the selected protection material and including an arm member configured to hold the protection material;

an attachment determination unit configured to determine attachment/detachment of the protection material placement member and the container placement member and a type of the attached arm member; and a consistency determination unit configured to determine consistency between the attachment/detachment of the protection material placement member and the container placement member and the type of the arm member by the attachment determination unit.

15. A control method of an apparatus for performing a packing operation of forming a stacked body of a protection material and a substrate in a container main body portion and then putting a container cover on the container main body portion, the apparatus including: a transport unit configured to transport the protection material; a protection material placement portion on which the protection material is stacked; and a container placement portion on which the container main body portion is placed, the control method comprising:

an attachment determination step of determining attachment/detachment of components that are selected in correspondence with a type of the protection material and form the transport unit, the protection material placement portion, and the container placement portion;

a consistency determination step of determining consistency between a setting of an operation mode set in correspondence with the type of the protection material and a determination result of the attachment determination step; and a control step of controlling the apparatus to perform the packing operation in the set operation mode when consistency is affirmed in the consistency determination step.

16. A control method of an apparatus for performing a packing operation of forming a stacked body of a protection material and a substrate in a container main body portion and then putting a container cover on the container main body portion, the apparatus including: a protection material placement member which is attached/detached in correspondence with a type of the protection material and on which the protection material is placed; a container placement member which is attached/detached in correspondence with the type of the protection material and on which the container main body portion is placed; and a transport unit configured to transport the protection material, the transport unit being selected in correspondence with the type of the protection material and including an arm member configured to hold the protection material, the control method comprising:
an attachment determination step of determining attachment/detachment of the protection material placement member and the container placement member and a type of the attached arm member;
a consistency determination step of determining consistency between the attachment/detachment of the protection material placement member and the container placement member and the type of the arm member in the attachment determination step; and
a control step of controlling the apparatus to perform the packing operation when consistency is affirmed in the consistency determination step.

17. A control method of an apparatus for performing an unpacking operation of detaching a container cover from a container that stores a stacked body of a protection material and a substrate and then alternately extracting the protection material and the substrate, the apparatus including: a transport unit configured to transport the protection material; a protection material placement portion on which the protection material is stacked; and a container placement portion on which a container main body portion of the container is placed, the control method comprising:
an attachment determination step of determining attachment/detachment of components that are selected in correspondence with a type of the protection material and form the transport unit, the protection material placement portion, and the container placement portion;
a consistency determination step of determining consistency between a setting of an operation mode set in correspondence with the type of the protection material and a determination result of the attachment determination step; and
a control step of controlling the apparatus to perform the unpacking operation in the set operation mode when consistency is affirmed in the consistency determination step.

18. A control method of an apparatus for performing an unpacking operation of detaching a container cover from a container that stores a stacked body of a protection material and a substrate and then alternately extracting the protection material and the substrate, the apparatus including: a protection material placement member which is attached/detached in correspondence with a type of the protection material and on which the protection material is placed; a container placement member which is attached/detached in correspondence with the type of the protection material and on which a container main body portion of the container is placed; and a transport unit configured to transport the protection material, the transport unit being selected in correspondence with the type of the protection material and including an arm member configured to hold the protection material, the control method comprising:
an attachment determination step of determining attachment/detachment of the protection material placement member and the container placement member and a type of the attached arm member;
a consistency determination step of determining consistency between the attachment/detachment of the protection material placement member and the container placement member and the type of the arm member in the attachment determination step; and
a control step of controlling the apparatus to perform the unpacking operation when consistency is affirmed in the consistency determination step.

\* \* \* \* \*